United States Patent
Song

(10) Patent No.: US 12,386,777 B2
(45) Date of Patent: Aug. 12, 2025

(54) PROCESSING-IN-MEMORY (PIM) DEVICE TO PERFORM A MEMORY ACCESS OPERATION AND AN ARITHMETIC OPERATION IN RESPONSE TO A COMMAND FROM A PIM CONTROLLER AND A HIGH SPEED INTERFACE, RESPECTIVELY

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 78 days.

(21) Appl. No.: 17/894,014

(22) Filed: Aug. 23, 2022

(65) Prior Publication Data

US 2022/0405019 A1 Dec. 22, 2022

Related U.S. Application Data

(63) Continuation-in-part of application No. 17/143,941, filed on Jan. 7, 2021, now Pat. No. 12,136,470, which
(Continued)

(30) Foreign Application Priority Data

Jan. 17, 2020 (KR) .................. 10-2020-0006903

(51) Int. Cl.
  *G06F 15/78* (2006.01)
  *G06F 9/30* (2018.01)
(52) U.S. Cl.
  CPC ...... *G06F 15/7821* (2013.01); *G06F 9/30036* (2013.01)
(58) Field of Classification Search
  CPC .. G06F 15/7821; G06F 9/3877; G06F 9/3879; G06F 9/3881
  See application file for complete search history.

(56) References Cited

U.S. PATENT DOCUMENTS 5,165,009 A 11/1992 Watanabe et al.
5,706,514 A 1/1998 Bonola
(Continued)

FOREIGN PATENT DOCUMENTS

CN 110311676 A 10/2019
KR 1020180109619 A 10/2018
(Continued)

OTHER PUBLICATIONS

Daehon Kwon et al., "A 1 ynm 1.25 V 8Gb 16Gb/s/Pin GDDR6-Based Accelerator-in-Memory Supporting 1TFLOPS Mac Operation and Various Activation Functions for Deep Learning Application.", IEEE Journal of Solid-State Circuits 58.1 (2022): 291-302. (Year: 2022).

(Continued)

*Primary Examiner* — Keith E Vicary
(74) *Attorney, Agent, or Firm* — WILLIAM PARK & ASSOCIATES LTD.

(57) ABSTRACT

A processing-in-memory (PIM) system includes a host configured to generate a first request for a memory access operation and a second request for an arithmetic operation, a PIM controller configured to generate a first command based on the first request or the second request, a high speed interface configured to generate a second command based on the second request, and a PIM device configured to perform the memory access operation in response to the first command from the PIM controller and to perform the arithmetic operation in response to the second command from the high speed interface.

24 Claims, 64 Drawing Sheets

Related U.S. Application Data is a continuation-in-part of application No. 17/027,276, filed on Sep. 21, 2020, now Pat. No. 11,513,733.

(60) Provisional application No. 62/958,226, filed on Jan. 7, 2020, provisional application No. 62/959,634, filed on Jan. 10, 2020.

(56) References Cited

U.S. PATENT DOCUMENTS

| | | |
|---|---|---|
| 5,751,987 A | 5/1998 | Mahant-Shetti et al. |
| 10,042,639 B2 | 8/2018 | Gopal et al. |
| 11,513,733 B2 | 11/2022 | Song |
| 2003/0222879 A1 | 12/2003 | Lin et al. |
| 2006/0236079 A1 | 10/2006 | Lin et al. |
| 2009/0254694 A1 | 10/2009 | Ehrman et al. |
| 2010/0312998 A1 | 12/2010 | Walker |
| 2013/0262612 A1 | 10/2013 | Langas et al. |
| 2015/0088954 A1 | 3/2015 | Bakos |
| 2017/0068717 A1 | 3/2017 | Crawford, Jr. |
| 2017/0344301 A1 | 11/2017 | Ryu et al. |
| 2019/0114265 A1 | 4/2019 | Chang et al. |
| 2019/0198061 A1 | 6/2019 | Oh et al. |
| 2019/0243654 A1 | 8/2019 | Mirhosseininiri et al. |
| 2020/0026498 A1 | 1/2020 | Sumbul et al. |
| 2020/0089472 A1 | 3/2020 | Pareek et al. |
| 2020/0174749 A1 | 6/2020 | Kang et al. |
| 2020/0294558 A1 | 9/2020 | Yu et al. |
| 2021/0072986 A1 | 3/2021 | Yudanov et al. |
| 2021/0210125 A1* | 7/2021 | Song .................. G06F 7/5443 |
| 2022/0012303 A1 | 1/2022 | Zheng |
| 2022/0068366 A1 | 3/2022 | Kwon et al. |

FOREIGN PATENT DOCUMENTS

| | | |
|---|---|---|
| KR | 1020190018888 A | 2/2019 |
| KR | 1020200108772 A | 9/2020 |

OTHER PUBLICATIONS

Mingxuan He et al., "Newton: A DRAM-maker's accelerator-in-memory (AiM) architecture for machine learning", 2020 53rd Annual IEEE/ACM International Symposium on Microarchitecture (Micro), IEEE, 2020; 14 pages (Year: 2020).

Seongju Lee et al., "A 1 ynm 1.25V 8Gb, 16Gb/s/pin GDDR6-based Accelerator-in-Memory supporting 1TFLOPS MAC Operation and Various Activation Functions for Deep-Learning Applications", 2022 IEEE International Solid-State Circuits Conference (ISSCC). vol. 65. IEEE, 2022. 3 pages. (Year: 2022).

Jeon, Dong-Ik, Kyeong-Bin Park, and Ki_Seok Chung. "HMC-MAC: Processing-in memory architecture for multiply-accumulateoperations with hybrid memory cube." IEEE Computer Architecture Letters vol. 17, No. 1: (2017), pp. 5-8. (Year: 2017).

* cited by examiner

FIG.5

$$
\begin{pmatrix}
W0.0 & W0.1 & W0.2 & W0.3 & W0.4 & W0.5 & W0.6 & W0.7 \\
W1.0 & W1.1 & W1.2 & W1.3 & W1.4 & W1.5 & W1.6 & W1.7 \\
W2.0 & W2.1 & W2.2 & W2.3 & W2.4 & W2.5 & W2.6 & W2.7 \\
W3.0 & W3.1 & W3.2 & W3.3 & W3.4 & W3.5 & W3.6 & W3.7 \\
W4.0 & W4.1 & W4.2 & W4.3 & W4.4 & W4.5 & W4.6 & W4.7 \\
W5.0 & W5.1 & W5.2 & W5.3 & W5.4 & W5.5 & W5.6 & W5.7 \\
W6.0 & W6.1 & W6.2 & W6.3 & W6.4 & W6.5 & W6.6 & W6.7 \\
W7.0 & W7.1 & W7.2 & W7.3 & W7.4 & W7.5 & W7.6 & W7.7
\end{pmatrix}
\times
\begin{pmatrix}
X0.0 \\ X1.0 \\ X2.0 \\ X3.0 \\ X4.0 \\ X5.0 \\ X6.0 \\ X7.0
\end{pmatrix}
=
\begin{pmatrix}
MAC0.0 \\ MAC1.0 \\ MAC2.0 \\ MAC3.0 \\ MAC4.0 \\ MAC5.0 \\ MAC6.0 \\ MAC7.0
\end{pmatrix}
$$

WEIGHT MATRIX × VECTOR MATRIX = MAC RESULT MATRIX

FIG.14

$$\begin{pmatrix} W0.0 & W0.1 & W0.2 & W0.3 & W0.4 & W0.5 & W0.6 & W0.7 \\ W1.0 & W1.1 & W1.2 & W1.3 & W1.4 & W1.5 & W1.6 & W1.7 \\ W2.0 & W2.1 & W2.2 & W2.3 & W2.4 & W2.5 & W2.6 & W2.7 \\ W3.0 & W3.1 & W3.2 & W3.3 & W3.4 & W3.5 & W3.6 & W3.7 \\ W4.0 & W4.1 & W4.2 & W4.3 & W4.4 & W4.5 & W4.6 & W4.7 \\ W5.0 & W5.1 & W5.2 & W5.3 & W5.4 & W5.5 & W5.6 & W5.7 \\ W6.0 & W6.1 & W6.2 & W6.3 & W6.4 & W6.5 & W6.6 & W6.7 \\ W7.0 & W7.1 & W7.2 & W7.3 & W7.4 & W7.5 & W7.6 & W7.7 \end{pmatrix} \times \begin{pmatrix} X0.0 \\ X1.0 \\ X2.0 \\ X3.0 \\ X4.0 \\ X5.0 \\ X6.0 \\ X7.0 \end{pmatrix} = \begin{pmatrix} MAC0.0 \\ MAC1.0 \\ MAC2.0 \\ MAC3.0 \\ MAC4.0 \\ MAC5.0 \\ MAC6.0 \\ MAC7.0 \end{pmatrix} + \begin{pmatrix} B0.0 \\ B1.0 \\ B2.0 \\ B3.0 \\ B4.0 \\ B5.0 \\ B6.0 \\ B7.0 \end{pmatrix} = \begin{pmatrix} Y0.0 \\ Y1.0 \\ Y2.0 \\ Y3.0 \\ Y4.0 \\ Y5.0 \\ Y6.0 \\ Y7.0 \end{pmatrix}$$

WEIGHT MATRIX    VECTOR MATRIX    MAC RESULT MATRIX    BIAS MATRIX    BIASED RESULT MATRIX

FIG.38

| REQUEST (REQ) | | MODE DEFINITION SIGNAL (MDS) | CMD | MODE SETTING SIGNAL (MRS) | OPERATION OF PIM DEVICE | MODE STATUS OF MODE REGISTER SET (1130) |
|---|---|---|---|---|---|---|
| MEMORY ACCESS REQUEST (REQ_ME) | WRITE REQUEST (REQ_W) | FIRST MODE DEFINITION SIGNAL (MDS1) | WRITE COMMAND (CMD_W) | MEMORY MODE SETTING SIGNAL (MRS_M) | MEMORY WRITE OPERATION | MEMORY MODE SETTING |
| | READ REQUEST (REQ_R) | FIRST MODE DEFINITION SIGNAL (MDS1) | READ COMMAND (CMD_R) | MEMORY MODE SETTING SIGNAL (MRS_M) | MEMORY READ OPERATION | MEMORY MODE SETTING |
| MAC OPERATION REQUEST (REQ_MO) | MAC REQUEST (REQ_MAC) | SECOND MODE DEFINITION SIGNAL (MDS2) | MAC COMMAND (CMD_MAC) | MAC MODE SETTING SIGNAL (MRS_MAC) | MAC OPERATION | MAC MODE SETTING |
| | WRITE REQUEST (DA1) (REQ_W) | FIRST MODE DEFINITION SIGNAL (MDS1) | WRITE COMMAND (CMD_W) | MEMORY MODE SETTING SIGNAL (MRS_M) | MAC WRITE OPERATION (DA1) | MEMORY MODE SETTING |
| | WRITE REQUEST (DA2) (REQ_W) | SECOND MODE DEFINITION SIGNAL (MDS2) | WRITE COMMAND (CMD_W) | MAC MODE SETTING SIGNAL (MRS_MAC) | MAC WRITE OPERATION (DA2) | MAC MODE SETTING |
| | READ REQUEST (REQ_R) | SECOND MODE DEFINITION SIGNAL (MDS2) | READ COMMAND (CMD_R) | MAC MODE SETTING SIGNAL (MRS_MAC) | MAC READ OPERATION | MAC MODE SETTING |

FIG.53

| REQUEST (REQ) | | MODE DEFINITION SIGNAL (MDS) | CMD | MODE SETTING SIGNAL (MRS) | OPERATION OF PIM DEVICE | MODE STATUS OF MODE REGISTER SET (1130) |
|---|---|---|---|---|---|---|
| MEMORY ACCESS REQUEST (REQ_ME) | WRITE REQUEST (REQ_W) | FIRST MODE DEFINITION SIGNAL (MDS1) | WRITE COMMAND (CMD_W) | MEMORY MODE SETTING SIGNAL (MRS_M) | MEMORY WRITE OPERATION | MEMORY MODE SETTING |
| | READ REQUEST (REQ_R) | FIRST MODE DEFINITION SIGNAL (MDS1) | READ COMMAND (CMD_R) | MEMORY MODE SETTING SIGNAL (MRS_M) | MEMORY READ OPERATION | MEMORY MODE SETTING |
| | MAC REQUEST (REQ_MAC) | SECOND MODE DEFINITION SIGNAL (MDS2) | MAC COMMAND (CMD_MAC) | MAC MODE SETTING SIGNAL (MRS_MAC) | MAC OPERATION | MAC MODE SETTING |
| MAC OPERATION REQUEST (REQ_MO) | WRITE REQUEST (DA1) (REQ_W) | FIRST MODE DEFINITION SIGNAL (MDS1) | WRITE COMMAND (CMD_W) | MEMORY MODE SETTING SIGNAL (MRS_M) | MAC WRITE OPERATION (DA1) | MEMORY MODE SETTING |
| | WRITE REQUEST (DA2) (REQ_W) | FIRST MODE DEFINITION SIGNAL (MDS1) | WRITE COMMAND (CMD_W) | MEMORY MODE SETTING SIGNAL (MRS_M) | MAC WRITE OPERATION (DA2) | MEMORY MODE SETTING |
| | READ REQUEST (REQ_R) | SECOND MODE DEFINITION SIGNAL (MDS2) | READ COMMAND (CMD_R) | MAC MODE SETTING SIGNAL (MRS_MAC) | MAC READ OPERATION | MAC MODE SETTING |

PROCESSING-IN-MEMORY (PIM) DEVICE TO PERFORM A MEMORY ACCESS OPERATION AND AN ARITHMETIC OPERATION IN RESPONSE TO A COMMAND FROM A PIM CONTROLLER AND A HIGH SPEED INTERFACE, RESPECTIVELY

CROSS-REFERENCE TO RELATED APPLICATIONS

This is a continuation-in-part of U.S. patent application Ser. No. 17/143,941, filed Jan. 7, 2021, which is a continuation-in-part of U.S. patent application Ser. No. 17/027,276, filed Sep. 21, 2020, which claims the benefit of U.S. Provisional Application No. 62/958,226 filed Jan. 7, 2020, and claims priority to Korean Patent Application No. KR10-2020-0006903 filed Jan. 17, 2020, which are incorporated herein by reference in their entirety. U.S. patent application Ser. No. 17/143,941 also claims the benefit of U.S. Provisional Application No. 62/959,634 filed Jan. 10, 2020, which is incorporated herein by reference in its entirety.

BACKGROUND

1. Technical Field

Various embodiments of the present disclosure relate to processing-in-memory (PIM) systems and, more particularly, to PIM systems including a PIM device and a controller and methods of operating the PIM system.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks having increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

A processing-in-memory (PIM) system according to an embodiment of the present disclosure may include a host configured to generate a first request for a memory access operation and a second request for an arithmetic operation, a PIM controller configured to generate a first command based on the first request or the second request, a high speed interface configured to generate a second command based on the second request, and a PIM device configured to perform the memory access operation in response to the first command from the PIM controller and to perform the arithmetic operation in response to the second command from the high speed interface.

A processing-in-memory (PIM) system according to another embodiment of the present disclosure may include a host configured to generate a first request for a memory access operation and a second request for an arithmetic operation, a plurality of PIM controllers, each of the plurality of PIM controllers generating a first command based on the first request or the second request, a high speed interface configured to generate a second command based on the second request, and a plurality of PIM devices commonly coupled to the high speed interface and respectively coupled to the plurality of PIM controllers. A first PIM device, which is one of the plurality of PIM devices, may be configured to perform the memory access operation in response to the first command from a first PIM controller coupled to the first PIM device, and to perform the arithmetic operation in response to the second command from the high speed interface.

BRIEF DESCRIPTION OF THE DRAWINGS

Certain features of the disclosed technology are illustrated in various embodiments with reference to the attached drawings.

FIG. 5 illustrates an example of a MAC arithmetic operation performed in a PIM system according to a first embodiment of the present disclosure.

FIG. 14 illustrates another example of a MAC arithmetic operation performed in a PIM system according to a first embodiment of the present disclosure.

FIG. 38 is a table illustrating various signals transmitted among a host, a PIM controller, and a PIM device included in the PIM system illustrated in FIG. 31, various operations of the PIM device according to the various signals, and various mode statuses of a mode register set according to the various signals.

FIG. 53 is a table illustrating various signals transmitted among a host, a PIM controller, and a PIM device included in the PIM system illustrated in FIG. 50, various operations of the PIM device according to the various signals, and various mode statuses of a mode register set according to the various signals.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to PIM systems and methods of operating the PIM systems.

Figure 1:
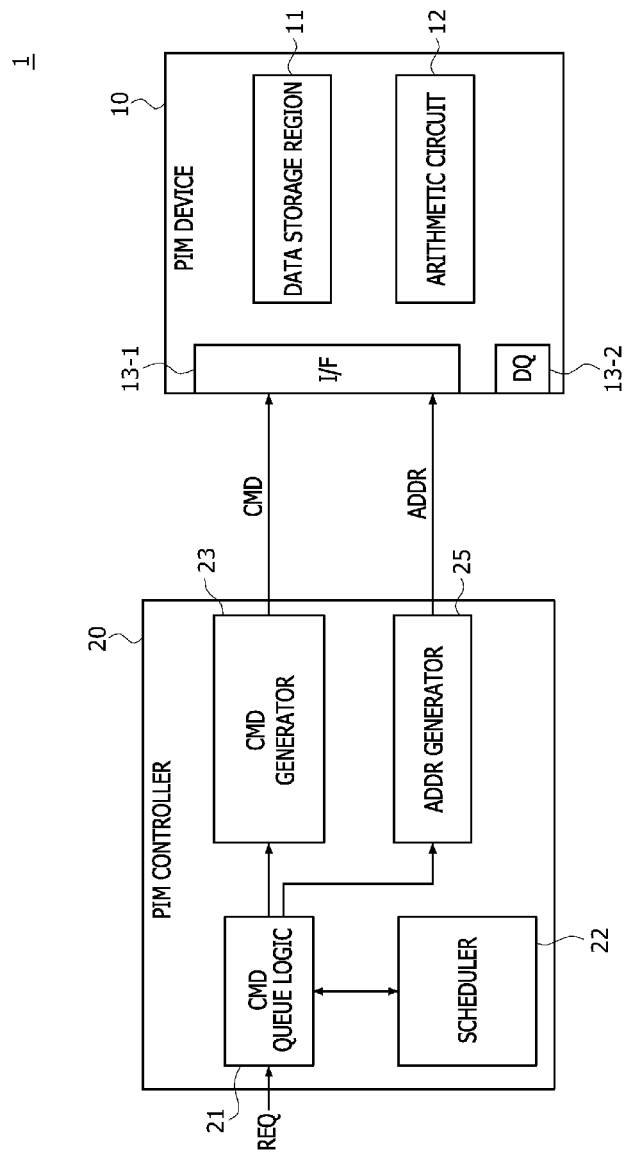
FIG. 1 is a block diagram illustrating a PIM system according to an embodiment of the present disclosure.

FIG. 1 is a block diagram illustrating a PIM system according to an embodiment of the present disclosure. As illustrated in FIG. 1, the PIM system 1 may include a PIM device 10 and a PIM controller 20. The PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2.

The interface 13-1 of the PIM device 10 may receive a command CMD and address ADDR from the PIM controller 20. The interface 13-1 may output the command CMD to the data storage region 11 or the arithmetic circuit 12 in the PIM device 10. The interface 13-1 may output the address ADDR to the data storage region 11 in the PIM device 10. The data I/O pad 13-2 of the PIM device 10 may function as a data communication terminal between a device external to the PIM device 10, for example the PIM controller 20, and the data storage region 11 included in the PIM device 10. The external device to the PIM device 10 may correspond to the PIM controller 20 of the PIM system 1 or a host located outside the PIM system 1. Accordingly, data outputted from the host or the PIM controller 20 may be inputted into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or an arithmetic mode. In the event that the PIM controller 20 controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the arithmetic mode, the arithmetic circuit 12 of the PIM device 10 may receive first data and second data from the data storage region 11 to perform an arithmetic operation. In the event that the PIM controller 20 controls the PIM device 10 such that the PIM device 10 operates in the arithmetic mode, the PIM device 10 may also perform the data read operation and the data write operation for the data storage region 11 to execute the arithmetic operation. The arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PIM controller 20 may be configured to include command queue logic 21, a scheduler 22, a command (CMD) generator 23, and an address (ADDR) generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The command queue stored in the command queue logic 21 may be transmitted to the command generator 23 according to a sequence determined by the scheduler 22. The command queue logic 21, and also the command queue logic 210 of FIGS. 2 and 20, may be implemented as hardware, software, or a combination of hardware and software. For example, the command queue logic 21 and/or 210 may be a command queue logic circuit operating in accordance with an algorithm and/or a processor executing command queue logic code.

The scheduler 22 may adjust a sequence of the command queue when the command queue stored in the command queue logic 21 is outputted from the command queue logic 21. In order to adjust the output sequence of the command queue stored in the command queue logic 21, the scheduler 22 may analyze the information on the storage status of the command queue provided by the command queue logic 21 and may readjust a process sequence of the command queue so that the command queue is processed according to a proper sequence.

The command generator 23 may receive the command queue related to the memory mode of the PIM device 10 and the MAC mode of the PIM device 10 from the command queue logic 21. The command generator 23 may decode the command queue to generate and output the command CMD. The command CMD may include a memory command for the memory mode or an arithmetic command for the arithmetic mode. The command CMD outputted from the command generator 23 may be transmitted to the PIM device 10.

The command generator 23 may be configured to generate and transmit the memory command to the PIM device 10 in the memory mode. The command generator 23 may be configured to generate and transmit a plurality of arithmetic commands to the PIM device 10 in the arithmetic mode. In one example, the command generator 23 may be configured to generate and output first to fifth arithmetic commands with predetermined time intervals in the arithmetic mode. The first arithmetic command may be a control signal for reading the first data out of the data storage region 11. The second arithmetic command may be a control signal for reading the second data out of the data storage region 11. The third arithmetic command may be a control signal for latching the first data in the arithmetic circuit 12. The fourth arithmetic command may be a control signal for latching the second data in the arithmetic circuit 12. And the fifth MAC command may be a control signal for latching arithmetic result data of the arithmetic circuit 12.

The address generator 25 may receive address information from the command queue logic 21 and generate the address ADDR for accessing a region in the data storage region 11. In an embodiment, the address ADDR may include a bank address, a row address, and a column address. The address ADDR outputted from the address generator 25 may be inputted to the data storage region 11 through the interface (I/F) 13-1.

Figure 2:
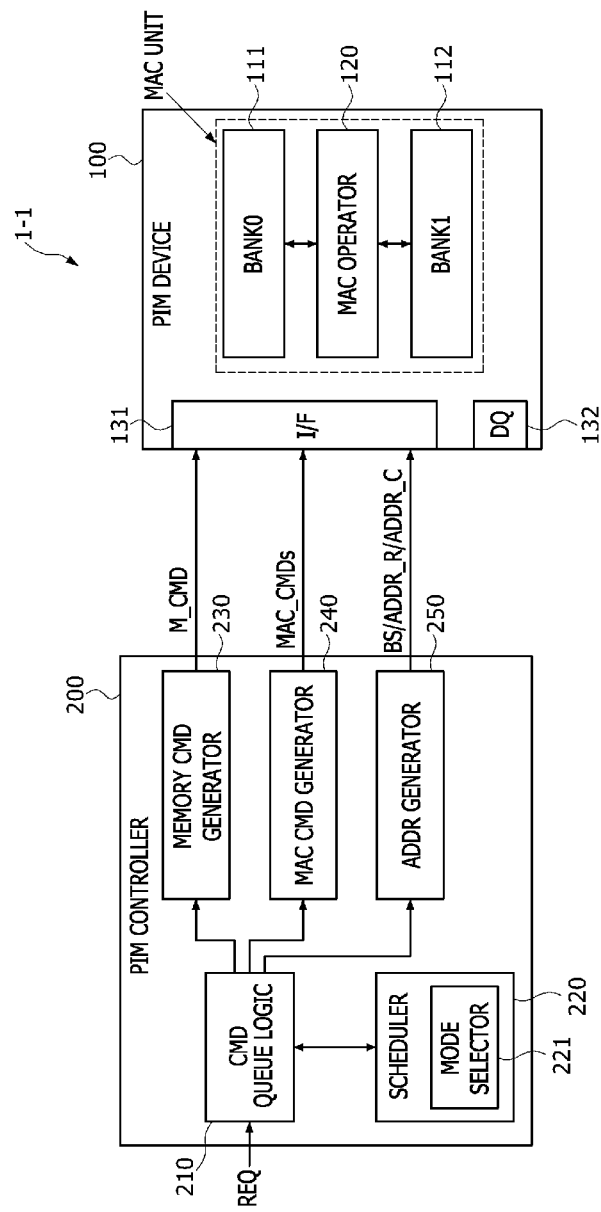
FIG. 2 is a block diagram illustrating a PIM system according to a first embodiment of the present disclosure.

FIG. 2 is a block diagram illustrating a PIM system 1-1 according to a first embodiment of the present disclosure. As illustrated in FIG. 2, the PIM system 1-1 may include a PIM device 100 and a PIM controller 200. The PIM device 100 may include a first memory bank (BANK0) 111, a second memory bank (BANK1) 112, a MAC operator 120, an interface (I/F) 131, and a data input/output (I/O) pad 132. For an embodiment, the MAC operator 120 represents a MAC operator circuit. The first memory bank (BANK0) 111, the second memory bank (BANK1) 112, and the MAC operator 120 included in the PIM device 100 may constitute one MAC unit. In another embodiment, the PIM device 100 may include a plurality of MAC units. The first memory bank (BANK0) 111 and the second memory bank (BANK1) 112 may represent a memory region for storing data, for example, a DRAM device. Each of the first memory bank (BANK0) 111 and the second memory bank (BANK1) 112 may be a component unit which is independently activated and may be configured to have the same data bus width as data I/O lines in the PIM device 100. In an embodiment, the first and second memory banks 111 and 112 may operate through interleaving such that an active operation of the first and second memory banks 111 and 112 is performed in parallel while another memory bank is selected. Each of the first and second memory banks 111 and 112 may include at least one cell array which includes memory unit cells located at cross points of a plurality of rows and a plurality of columns.

Although not shown in the drawings, a core circuit may be disposed adjacent to the first and second memory banks 111 and 112. The core circuit may include X-decoders XDECs and Y-decoders/IO circuits YDEC/IOs. An X-decoder XDEC may also be referred to as a word line decoder or a row decoder. The X-decoder XDEC may receive a row address ADD_R from the PIM controller 200 and may decode the row address ADD_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADDR_C from the PIM controller 200 and may decode the column address ADDR_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the first and second memory banks 111 and 112. In addition, the I/O circuit may include a write driver for driving a write datum during a write operation for the first and second memory banks 111 and 112.

The interface 131 of the PIM device 100 may receive a memory command M_CMD, MAC commands MAC_CMDs, a bank selection signal BS, and the row/column addresses ADDR_R/ADDR_C from the PIM controller 200. The interface 131 may output the memory command M_CMD, together with the bank selection signal BS and the row/column addresses ADDR_R/ADDR_C, to the first memory bank 111 or the second memory bank 112. The interface 131 may output the MAC commands MAC_CMDs to the first memory bank 111, the second memory bank 112, and the MAC operator 120. In such a case, the interface 131 may output the bank selection signal BS and the row/column addresses ADDR_R/ADDR_C to both of the first memory bank 111 and the second memory bank 112. The data I/O pad 132 of the PIM device 100 may function as a data communication terminal between a device external to the PIM device 100 and the MAC unit (which includes the first and second memory banks 111 and 112 and the MAC operator 120) included in the PIM device 100. The external device to the PIM device 100 may correspond to the PIM controller 200 of the PIM system 1-1 or a host located outside the PIM system 1-1. Accordingly, data outputted from the host or the PIM controller 200 may be inputted into the PIM device 100 through the data I/O pad 132.

The PIM controller 200 may control operations of the PIM device 100. In an embodiment, the PIM controller 200 may control the PIM device 100 such that the PIM device 100 operates in a memory mode or a MAC mode. In the event that the PIM controller 200 controls the PIM device 100 such that the PIM device 100 operates in the memory mode, the PIM device 100 may perform a data read operation or a data write operation for the first memory bank 111 and the second memory bank 112. In the event that the PIM controller 200 controls the PIM device 100 such that the PIM device 100 operates in the MAC mode, the PIM device 100 may perform a MAC arithmetic operation for the MAC operator 120. In the event that the PIM controller 200 controls the PIM device 100 such that the PIM device 100 operates in the MAC mode, the PIM device 100 may also perform the data read operation and the data write operation for the first and second memory banks 111 and 112 to execute the MAC arithmetic operation.

The PIM controller 200 may be configured to include command queue logic 210, a scheduler 220, a memory command generator 230, a MAC command generator 240, and an address generator 250. The command queue logic 210 may receive a request REQ from an external device (e.g., a host of the PIM system 1-1) and store a command queue corresponding to the request REQ in the command queue logic 210. The command queue logic 210 may transmit information on a storage status of the command queue to the scheduler 220 whenever the command queue logic 210 stores the command queue. The command queue stored in the command queue logic 210 may be transmitted to the memory command generator 230 or the MAC command generator 240 according to a sequence determined by the scheduler 220. When the command queue outputted from the command queue logic 210 includes command information requesting an operation in the memory mode of the PIM device 100, the command queue logic 210 may transmit the command queue to the memory command generator 230. On the other hand, when the command queue outputted from the command queue logic 210 is command information requesting an operation in the MAC mode of the PIM device 100, the command queue logic 210 may transmit the command queue to the MAC command generator 240. Information on whether the command queue relates to the memory mode or the MAC mode may be provided by the scheduler 220.

The scheduler 220 may adjust a timing of the command queue when the command queue stored in the command queue logic 210 is outputted from the command queue logic 210. In order to adjust the output timing of the command queue stored in the command queue logic 210, the scheduler 220 may analyze the information on the storage status of the command queue provided by the command queue logic 210 and may readjust a process sequence of the command queue such that the command queue is processed according to a proper sequence. The scheduler 220 may output and transmit to the command queue logic 210 information on whether the command queue outputted from the command queue logic 210 relates to the memory mode of the PIM device 100 or relates to the MAC mode of the PIM device 100. In order to obtain the information on whether the command queue outputted from the command queue logic 210 relates to the memory mode or the MAC mode, the scheduler 220 may include a mode selector 221. The mode selector 221 may generate a mode selection signal including information on whether the command queue stored in the command queue logic 210 relates to the memory mode or the MAC mode, and the scheduler 220 may transmit the mode selection signal to the command queue logic 210.

The memory command generator 230 may receive the command queue related to the memory mode of the PIM device 100 from the command queue logic 210. The memory command generator 230 may decode the command queue to generate and output the memory command M_CMD. The memory command M_CMD outputted from the memory command generator 230 may be transmitted to the PIM device 100. In an embodiment, the memory command M_CMD may include a memory read command and a memory write command. When the memory read command is outputted from the memory command generator 230, the PIM device 100 may perform the data read operation for the first memory bank 111 or the second memory bank 112. Data which are read out of the PIM device 100 may be transmitted to an external device through the data I/O pad 132. The read data outputted from the PIM device 100 may be transmitted to a host through the PIM controller 200. When the memory write command is outputted from the memory command generator 230, the PIM device 100 may perform the data write operation for the first memory bank 111 or the second memory bank 112. In such a case, data to be written into the PIM device 100 may be transmitted from the host to the PIM device 100 through the PIM controller 200. The write data inputted to the PIM device 100 may be transmitted to the first memory bank 111 or the second memory bank 112 through the data I/O pad 132.

The MAC command generator 240 may receive the command queue related to the MAC mode of the PIM device 100 from the command queue logic 210. The MAC command generator 240 may decode the command queue to generate and output the MAC commands MAC_CMDs. The MAC commands MAC_CMDs outputted from the MAC command generator 240 may be transmitted to the PIM device 100. The data read operation for the first memory bank 111 and the second memory bank 112 of the PIM device 100 may be performed by the MAC commands MAC_CMDs outputted from the MAC command generator 240, and the MAC arithmetic operation of the MAC operator 120 may also be performed by the MAC commands MAC_CMDs outputted from the MAC command generator 240. The MAC commands MAC_CMDs and the MAC arithmetic operation of the PIM device 100 according to the MAC commands MAC_CMDs will be described in detail with reference to FIG. 3.

The address generator 250 may receive address information from the command queue logic 210. The address generator 250 may generate the bank selection signal BS for selecting one of the first and second memory banks 111 and 112 and may transmit the bank selection signal BS to the PIM device 100. In addition, the address generator 250 may generate the row address ADDR_R and the column address ADDR_C for accessing a region (e.g., memory cells) in the first or second memory bank 111 or 112 and may transmit the row address ADDR_R and the column address ADDR_C to the PIM device 100.

Figure 3:
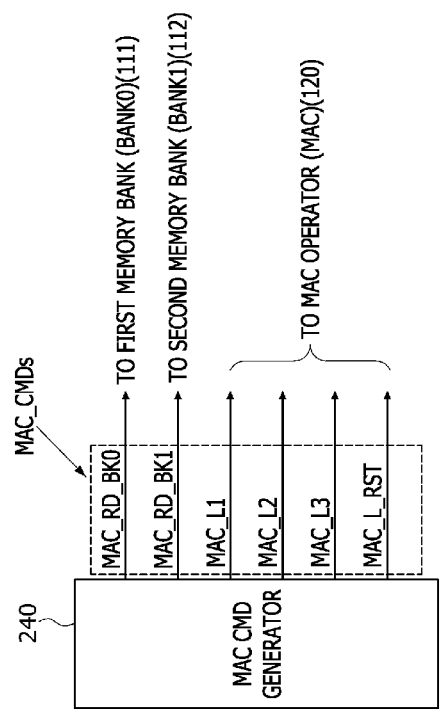
FIG. 3 illustrates MAC commands outputted from a MAC command generator of a PIM controller included in a PIM system according to a first embodiment of the present disclosure.

FIG. 3 illustrates the MAC commands MAC_CMDs outputted from the MAC command generator 240 included in the PIM system 1-1 according to the first embodiment of the present disclosure. As illustrated in FIG. 3, the MAC commands MAC_CMDs may include first to sixth MAC command signals. In an embodiment, the first MAC command signal may be a first MAC read signal MAC_RD_BK0, the second MAC command signal may be a second MAC read signal MAC_RD_BK1, the third MAC command signal may be a first MAC input latch signal MAC_L1, the fourth MAC command signal may be a second MAC input latch signal MAC_L2, the fifth MAC command signal may be a MAC output latch signal MAC_L3, and the sixth MAC command signal may be a MAC latch reset signal MAC_L_RST.

The first MAC read signal MAC_RD_BK0 may control an operation for reading first data (e.g., weight data) out of the first memory bank 111 to transmit the first data to the MAC operator 120. The second MAC read signal MAC_RD_BK1 may control an operation for reading second data (e.g., vector data) out of the second memory bank 112 to transmit the second data to the MAC operator 120. The first MAC input latch signal MAC_L1 may control an input latch operation of the weight data transmitted from the first memory bank 111 to the MAC operator 120. The second MAC input latch signal MAC_L2 may control an input latch operation of the vector data transmitted from the second memory bank 112 to the MAC operator 120. If the input latch operations of the weight data and the vector data are performed, the MAC operator 120 may perform the MAC arithmetic operation to generate MAC result data corresponding to the result of the MAC arithmetic operation. The MAC output latch signal MAC_L3 may control an output latch operation of the MAC result data generated by the MAC operator 120. And, the MAC latch reset signal MAC_L_RST may control an output operation of the MAC result data generated by the MAC operator 120 and a reset operation of an output latch included in the MAC operator 120.

The PIM system 1-1 according to the present embodiment may be configured to perform a deterministic MAC arithmetic operation. The term "deterministic MAC arithmetic operation" used in the present disclosure may be defined as the MAC arithmetic operation performed in the PIM system 1-1 during a predetermined fixed time. Thus, the MAC commands MAC_CMDs transmitted from the PIM controller 200 to the PIM device 100 may be sequentially generated with fixed time intervals. Accordingly, the PIM controller 200 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 200 with fixed time intervals corresponding to the fixed latencies.

For example, the MAC command generator 240 is configured to output the first MAC command at a first point in time. The MAC command generator 240 is configured to output the second MAC command at a second point in time when a first latency elapses from the first point in time. The first latency is set as the time it takes to read the first data out of the first storage region based on the first MAC command and to output the first data to the MAC operator. The MAC command generator 240 is configured to output the third MAC command at a third point in time when a second latency elapses from the second point in time. The second latency is set as the time it takes to read the second data out of the second storage region based on the second MAC command and to output the second data to the MAC operator. The MAC command generator 240 is configured to output the fourth MAC command at a fourth point in time when a third latency elapses from the third point in time. The third latency is set as the time it takes to latch the first data in the MAC operator based on the third MAC command. The MAC command generator 240 is configured to output the fifth MAC command at a fifth point in time when a fourth latency elapses from the fourth point in time. The fourth latency is set as the time it takes to latch the second data in the MAC operator based on the fourth MAC command and to perform the MAC arithmetic operation of the first and second data which are latched in the MAC operator. The MAC command generator 240 is configured to output the sixth MAC command at a sixth point in time when a fifth latency elapses from the fifth point in time. The fifth latency is set as the time it takes to perform an output latch operation of MAC result data generated by the MAC arithmetic operation.

Figure 4:
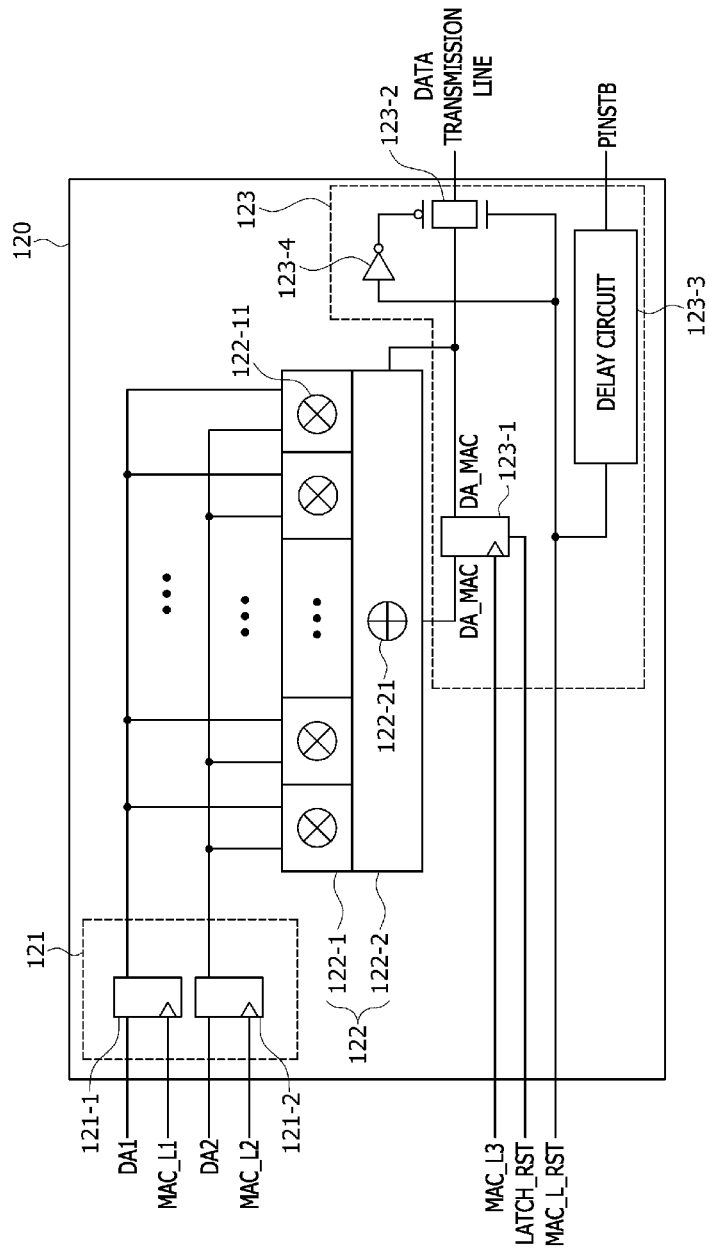
FIG. 4 is a block diagram illustrating an example of a configuration of a MAC operator of a PIM device included in a PIM system according to a first embodiment of the present disclosure.

FIG. 4 illustrates an example of the MAC operator 120 of the PIM device 100 included in the PIM system 1-1 according to the first embodiment of the present disclosure. Referring to FIG. 4, MAC operator 120 may be configured to include a data input circuit 121, a MAC circuit 122, and a data output circuit 123. The data input circuit 121 may include a first input latch 121-1 and a second input latch 121-2. The MAC circuit 122 may include a multiplication logic circuit 122-1 and an addition logic circuit 122-2. The data output circuit 123 may include an output latch 123-1, a transfer gate 123-2, a delay circuit 123-3, and an inverter 123-4. In an embodiment, the first input latch 121-1, the second input latch 121-2, and the output latch 123-1 may be realized using flip-flops.

The data input circuit 121 of the MAC operator 120 may be synchronized with the first MAC input latch signal MAC_L1 to latch first data DA1 transferred from the first memory bank 111 to the MAC circuit 122 through an internal data transmission line. In addition, the data input circuit 121 of the MAC operator 120 may be synchronized with the second MAC input latch signal MAC_L2 to latch second data DA2 transferred from the second memory bank 112 to the MAC circuit 122 through another internal data transmission line. Because the first MAC input latch signal MAC_L1 and the second MAC input latch signal MAC_L2 are sequentially transmitted from the MAC command generator 240 of the PIM controller 200 to the MAC operator 120 of the PIM device 100 with a predetermined time interval, the second data DA2 may be inputted to the MAC circuit 122 of the MAC operator 120 after the first data DA1 is inputted to the MAC circuit 122 of the MAC operator 120.

The MAC circuit 122 may perform the MAC arithmetic operation of the first data DA1 and the second data DA2 inputted through the data input circuit 121. The multiplication logic circuit 122-1 of the MAC circuit 122 may include a plurality of multipliers 122-11. Each of the multipliers 122-11 may perform a multiplying calculation of the first data DA1 outputted from the first input latch 121-1 and the second data DA2 outputted from the second input latch 121-2 and may output the result of the multiplying calculation. Bit values constituting the first data DA1 may be separately inputted to the multipliers 122-11. Similarly, bit values constituting the second data DA2 may also be separately inputted to the multipliers 122-11. For example, if the first data DA1 is represented by an 'N'-bit binary stream, the second data DA2 is represented by an 'N'-bit binary stream, and the number of the multipliers 122-11 is 'M', then 'N/M'-bit portions of the first data DA1 and 'N/M'-bit portions of the second data DA2 may be inputted to each of the multipliers 122-11.

The addition logic circuit 122-2 of the MAC circuit 122 may include a plurality of adders 122-21. Although not shown in the drawings, the plurality of adders 122-21 may be disposed to provide a tree structure including a plurality of stages. Each of the adders 122-21 disposed at a first stage may receive two sets of multiplication result data from two of the multipliers 122-11 included in the multiplication logic circuit 122-1 and may perform an adding calculation of the two sets of multiplication result data to output the addition result data. Each of the adders 122-21 disposed at a second stage may receive two sets of addition result data from two of the adders 122-21 disposed at the first stage and may perform an adding calculation of the two sets of addition result data to output the addition result data. The adder 122-21 disposed at a last stage may receive two sets of addition result data from two adders 122-21 disposed at the previous stage and may perform an adding calculation of the two sets of addition result data to output the addition result data. Although not shown in the drawings, the addition logic circuit 122-2 may further include an additional adder for performing an accumulative adding calculation of MAC result data DA_MAC outputted from the adder 122-21 disposed at the last stage and previous MAC result data DA_MAC stored in the output latch 123-1 of the data output circuit 123.

The data output circuit 123 may output the MAC result data DA_MAC outputted from the MAC circuit 122 to a data transmission line. Specifically, the output latch 123-1 of the data output circuit 123 may be synchronized with the MAC output latch signal MAC_L3 to latch the MAC result data DA_MAC outputted from the MAC circuit 122 and to output the latched data of the MAC result data DA_MAC. The MAC result data DA_MAC outputted from the output latch 123-1 may be fed back to the MAC circuit 122 for the accumulative adding calculation. In addition, the MAC result data DA_MAC may be inputted to the transfer gate 123-2. The output latch 123-1 may be initialized if a latch reset signal LATCH_RST is inputted to the output latch 123-1. In such a case, all of data latched by the output latch 123-1 may be removed. In an embodiment, the latch reset signal LATCH_RST may be activated by generation of the MAC latch reset signal MAC_L_RST and may be inputted to the output latch 123-1.

The MAC latch reset signal MAC_L_RST outputted from the MAC command generator 240 may be inputted to the transfer gate 123-2, the delay circuit 123-3, and the inverter 123-4. The inverter 123-4 may inversely buffer the MAC latch reset signal MAC_L_RST to output the inversely buffered signal of the MAC latch reset signal MAC_L_RST to the transfer gate 123-2. The transfer gate 123-2 may transfer the MAC result data DA_MAC from the output latch 123-1 to the data transmission line in response to the MAC latch reset signal MAC_L_RST. The delay circuit 123-3 may delay the MAC latch reset signal MAC_L_RST by a certain time to generate and output a latch control signal PINSTB.

FIG. 5 illustrates an example of the MAC arithmetic operation performed in the PIM system 1-1 according to the first embodiment of the present disclosure. As illustrated in FIG. 5, the MAC arithmetic operation performed by the PIM system 1-1 may be executed though a matrix calculation. Specifically, the PIM device 100 may execute a matrix multiplying calculation of an 'M×N' weight matrix (e.g., '8×8' weight matrix) and a 'N×1' vector matrix (e.g., '8×1' vector matrix) according to control of the PIM controller 200 (where, 'M' and 'N' are natural numbers). Elements W0.0, . . . , and W7.7 constituting the weight matrix may correspond to the first data DA1 inputted to the MAC operator 120 from the first memory bank 111. Elements X0.0, . . . , and X7.0 constituting the vector matrix may correspond to the second data DA2 inputted to the MAC operator 120 from the second memory bank 112. Each of the elements W0.0, . . . , and W7.7 constituting the weight matrix may be represented by a binary stream having a plurality of bit values. In addition, each of the elements X0.0, . . . , and X7.0 constituting the vector matrix may also be represented by a binary stream having a plurality of bit values. The number of bits included in each of the elements W0.0, . . . , and W7.7 constituting the weight matrix may be equal to the number of bits included in each of the elements X0.0, . . . , and X7.0 constituting the vector matrix.

The matrix multiplying calculation of the weight matrix and the vector matrix may be appropriate for a multilayer perceptron-type neural network structure (hereinafter, referred to as an 'MLP-type neural network'). In general, the MLP-type neural network for executing deep learning may include an input layer, a plurality of hidden layers (e.g., at least three hidden layers), and an output layer. The matrix multiplying calculation (i.e., the MAC arithmetic operation) of the weight matrix and the vector matrix illustrated in FIG. 5 may be performed in one of the hidden layers. In a first hidden layer of the plurality of hidden layers, the MAC arithmetic operation may be performed using vector data inputted to the first hidden layer. However, in each of second to last hidden layers among the plurality of hidden layers, the MAC arithmetic operation may be performed using a calculation result of the previous hidden layer as the vector data.

Figure 6:
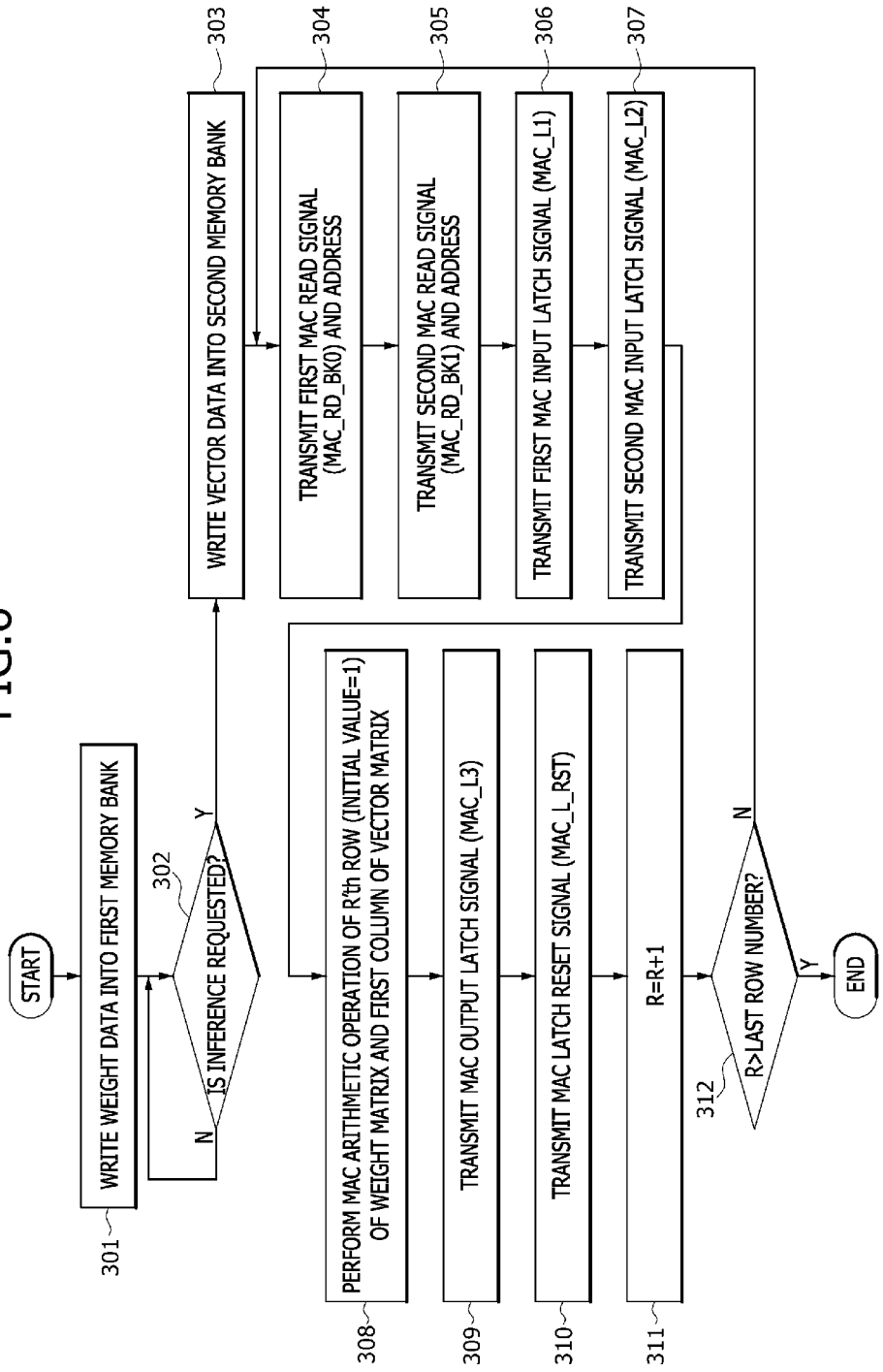
FIG. 6 is a flowchart illustrating processes of the MAC arithmetic operation illustrated in FIG. 5 in a PIM system according to a first embodiment of the present disclosure.

FIG. 6 is a flowchart illustrating processes of the MAC arithmetic operation described with reference to FIG. 5, which are performed in the PIM system 1-1 according to the first embodiment of the present disclosure. In addition, FIGS. 7 to 13 are block diagrams illustrating the processes of the MAC arithmetic operation illustrated in FIG. 5, which are performed in the PIM system 1-1 according to the first embodiment of the present disclosure. Referring to FIGS. 6 to 13, before the MAC arithmetic operation is performed, the first data (i.e., the weight data) may be written into the first memory bank 111 at a step 301. Thus, the weight data may be stored in the first memory bank 111 of the PIM device 100. In the present embodiment, it may be assumed that the weight data are the elements W0.0, . . . , and W7.7 constituting the weight matrix of FIG. 5. The integer before the decimal point is one less than a row number, and the integer after the decimal point is one less than a column number. Thus, for example, the weight W0.0 represents the element of the first row and the first column of the weight matrix.

At a step 302, whether an inference is requested may be determined. An inference request signal may be transmitted from an external device located outside of the PIM system 1-1 to the PIM controller 200 of the PIM system 1-1. An inference request, in some instances, may be based on user input. An inference request may initiate a calculation performed by the PIM system 1-1 to reach a determination based on input data. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 200 at the step 302, then the PIM controller 200 may write the vector data transmitted with the inference request signal into the second memory bank 112 at a step 303. Accordingly, the vector data may be stored in the second memory bank 112 of the PIM device 100.

Figure 7:
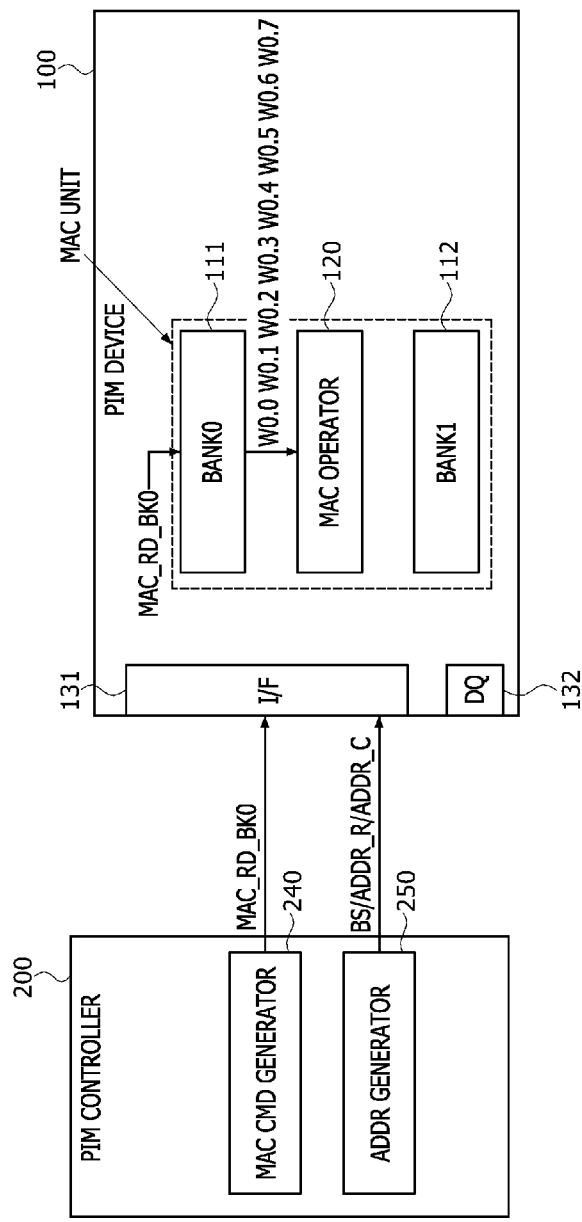
FIGS. 7 to 13 are block diagrams illustrating processes of the MAC arithmetic operation illustrated in FIG. 5 in a PIM system according to a first embodiment of the present disclosure.

At a step 304, the MAC command generator 240 of the PIM controller 200 may generate and transmit the first MAC read signal MAC_RD_BK0 to the PIM device 100, as illustrated in FIG. 7. In such a case, the address generator 250 of the PIM controller 200 may generate and transmit the bank selection signal BS and the row/column address ADDR_R/ADDR_C to the PIM device 100. The bank selection signal BS may be generated to select the first memory bank 111 of the first and second memory banks 111 and 112. Thus, the first MAC read signal MAC_RD_BK0 may control the data read operation for the first memory bank 111 of the PIM device 100. The first memory bank 111 may output and transmit the elements W0.0, . . . , and W0.7 in the first row of the weight matrix of the write data stored in a region of the first memory bank 111, which is selected by the row/column address ADDR_R/ADDR_C, to the MAC operator 120 in response to the first MAC read signal MAC_RD_BK0. In an embodiment, the data transmission from the first memory bank 111 to the MAC operator 120 may be executed through a global input/output (hereinafter, referred to as 'GIO') line which is provided as a data transmission path in the PIM device 100. Alternatively, the data transmission from the first memory bank 111 to the MAC operator 120 may be executed through a first bank input/output (hereinafter, referred to as 'BIO') line which is provided specifically for data transmission between the first memory bank 111 and the MAC operator 120.

Figure 8:
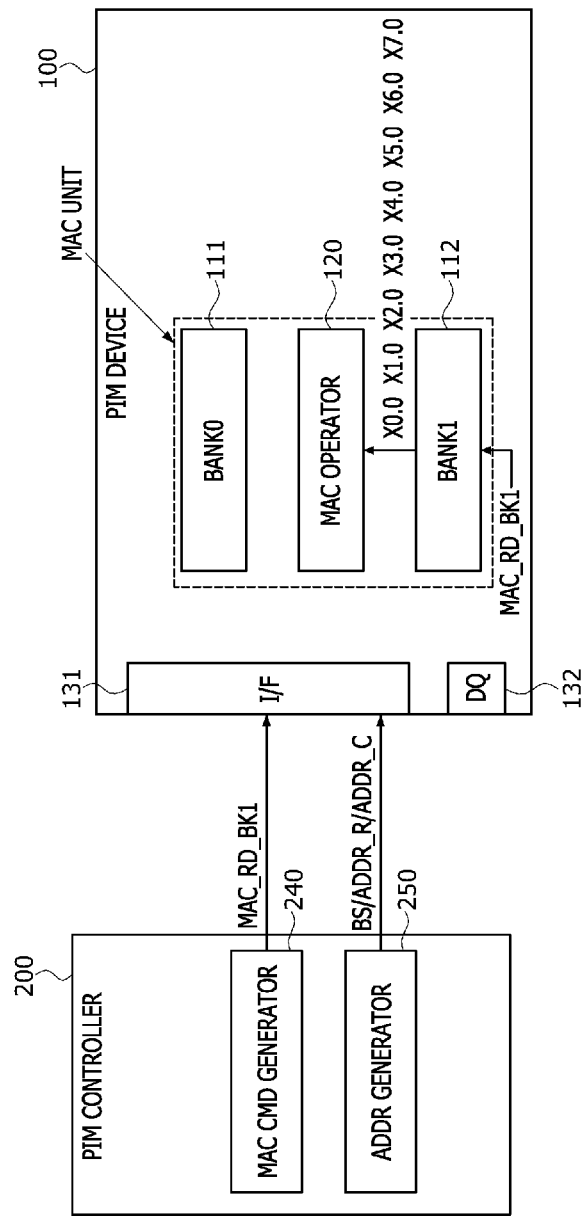

At a step 305, the MAC command generator 240 of the PIM controller 200 may generate and transmit the second MAC read signal MAC_RD_BK1 to the PIM device 100, as illustrated in FIG. 8. In such a case, the address generator 250 of the PIM controller 200 may generate and transmit the bank selection signal BS for selecting the second memory bank 112 and the row/column address ADDR_R/ADDR_C to the PIM device 100. The second MAC read signal MAC_RD_BK1 may control the data read operation for the second memory bank 112 of the PIM device 100. The second memory bank 112 may output and transmit the elements X0.0, . . . , and X7.0 in the first column of the vector matrix corresponding to the vector data stored in a region of the second memory bank 112, which is selected by the row/column address ADDR_R/ADDR_C, to the MAC operator 120 in response to the second MAC read signal MAC_RD_BK1. In an embodiment, the data transmission from the second memory bank 112 to the MAC operator 120 may be executed through the GIO line in the PIM device 100. Alternatively, the data transmission from the second memory bank 112 to the MAC operator 120 may be executed through a second BIO line which is provided specifically for data transmission between the second memory bank 112 and the MAC operator 120.

Figure 9:
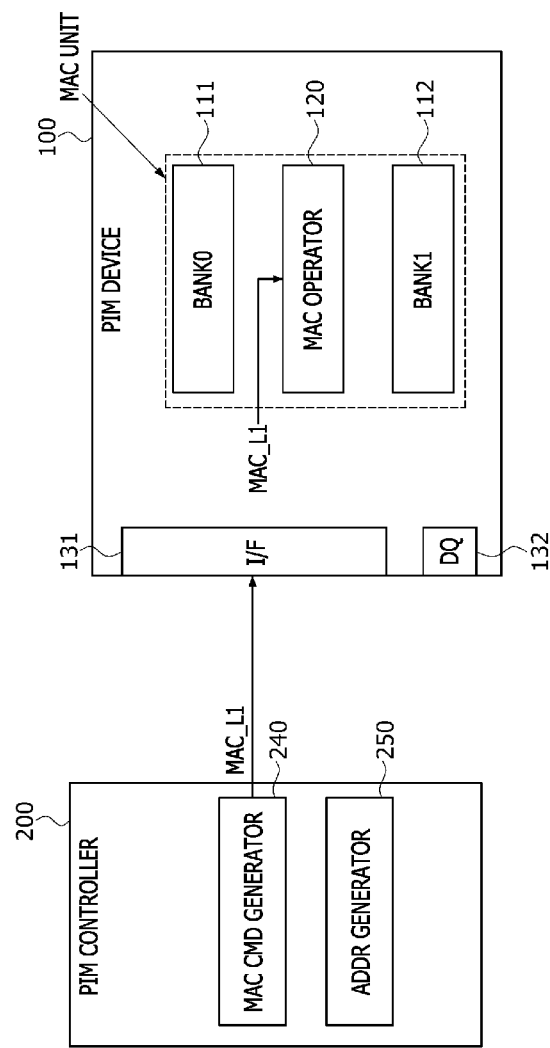
Figure 11:
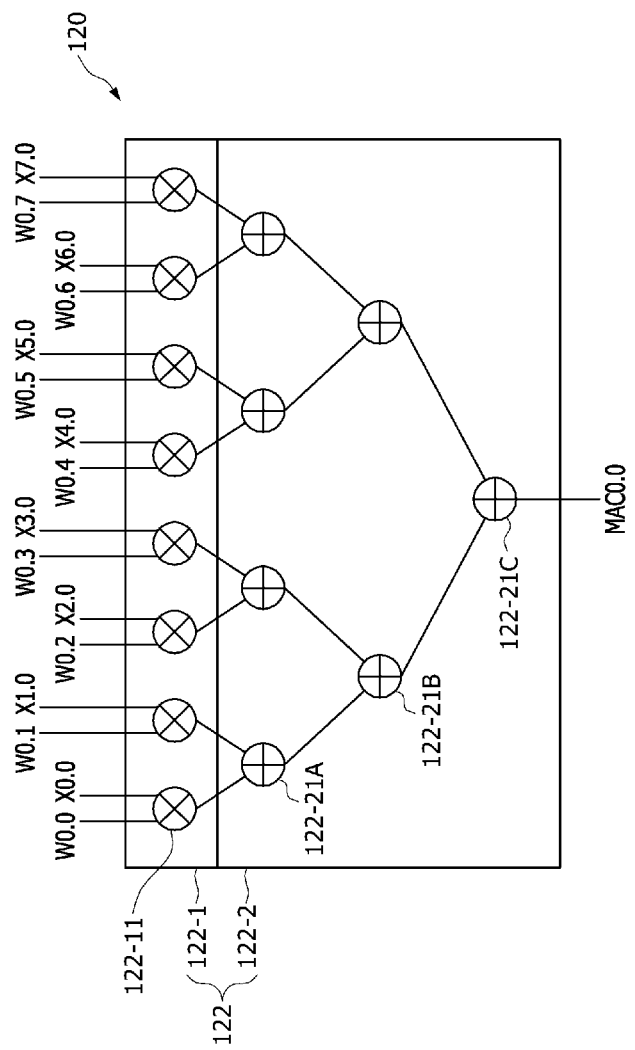

At a step 306, the MAC command generator 240 of the PIM controller 200 may generate and transmit the first MAC input latch signal MAC_L1 to the PIM device 100, as illustrated in FIG. 9. The first MAC input latch signal MAC_L1 may control the input latch operation of the first data for the MAC operator 120 of the PIM device 100. The elements W0.0, . . . , and W0.7 in the first row of the weight matrix may be inputted to the MAC circuit 122 of the MAC operator 120 by the input latch operation, as illustrated in FIG. 11. The MAC circuit 122 may include the plurality of multipliers 122-11 (e.g., eight multipliers 122-11), the number of which is equal to the number of columns of the weight matrix. In such a case, the elements W0.0, . . . , and W0.7 in the first row of the weight matrix may be inputted to the eight multipliers 122-11, respectively.

Figure 10:
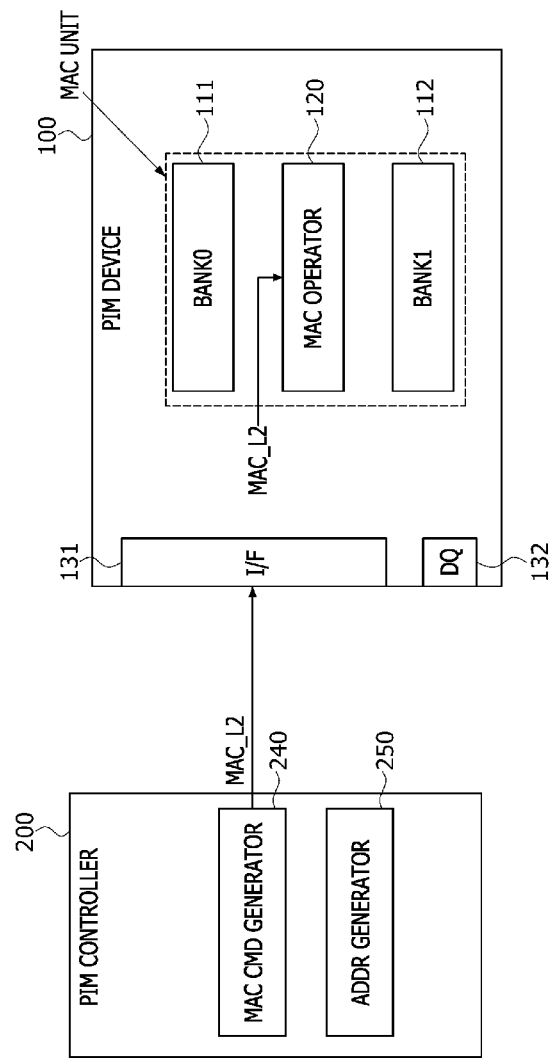

At a step 307, the MAC command generator 240 of the PIM controller 200 may generate and transmit the second MAC input latch signal MAC_L2 to the PIM device 100, as illustrated in FIG. 10. The second MAC input latch signal MAC_L2 may control the input latch operation of the second data for the MAC operator 120 of the PIM device 100. The elements X0.0, . . . , and X7.0 in the first column of the vector matrix may be inputted to the MAC circuit 122 of the MAC operator 120 by the input latch operation, as illustrated in FIG. 11. In such a case, the elements X0.0, . . . , and X7.0 in the first column of the vector matrix may be inputted to the eight multipliers 122-11, respectively.

At a step 308, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. For example, the scalar product is calculated of the Rth '1×N' row vector of the 'M×N' weight matrix and the 'N×1' vector matrix as an 'R×1' element of the 'M×1' MAC result matrix. For R=1, the scalar product of the first row of the weight matrix and the first column of the vector matrix shown in FIG. 5 is W0.0*X0.0+W0.1*X1.0+W0.2*X2.0+ W0.3*X3.0+W0.4*X4.0+W0.5*X5.0+W0.6*X6.0+ W0.7*X7.0. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2, as illustrated in FIG. 11, may include four adders 122-21A disposed at a first stage, two adders 122-21B disposed at a second stage, and an adder 122-21C disposed at a third stage.

Each of the adders 122-21A disposed at the first stage may receive output data of two of the multipliers 122-11 and may perform an adding calculation of the output data of the two multipliers 122-11 to output the result of the adding calculation. Each of the adders 122-21B disposed at the second stage may receive output data of two of the adders 122-21A disposed at the first stage and may perform an adding calculation of the output data of the two adders 122-21A to output the result of the adding calculation. The adder 122-21C disposed at the third stage may receive output data of two of the adders 122-21B disposed at the second stage and may perform an adding calculation of the output data of the two adders 122-21B to output the result of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to an element MAC0.0 located at a first row of an '8×1' MAC result matrix having eight elements of MAC0.0, . . . , and MAC7.0, as illustrated in FIG. 5. The output data MAC0.0 of the addition logic circuit 122-2 may be inputted to the output latch 123-1 disposed in the data output circuit 123 of the MAC operator 120, as described with reference to FIG. 4.

Figure 12:
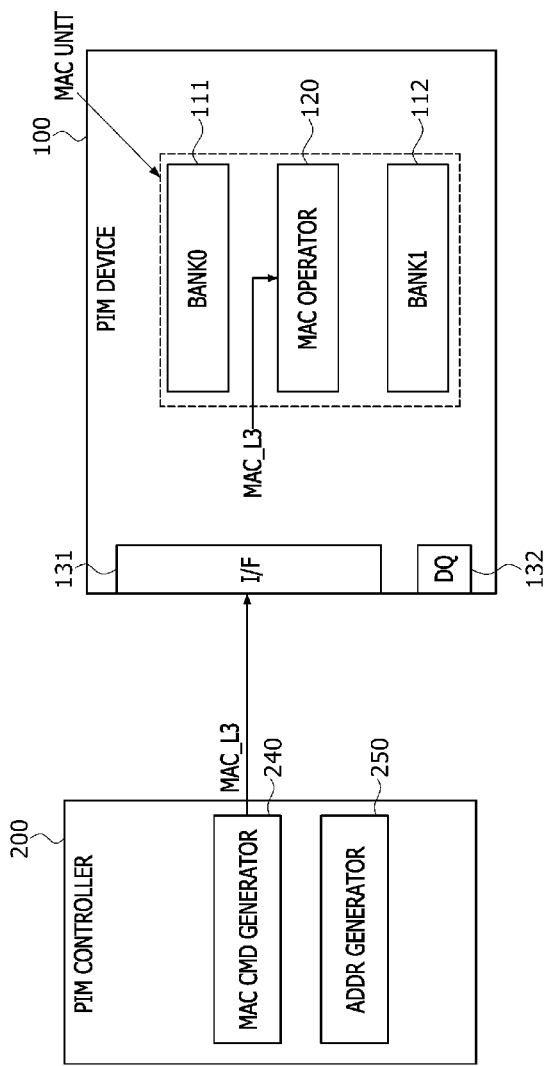

At a step 309, the MAC command generator 240 of the PIM controller 200 may generate and transmit the MAC output latch signal MAC_L3 to the PIM device 100, as illustrated in FIG. 12. The MAC output latch signal MAC_L3 may control the output latch operation of the MAC result data MAC0.0 performed by the MAC operator 120 of the PIM device 100. The MAC result data MAC0.0 inputted from the MAC circuit 122 of the MAC operator 120 may be outputted from the output latch 123-1 in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 13:
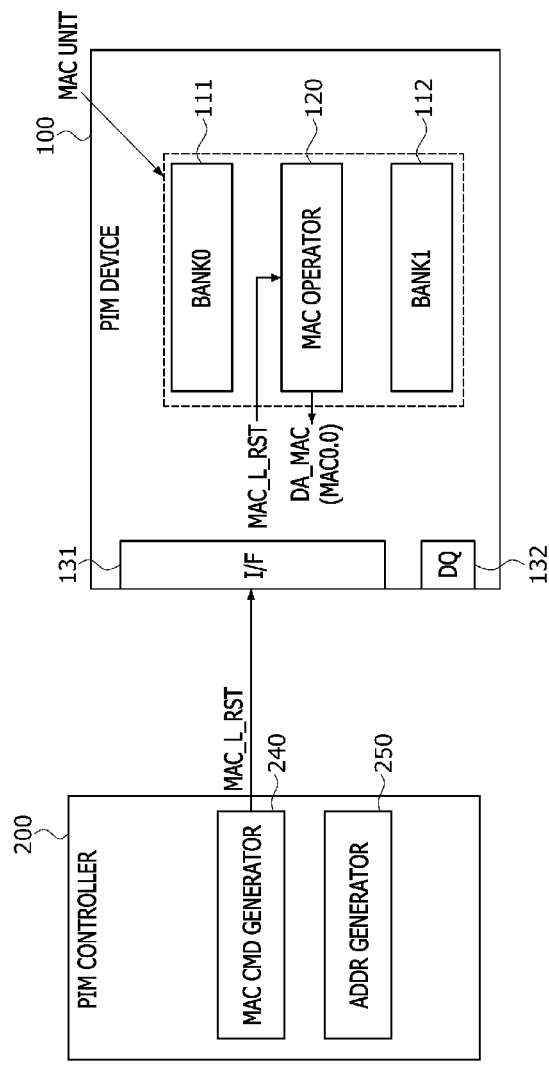

At a step 310, the MAC command generator 240 of the PIM controller 200 may generate and transmit the MAC latch reset signal MAC_L_RST to the PIM device 100, as illustrated in FIG. 13. The MAC latch reset signal MAC_L_RST may control an output operation of the MAC result data MAC0.0 generated by the MAC operator 120 and a reset operation of the output latch included in the MAC operator 120. As described with reference to FIG. 4, the transfer gate 123-2 receiving the MAC result data MAC0.0 from the output latch 123-1 of the MAC operator 120 may be synchronized with the MAC latch reset signal MAC_L_RST to output the MAC result data MAC0.0. In an embodiment, the MAC result data MAC0.0 outputted from the MAC operator 120 may be stored into the first memory bank 111 or the second memory bank 112 through the first BIO line or the second BIO line in the PIM device 100.

At a step 311, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 311. At a step 312, whether the row number changed at the step 311 is greater than the row number of the last row (i.e., the eighth row of the current example) of the weight matrix may be determined. Because the row number of the weight matrix is changed to '2' at the step 311, a process of the MAC arithmetic operation may be fed back to the step 304.

If the process of the MAC arithmetic operation is fed back to the step 304 from the step 312, then the same processes as described with reference to the steps 304 to 310 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 304 at the step 312, then the processes from the step 304 to the step 311 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 311, the MAC arithmetic operation may terminate because the row number of '9' is greater than the last row number of '8' at the step 312.

FIG. 14 illustrates another example of a MAC arithmetic operation performed in the PIM system 1-1 according to the first embodiment of the present disclosure. As illustrated in FIG. 14, the MAC arithmetic operation performed by the PIM system 1-1 may further include an adding calculation of the MAC result matrix and a bias matrix. Specifically, as described with reference to FIG. 5, the PIM device 100 may execute the matrix multiplying calculation of the '8×8' weight matrix and the '8×1' vector matrix according to control of the PIM controller 200. As a result of the matrix multiplying calculation of the '8×8' weight matrix and the '8×1' vector matrix, the '8×1' MAC result matrix having the eight elements MAC0.0, . . . , and MAC7.0 may be generated. The '8×1' MAC result matrix may be added to a '8×1' bias matrix. The '8×1' bias matrix may have elements B0.0, . . . , and B7.0 corresponding to bias data. The bias data may be set to reduce an error of the MAC result matrix. As a result of the adding calculation of the MAC result matrix and the bias matrix, a '8×1' biased result matrix having eight elements Y0.0, . . . , and Y7.0 may be generated.

Figure 15:
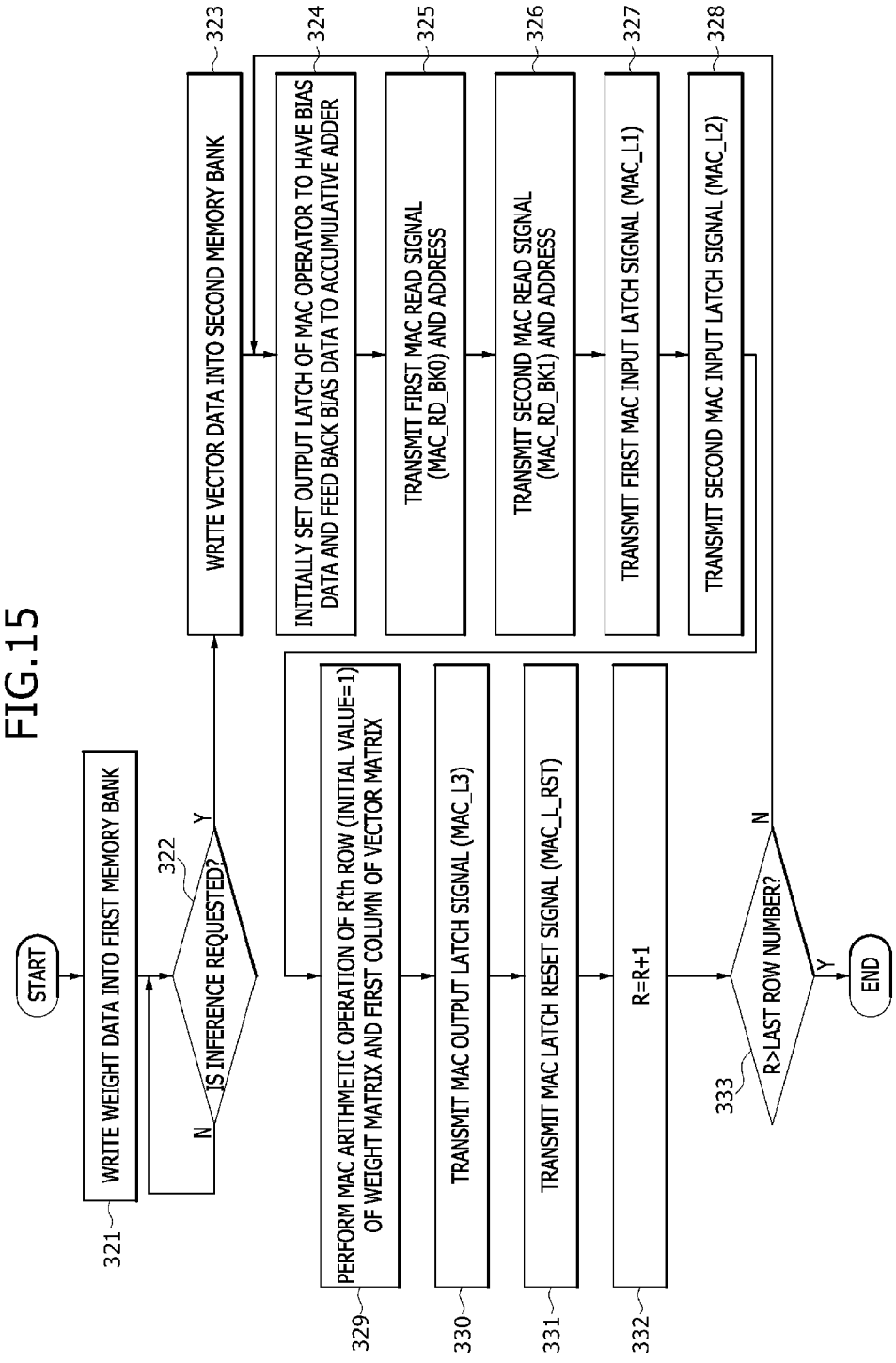
FIG. 15 is a flowchart illustrating processes of the MAC arithmetic operation illustrated in FIG. 14 in a PIM system according to a first embodiment of the present disclosure.
Figure 16:
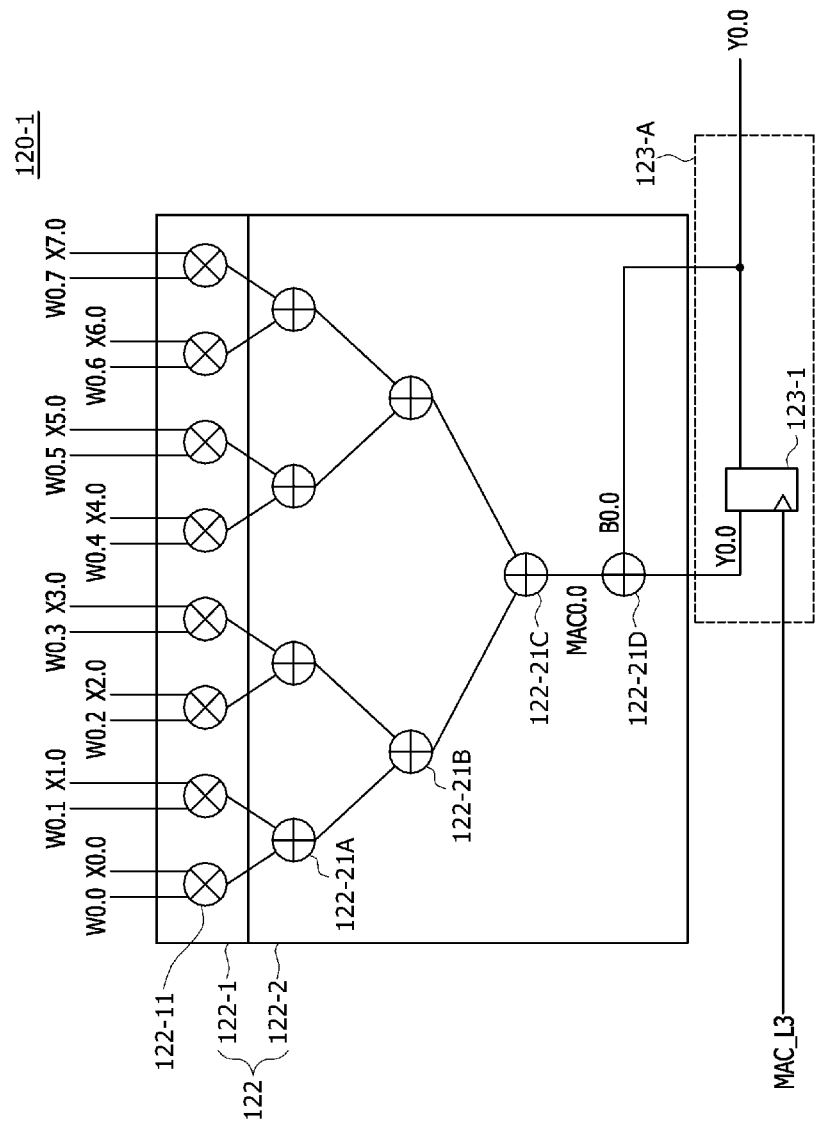
FIG. 16 illustrates an example of a configuration of a MAC operator for performing the MAC arithmetic operation of FIG. 14 in a PIM system according to a first embodiment of the present disclosure.

FIG. 15 is a flowchart illustrating processes of the MAC arithmetic operation described with reference to FIG. 14 in the PIM system 1-1 according to the first embodiment of the present disclosure. Moreover, FIG. 16 illustrates an example of a configuration of a MAC operator 120-1 for performing the MAC arithmetic operation of FIG. 14 in the PIM system 1-1 according to the first embodiment of the present disclosure. In FIG. 16, the same reference numerals or the same reference symbols as used in FIG. 4 denote the same elements, and the detailed descriptions of the same elements as indicated in the previous embodiment will be omitted hereinafter. Referring to FIG. 15, the first data (i.e., the weight data) may be written into the first memory bank 111 at a step 321 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 14.

At a step 322, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 200 at the step 322, the PIM controller 200 may write the vector data transmitted with the inference request signal into the second memory bank 112 at a step 323. Accordingly, the vector data may be stored in the second memory bank 112 of the PIM device 100.

At a step 324, the output latch of the MAC operator may be initially set to have the bias data and the initially set bias data may be fed back to an accumulative adder of the MAC operator. This process is executed to perform the matrix adding calculation of the MAC result matrix and the bias matrix, which is described with reference to FIG. 14. In other words, the output latch 123-1 in the data output circuit 123-A of the MAC operator (120-1) is set to have the bias data. Because the matrix multiplying calculation is executed for the first row of the weight matrix, the output latch 123-1 may be initially set to have the element B0.0 located at a cross point of the first row and the first column of the bias matrix as the bias data. The output latch 123-1 may output the bias data B0.0, and the bias data B0.0 outputted from the output latch 123-1 may be inputted to the accumulative adder 122-21D of the addition logic circuit 122-2, as illustrated in FIG. 16.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-1 of the PIM device 100. When a subsequent MAC arithmetic operation is performed, the accumulative adder 122-21D of the MAC operator 120-1 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

In a step 325, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 325 may be executed in the same way as described with reference to FIG. 7. In a step 326, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 326 may be executed in the same way as described with reference to FIG. 8.

At a step 327, the MAC command generator 240 of the PIM controller 200 may generate and transmit the first MAC input latch signal MAC_L1 to the PIM device 100. The step 327 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 328, the MAC command generator 240 of the PIM controller 200 may generate and transmit the second MAC input latch signal MAC_L2 to the PIM device 100. The step 328 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 329, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 16. The accumulative adder 122-21D may add output data of the adder 122-21C to feedback data fed back from the output latch 123-1 to output the result of the adding calculation. The output data of the adder 122-21C may be the matrix multiplying result MAC0.0, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123 disposed in a data output circuit 123-A of the MAC operator 120-1.

At a step 330, the MAC command generator 240 of the PIM controller 200 may generate and transmit the MAC output latch signal MAC_L3 to the PIM device 100. The step 330 may be executed in the same way as described with reference to FIG. 12. The MAC output latch signal MAC_L3 may control the output latch operation of the MAC result data MAC0.0, which is performed by the MAC operator 120-1 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123 may be inputted to the transfer gate 123-2.

At a step 331, the MAC command generator 240 of the PIM controller 200 may generate and transmit the MAC latch reset signal MAC_L_RST to the PIM device 100. The step 331 may be executed in the same way as described with reference to FIG. 13. The MAC latch reset signal MAC_L_RST may control an output operation of the biased result data Y0.0 generated by the MAC operator 120 and a reset operation of the output latch 123-1 included in the MAC operator 120. The transfer gate 123-2 receiving the biased result data Y0.0 from the output latch 123-1 of the data output circuit 123-A included in the MAC operator 120 may be synchronized with the MAC latch reset signal MAC_L_RST to output the biased result data Y0.0. In an embodiment, the biased result data Y0.0 outputted from the MAC operator 120 may be stored into the first memory bank 111 or the second memory bank 112 through the first BIO line or the second BIO line in the PIM device 100.

At a step 332, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 332. At a step 333, whether the row number changed at the step 332 is greater than the row number of the last row (i.e., the eighth row of the current example) of the weight matrix may be determined. Because the row number of the weight matrix is changed to '2' at the step 332, a process of the MAC arithmetic operation may be fed back to the step 324.

If the process of the MAC arithmetic operation is fed back to the step 324 from the step 333, then the same processes as described with reference to the steps 324 to 331 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix and the bias data B0.0 in the output latch 123-1 initially set at the step 324 may be changed into the bias data B1.0. If the process of the MAC arithmetic operation is fed back to the step 324 at the step 333, the processes from the step 324 to the step 332 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 332, the MAC arithmetic operation may terminate because the row number of '9' is greater than the last row number of '8' at the step 333.

Figure 17:
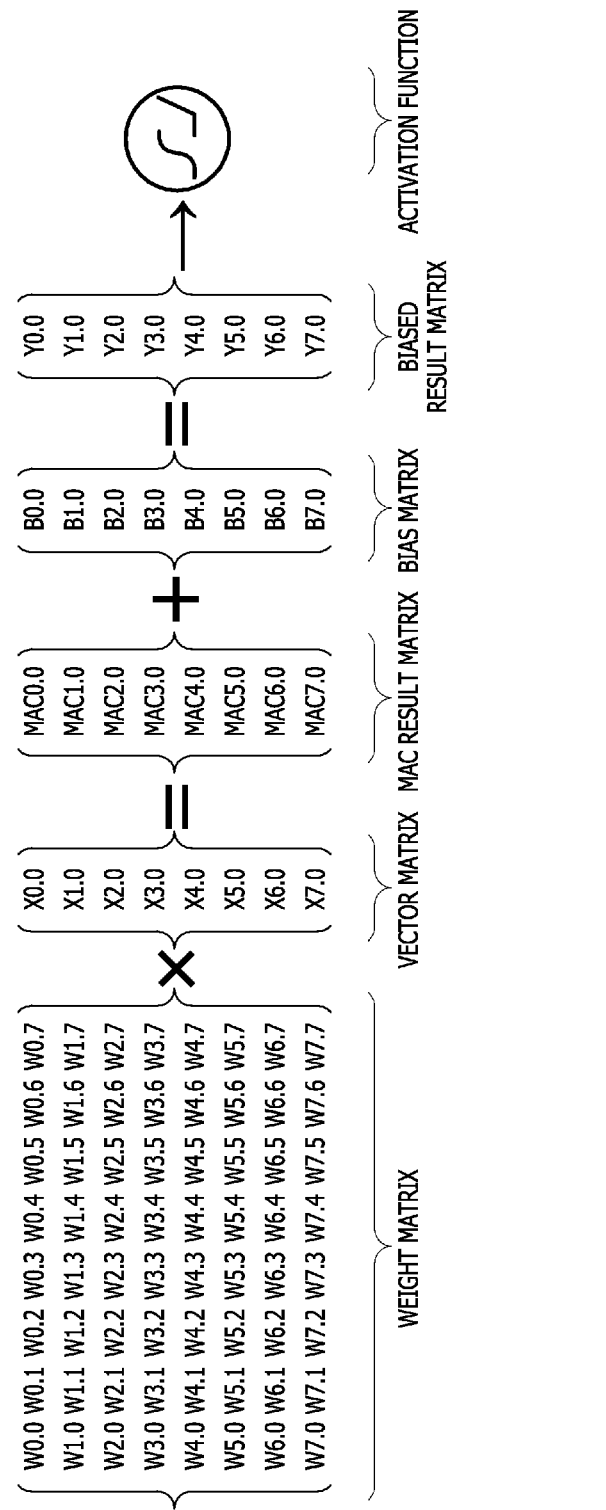
FIG. 17 illustrates yet another example of a MAC arithmetic operation performed in a PIM system according to a first embodiment of the present disclosure.

FIG. 17 illustrates yet another example of a MAC arithmetic operation performed in the PIM system 1-1 according to the first embodiment of the present disclosure. As illustrated in FIG. 17, the MAC arithmetic operation performed by the PIM system 1-1 may further include a process for applying the biased result matrix to an activation function. Specifically, as described with reference to FIG. 14, the PIM device 100 may execute the matrix multiplying calculation of the '8×8' weight matrix and the '8×1' vector matrix according to control of the PIM controller 200 to generate the MAC result matrix. In addition, the MAC result matrix may be added to the bias matrix to generate biased result matrix.

The biased result matrix may be applied to the activation function. The activation function means a function which is used to calculate a unique output value by comparing a MAC calculation value with a critical value in an MLP-type neural network. In an embodiment, the activation function may be a unipolar activation function which generates only positive output values or a bipolar activation function which generates negative output values as well as positive output values. In different embodiments, the activation function may include a sigmoid function, a hyperbolic tangent (Tan h) function, a rectified linear unit (ReLU) function, a leaky ReLU function, an identity function, and a maxout function.

Figure 18:
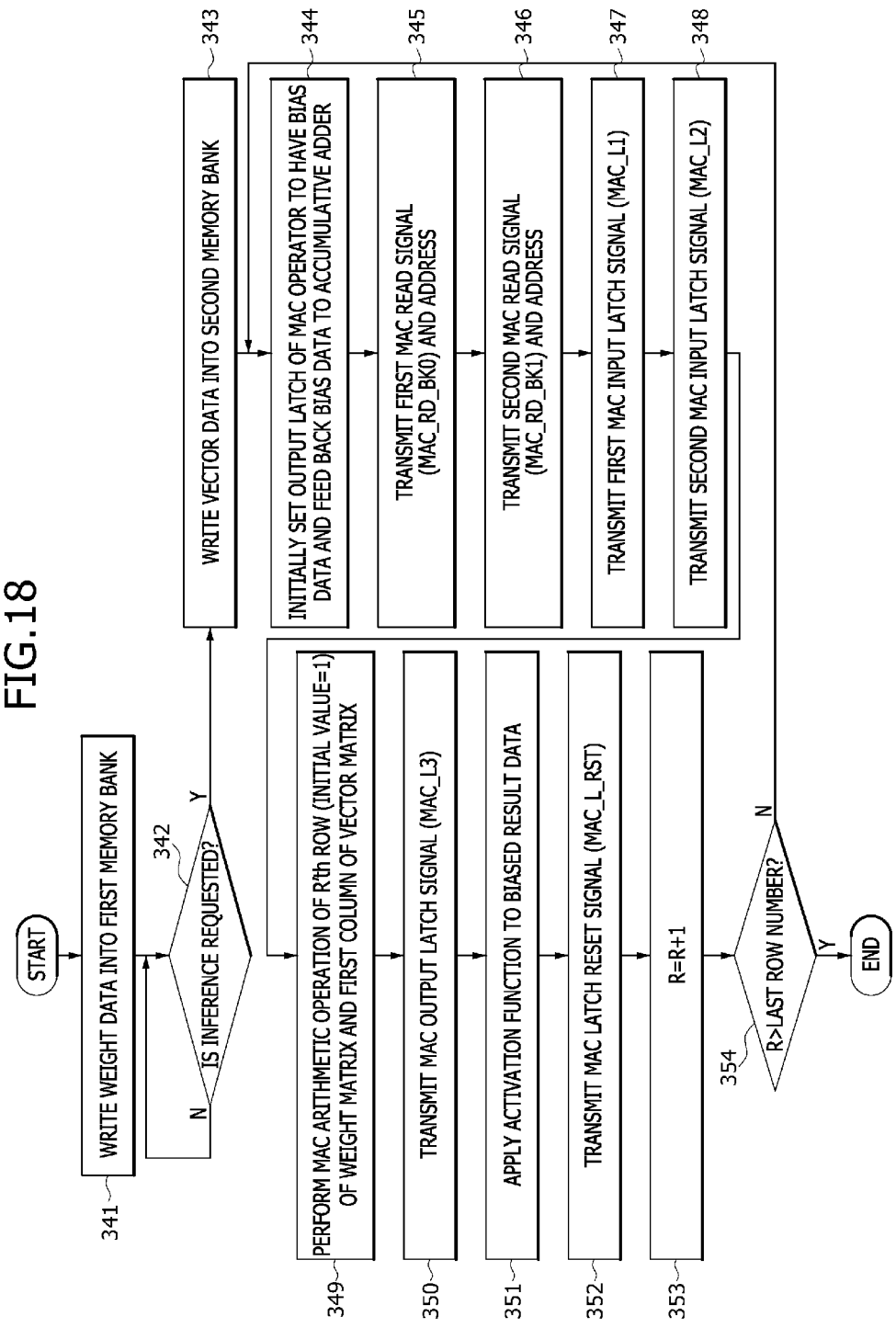
FIG. 18 is a flowchart illustrating processes of the MAC arithmetic operation illustrated in FIG. 17 in a PIM system according to a first embodiment of the present disclosure.
Figure 19:
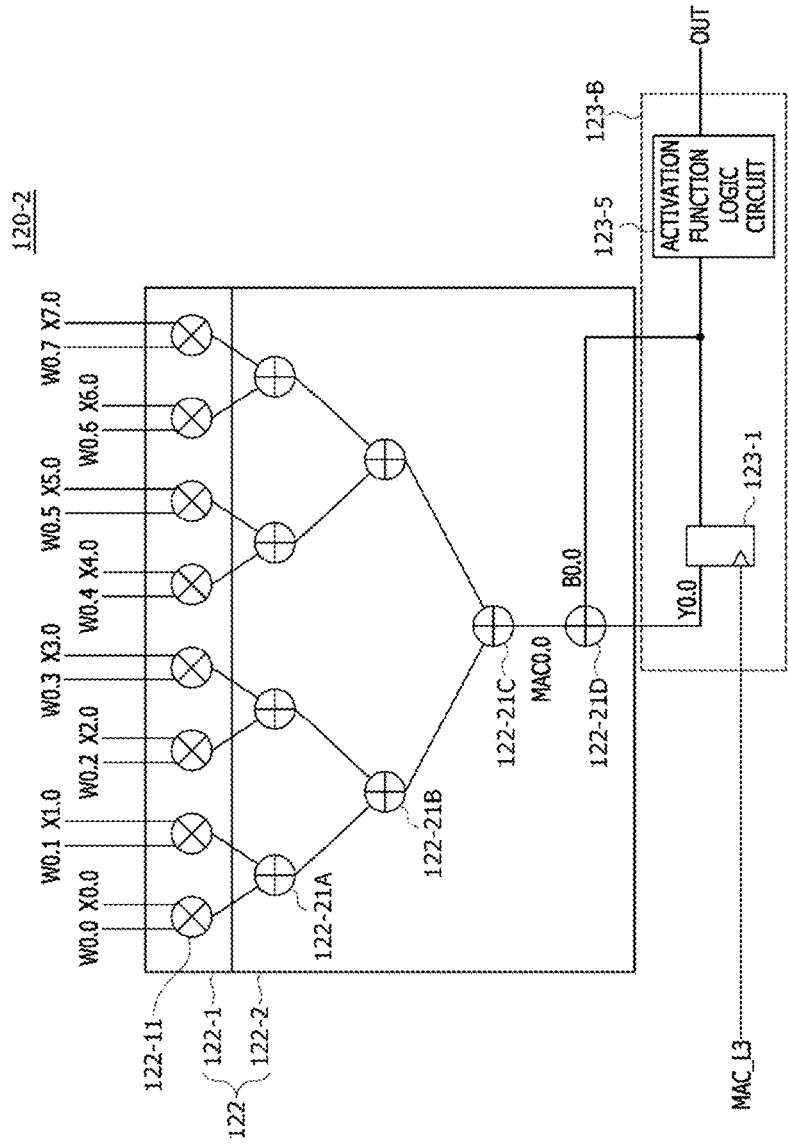
FIG. 19 illustrates an example of a configuration of a MAC operator for performing the MAC arithmetic operation of FIG. 17 in a PIM system according to a first embodiment of the present disclosure.

FIG. 18 is a flowchart illustrating processes of the MAC arithmetic operation described with reference to FIG. 17 in the PIM system 1-1 according to the first embodiment of the present disclosure. Moreover, FIG. 19 illustrates an example of a configuration of a MAC operator 120-2 for performing the MAC arithmetic operation of FIG. 17 in the PIM system 1-1 according to the first embodiment of the present disclosure. In FIG. 19, the same reference numerals or the same reference symbols as used in FIG. 4 denote the same elements, and the detailed descriptions of the same elements as mentioned in the previous embodiment will be omitted hereinafter. Referring to FIG. 18, the first data (i.e., the weight data) may be written into the first memory bank 111 at a step 341 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 17.

At a step 342, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., the data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 200 at the step 342, then the PIM controller 200 may write the vector data transmitted with the inference request signal into the second memory bank 112 at a step 343. Accordingly, the vector data may be stored in the second memory bank 112 of the PIM device 100.

At a step 344, an output latch of a MAC operator may be initially set to have bias data and the initially set bias data may be fed back to an accumulative adder of the MAC operator. This process is executed to perform the matrix adding calculation of the MAC result matrix and the bias matrix, which is described with reference to FIG. 17. That is, as illustrated in FIG. 19, the output latch 123-1 of the MAC operator (120-2 of FIG. 19) may be initially set to have the bias data of the bias matrix. Because the matrix multiplying calculation is executed for the first row of the weight matrix, the element B0.0 located at first row and the first column of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the MAC operator 120-2.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-2 of the PIM device 100. When a subsequent MAC arithmetic operation is performed, the accumulative adder 122-21D of the MAC operator 120-2 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. As illustrated in FIG. 19, the biased result data Y0.0 may be transmitted from the output latch 123-1 to an activation function logic circuit 123-5 disposed in a data output circuit 123-B of the MAC operator 120-2 in synchronization with the MAC output latch signal MAC_L3 transmitted in a subsequent process.

In a step 345, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 345 may be executed in the same way as described with reference to FIG. 7. In a step 346, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 346 may be executed in the same way as described with reference to FIG. 8.

At a step 347, the MAC command generator 240 of the PIM controller 200 may generate and transmit the first MAC input latch signal MAC_L1 to the PIM device 100. The step 347 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 348, the MAC command generator 240 of the PIM controller 200 may generate and transmit the second MAC input latch signal MAC_L2 to the PIM device 100. The step 348 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 349, the MAC circuit 122 of the MAC operator 120 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 19. The accumulative adder 122-21D may add output data of the adder 122-21C to feedback data fed back from the output latch 123-1 to output the result of the adding calculation. The output data of the adder 122-21C may be the element MAC0.0 of the '8×1' MAC result matrix, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be inputted to the output latch 123-1 disposed in the data output circuit 123-A of the MAC operator 120.

At a step 350, the MAC command generator 240 of the PIM controller 200 may generate and transmit the MAC output latch signal MAC_L3 to the PIM device 100. The step 350 may be executed in the same way as described with reference to FIG. 12. The MAC output latch signal MAC_L3 may control the output latch operation of the output latch 123-1 included in the MAC operator 120 of the PIM device 100. The biased result data Y0.0 transmitted from the MAC circuit 122 of the MAC operator 120 to the output latch 123-1 may be outputted from the output latch 123-1 in synchronization with the MAC output latch signal MAC_L3. The biased result data Y0.0 outputted from the output latch 123-1 may be inputted to the activation function logic circuit 123-5. At a step 351, the activation function logic circuit 123-5 may apply an activation function to the biased result data Y0.0 to generate a final output value, and the final output value may be inputted to the transfer gate (123-2 of FIG. 4). This, for example, is the final output value for the current of R which is incremented in step 354.

At a step 352, the MAC command generator 240 of the PIM controller 200 may generate and transmit the MAC latch reset signal MAC_L_RST to the PIM device 100. The step 352 may be executed in the same way as described with reference to FIG. 13. The MAC latch reset signal MAC_L_RST may control an output operation of the final output value generated by the MAC operator 120 and a reset operation of the output latch 123-1 included in the MAC operator 120. The transfer gate 123-2 receiving the final output value from the activation function logic circuit 123-5 of the data output circuit 123-B included in the MAC operator 120 may be synchronized with the MAC latch reset signal MAC_L_RST to output the final output value. In an embodiment, the final output value outputted from the MAC operator 120 may be stored into the first memory bank 111 or the second memory bank 112 through the first BIO line or the second BIO line in the PIM device 100.

At a step 353, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 353. At a step 354, whether the row number changed at the step 353 is greater than the row number of the last row (i.e., the eighth row) of the weight matrix may be determined. Because the row number of the weight matrix is changed to '2' at the step 353, a process of the MAC arithmetic operation may be fed back to the step 344.

If the process of the MAC arithmetic operation is fed back to the step 344 from the step 354, the same processes as described with reference to the steps 344 to 354 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix, and the bias data B0.0 in the output latch 123-1 initially set at the step 344 may be changed to the bias data B1.0. If the process of the MAC arithmetic operation is fed back to the step 344 from the step 354, the processes from the step 344 to the step 354 may be iteratively performed until the MAC arithmetic operation is performed for all of the rows of the weight matrix with the vector matrix. For an embodiment, a plurality of final output values, namely, one final output value for each incremented value of R, represents an 'N×1' final result matrix. If the MAC arithmetic operation for the eighth row of the weight matrix terminates and the row number of the weight matrix changes from '8' to '9' at the step 354, the MAC arithmetic operation may terminate because the row number of '9' is greater than the last row number of '8' at the step 354.

Figure 20:
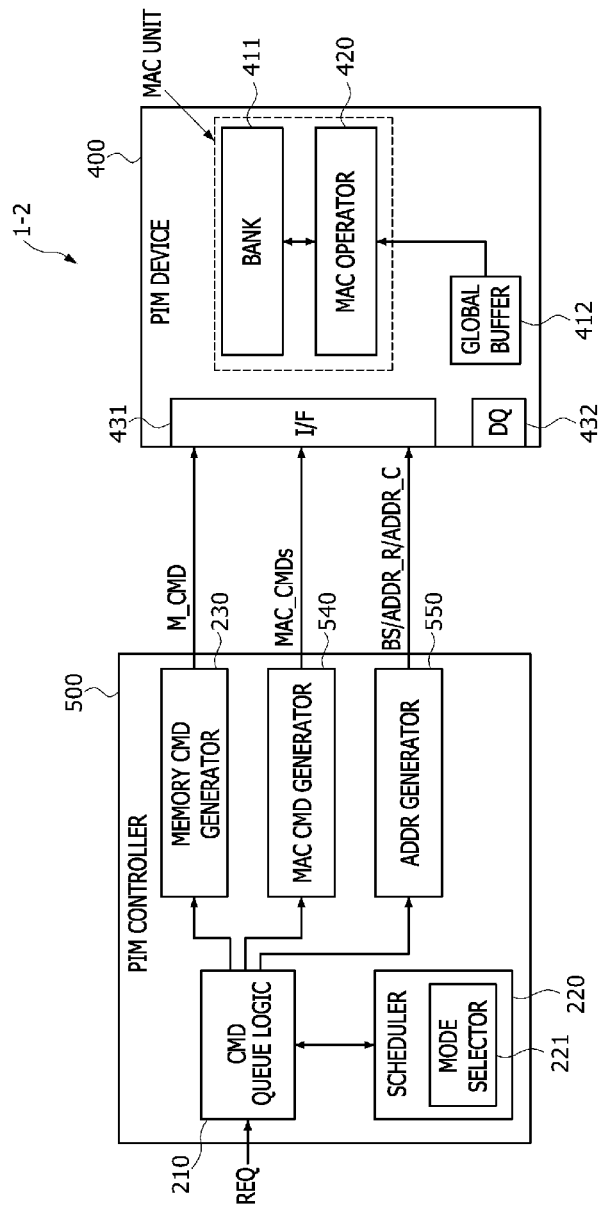
FIG. 20 is a block diagram illustrating a PIM system according to a second embodiment of the present disclosure.

FIG. 20 is a block diagram illustrating a PIM system 1-2 according to a second embodiment of the present disclosure. In FIG. 20, the same reference numerals or the same reference symbols as used in FIG. 2 denote the same elements. As illustrated in FIG. 20, the PIM system 1-2 may be configured to include a PIM device 400 and a PIM controller 500. The PIM device 400 may be configured to include a memory bank (BANK) 411 corresponding to a storage region, a global buffer 412, a MAC operator 420, an interface (I/F) 431, and a data input/output (I/O) pad 432. For an embodiment, the MAC operator 420 represents a MAC operator circuit. The memory bank (BANK) 411 and the MAC operator 420 included in the PIM device 400 may constitute one MAC unit. In another embodiment, the PIM device 400 may include a plurality of MAC units. The memory bank (BANK) 411 may represent a memory region for storing data, for example, a DRAM device. The global buffer 412 may also represent a memory region for storing data, for example, a DRAM device or an SRAM device. The memory bank (BANK) 411 may be a component unit which is independently activated and may be configured to have the same data bus width as data I/O lines in the PIM device 400. In an embodiment, the memory bank 411 may operate through interleaving such that an active operation of the memory bank 411 is performed in parallel while another memory bank is selected. The memory bank 411 may include at least one cell array which includes memory unit cells located at cross points of a plurality of rows and a plurality of columns.

Although not shown in the drawings, a core circuit may be disposed adjacent to the memory bank 411. The core circuit may include X-decoders XDECs and Y-decoders/IO circuits YDEC/IOs. An X-decoder XDEC may also be referred to as a word line decoder or a row decoder. The X-decoder XDEC may receive a row address ADDR_R from the PIM controller 500 and may decode the row address ADDR_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADD_C from the PIM controller 500 and may decode the column address ADD_C to select and enable at least one of the columns (i.e., bit lines) coupled to the selected memory bank. Each of the I/O circuits may include an I/O sense amplifier for sensing and amplifying a level of a read datum outputted from the corresponding memory bank during a read operation for the memory bank 411. In addition, the I/O circuit may include a write driver for driving a write datum during a write operation for the memory bank 411.

The MAC operator 420 of the PIM device 400 may have mostly the same configuration as the MAC operator 120 described with reference to FIG. 4. That is, the MAC operator 420 may be configured to include the data input circuit 121, the MAC circuit 122, and the data output circuit 123, as described with reference to FIG. 4. The data input circuit 121 may be configured to include the first input latch 121-1 and the second input latch 121-2. The MAC circuit 122 may be configured to include the multiplication logic circuit 122-1 and the addition logic circuit 122-2. The data output circuit 123 may be configured to include the output latch 123-1, the transfer gate 123-2, the delay circuit 123-3, and the inverter 123-4. In an embodiment, the first input latch 121-1, the second input latch 121-2, and the output latch 123-1 may be realized using flip-flops.

The MAC operator 420 may be different from the MAC operator 120 in that a MAC input latch signal MAC_L1 is simultaneously inputted to both of clock terminals of the first and second input latches 121-1 and 121-2. As indicated in the following descriptions, the weight data and the vector data may be simultaneously transmitted to the MAC operator 420 of the PIM device 400 included in the PIM system 1-2 according to the present embodiment. That is, the first data DA1 (i.e., the weight data) and the second data DA2 (i.e., the vector data) may be simultaneously inputted to both of the first input latch 121-1 and the second input latch 121-2 constituting the data input circuit 121, respectively. Accordingly, it may be unnecessary to apply an extra control signal to the clock terminals of the first and second input latches 121-1 and 121-2, and thus the MAC input latch signal MAC_L1 may be simultaneously inputted to both of the clock terminals of the first and second input latches 121-1 and 121-2 included in the MAC operator 420.

In another embodiment, the MAC operator 420 may be realized to have the same configuration as the MAC operator 120-1 described with reference to FIG. 16 to perform the operation illustrated in FIG. 14. Even in such a case, the MAC operator 420 may have the same configuration as described with reference to FIG. 16 except that the MAC input latch signal MAC_L1 is simultaneously inputted to both of the clock terminals of the first and second input latches 121-1 and 121-2 constituting the data input circuit 121. In yet another embodiment, the MAC operator 420 may be realized to have the same configuration as the MAC operator 120-2 described with reference to FIG. 19 to perform the operation illustrated in FIG. 17. Even in such a case, the MAC operator 420 may have the same configuration as described with reference to FIG. 19 except that the MAC input latch signal MAC_L1 is simultaneously inputted to both of the clock terminals of the first and second input latches 121-1 and 121-2 constituting the data input circuit 121.

The interface 431 of the PIM device 400 may receive the memory command M_CMD, the MAC commands MAC_CMDs, the bank selection signal BS, and the row/column addresses ADDR_R/ADDR_C from the PIM controller 500. The interface 431 may output the memory command M_CMD, together with the bank selection signal BS and the row/column addresses ADDR_R/ADDR_C, to the memory bank 411. The interface 431 may output the MAC commands MAC_CMDs to the memory bank 411 and the MAC operator 420. In such a case, the interface 431 may output the bank selection signal BS and the row/column addresses ADDR_R/ADDR_C to the memory bank 411. The data I/O pad 432 of the PIM device 400 may function as a data communication terminal between a device external to the PIM device 400, the global buffer 412, and the MAC unit (which includes the memory bank 411 and the MAC operator 420) included in the PIM device 400. The external device to the PIM device 400 may correspond to the PIM controller 500 of the PIM system 1-2 or a host located outside the PIM system 1-2. Accordingly, data outputted from the host or the PIM controller 500 may be inputted into the PIM device 400 through the data I/O pad 432. In addition, data generated by the PIM device 400 may be transmitted to the external device to the PIM device 400 through the data I/O pad 432.

The PIM controller 500 may control operations of the PIM device 400. In an embodiment, the PIM controller 500 may control the PIM device 400 such that the PIM device 400 operates in the memory mode or the MAC mode. In the event that the PIM controller 500 controls the PIM device 500 such that the PIM device 400 operates in the memory mode, the PIM device 400 may perform a data read operation or a data write operation for the memory bank 411. In the event that the PIM controller 500 controls the PIM device 400 such that the PIM device 400 operates in the MAC mode, the PIM device 400 may perform the MAC arithmetic operation for the MAC operator 420. In the event that the PIM controller 500 controls the PIM device 400 such that the PIM device 400 operates in the MAC mode, the PIM device 400 may also perform the data read operation and the data write operation for the memory bank 411 and the global buffer 412 to execute the MAC arithmetic operation.

The PIM controller 500 may be configured to include the command queue logic 210, the scheduler 220, the memory command generator 230, a MAC command generator 540, and an address generator 550. The scheduler 220 may include the mode selector 221. The command queue logic 210 may receive the request REQ from an external device (e.g., a host of the PIM system 1-2) and store a command queue corresponding the request REQ in the command queue logic 210. The command queue stored in the command queue logic 210 may be transmitted to the memory command generator 230 or the MAC command generator 540 according to a sequence determined by the scheduler 220. The scheduler 220 may adjust a timing of the command queue when the command queue stored in the command queue logic 210 is outputted from the command queue logic 210. The scheduler 210 may include the mode selector 221 that generates a mode selection signal including information on whether command queue stored in the command queue logic 210 relates to the memory mode or the MAC mode. The memory command generator 230 may receive the command queue related to the memory mode of the PIM device 400 from the command queue logic 210 to generate and output the memory command M_CMD. The command queue logic 210, the scheduler 220, the mode selector 221, and the memory command generator 230 may have the same function as described with reference to FIG. 2.

The MAC command generator 540 may receive the command queue related to the MAC mode of the PIM device 400 from the command queue logic 210. The MAC command generator 540 may decode the command queue to generate and output the MAC commands MAC_CMDs. The MAC commands MAC_CMDs outputted from the MAC command generator 540 may be transmitted to the PIM device 400. The data read operation for the memory bank 411 of the PIM device 400 may be performed by the MAC commands MAC_CMDs outputted from the MAC command generator 540, and the MAC arithmetic operation of the MAC operator 420 may also be performed by the MAC commands MAC_CMDs outputted from the MAC command generator 540. The MAC commands MAC_CMDs and the MAC arithmetic operation of the PIM device 400 according to the MAC commands MAC_CMDs will be described in detail with reference to FIG. 21.

The address generator 550 may receive address information from the command queue logic 210. The address generator 550 may generate the bank selection signal BS for selecting a memory bank where, for example, the memory bank 411 represents multiple memory banks. The address generator 550 may transmit the bank selection signal BS to the PIM device 400. In addition, the address generator 550 may generate the row address ADDR_R and the column address ADDR_C for accessing a region (e.g., memory cells) in the memory bank 411 and may transmit the row address ADDR_R and the column address ADDR_C to the PIM device 400.

Figure 21:
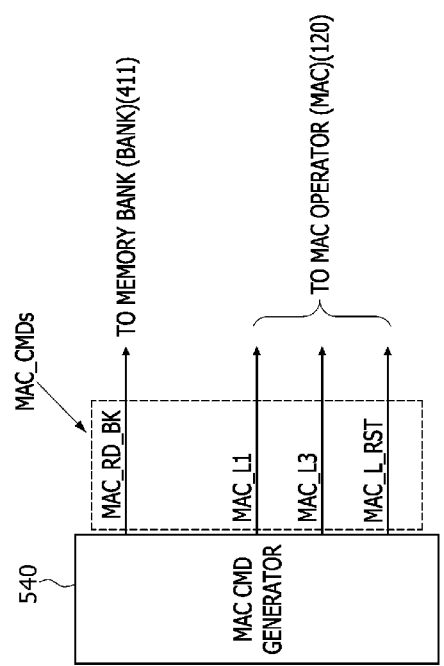
FIG. 21 illustrates MAC commands outputted from a MAC command generator of a PIM controller included in a PIM system according to a second embodiment of the present disclosure.

FIG. 21 illustrates the MAC commands MAC_CMDs outputted from the MAC command generator 540 included in the PIM system 1-2 according to the second embodiment of the present disclosure. As illustrated in FIG. 21, the MAC commands MAC_CMDs may include first to fourth MAC command signals. In an embodiment, the first MAC command signal may be a MAC read signal MAC_RD_BK, the second MAC command signal may be a MAC input latch signal MAC_L1, the third MAC command signal may be a MAC output latch signal MAC_L3, and the fourth MAC command signal may be a MAC latch reset signal MAC_L_RST.

The MAC read signal MAC_RD_BK may control an operation for reading the first data (e.g., the weight data) out of the memory bank 411 to transmit the first data to the MAC operator 420. The MAC input latch signal MAC_L1 may control an input latch operation of the weight data transmitted from the first memory bank 411 to the MAC operator 420. The MAC output latch signal MAC_L3 may control an output latch operation of the MAC result data generated by the MAC operator 420. And, the MAC latch reset signal MAC_L_RST may control an output operation of the MAC result data generated by the MAC operator 420 and a reset operation of an output latch included in the MAC operator 420.

The PIM system 1-2 according to the present embodiment may also be configured to perform the deterministic MAC arithmetic operation. Thus, the MAC commands MAC_CMDs transmitted from the PIM controller 500 to the PIM device 400 may be sequentially generated with fixed time intervals. Accordingly, the PIM controller 500 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially outputted from the PIM controller 500 with fixed time intervals corresponding to the fixed latencies.

Figure 22:
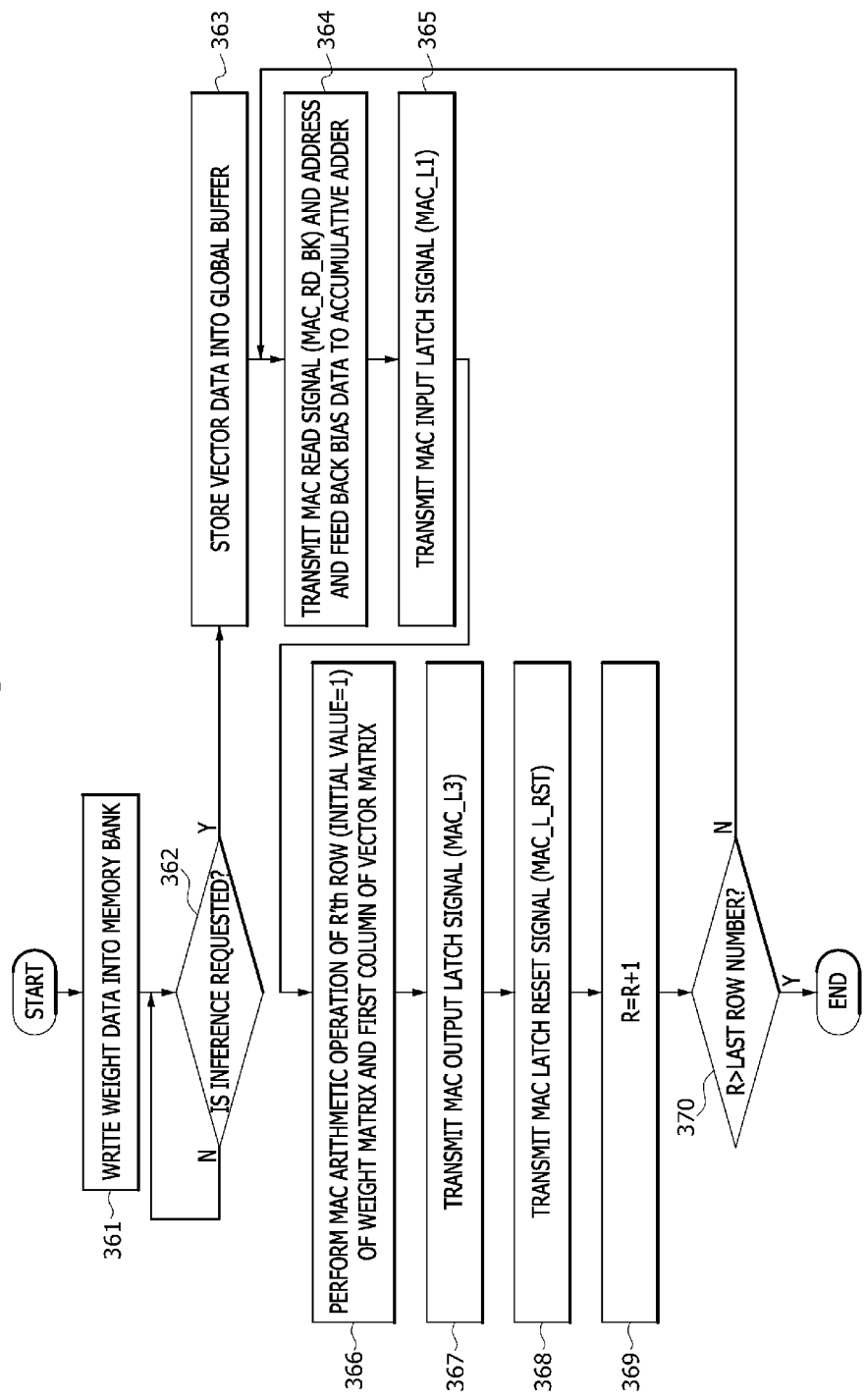
FIG. 22 is a flowchart illustrating processes of the MAC arithmetic operation illustrated in FIG. 5 in a PIM system according to a second embodiment of the present disclosure.

FIG. 22 is a flowchart illustrating processes of the MAC arithmetic operation described with reference to FIG. 5, which are performed in the PIM system 1-2 according to the second embodiment of the present disclosure. In addition, FIGS. 23 to 26 are block diagrams illustrating the processes of the MAC arithmetic operation illustrated in FIG. 5, which are performed in the PIM system 1-2 according to the second embodiment of the present disclosure. Referring to FIGS. 22 to 26, the first data (i.e., the weight data) may be written into the memory bank 411 at a step 361 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 5.

At a step 362, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 500 at the step 362, then the PIM controller 500 may write the vector data transmitted with the inference request signal into the global buffer 412 at a step 363. Accordingly, the vector data may be stored in the global buffer 412 of the PIM device 400.

Figure 23:
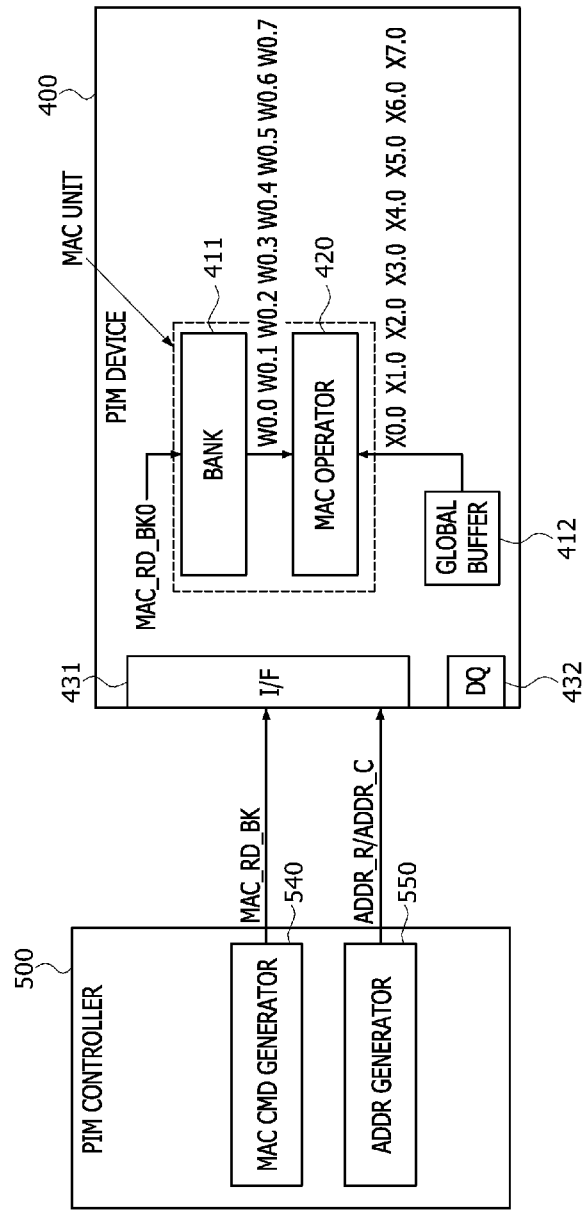
FIGS. 23 to 26 are block diagrams illustrating processes of the MAC arithmetic operation illustrated in FIG. 5 in a PIM system according to a second embodiment of the present disclosure.

At a step 364, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. Although not shown in the drawings, if a plurality of memory banks are disposed in the PIM device 400, the address generator 550 may transmit a bank selection signal for selecting the memory bank 411 among the plurality of memory banks as well as the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

Figure 24:
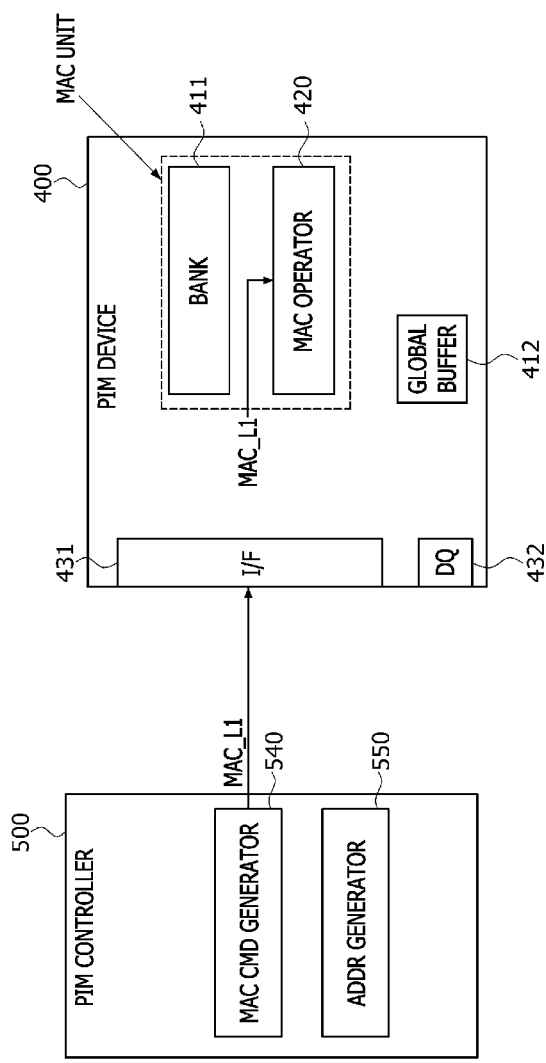

At a step 365, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 366, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, as described with reference to FIG. 4, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data from the multipliers 122-11 and may perform the adding calculation of the output data of the multipliers 122-11 to output the result data of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to the element MAC0.0 located at the first row of the '8×1' MAC result matrix having the eight elements of MAC0.0, . . . , and MAC7.0 illustrated in FIG. 5. The output data MAC0.0 of the addition logic circuit 122-2 may be inputted to the output latch 123-1 disposed in the data output circuit 123 of the MAC operator 420, as described with reference to FIG. 4.

Figure 25:
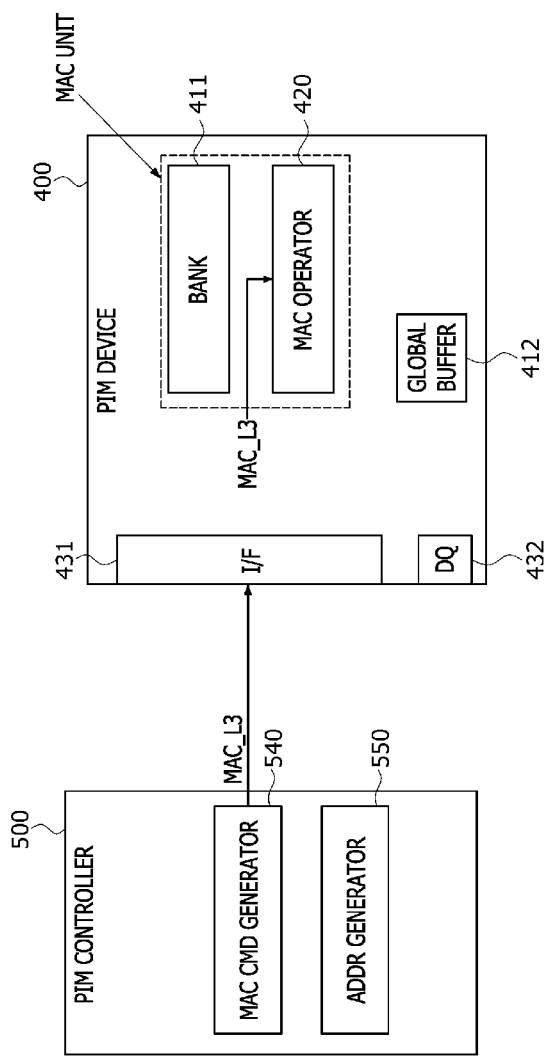

At a step 367, the MAC command generator 540 of the PIM controller 500 may generate and transmit the MAC output latch signal MAC_L3 to the PIM device 400, as illustrated in FIG. 25. The MAC output latch signal MAC_L3 may control the output latch operation of the MAC result data MAC0.0 performed by the MAC operator 420 of the PIM device 400. The MAC result data MAC0.0 transmitted from the MAC circuit 122 of the MAC operator 420 to the output latch 123-1 may be outputted from the output latch 123-1 by the output latch operation performed in synchronization with the MAC output latch signal MAC_L3, as described with reference to FIG. 4. The MAC result data MAC0.0 outputted from the output latch 123-1 may be inputted to the transfer gate 123-2 of the data output circuit 123.

Figure 26:
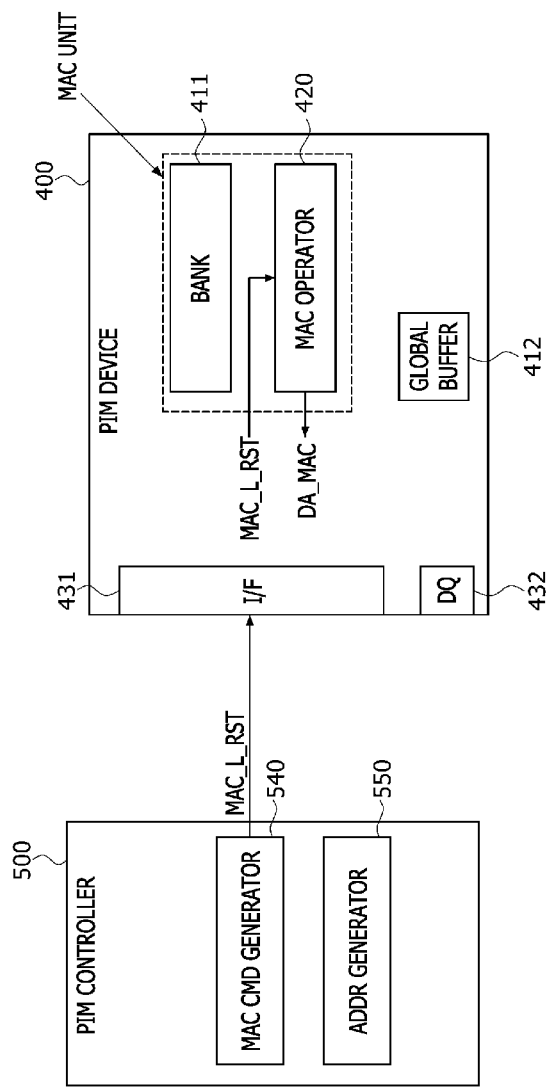

At a step 368, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the MAC result data MAC0.0 generated by the MAC operator 420 and a reset operation of the output latch 123-1 included in the MAC operator 420. As described with reference to FIG. 4, the transfer gate 123-2 receiving the MAC result data MAC0.0 from the output latch 123-1 of the MAC operator 420 may be synchronized with the MAC latch reset signal MAC_L_RST to output the MAC result data MAC0.0. In an embodiment, the MAC result data MAC0.0 outputted from the MAC operator 420 may be stored into the memory bank 411 through the BIO line in the PIM device 400.

At a step 369, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 369. At a step 370, whether the row number changed at the step 369 is greater than the row number of the last row (i.e., the eighth row) of the weight matrix may be determined. Because the row number of the weight matrix is changed to '2' at the step 370, a process of the MAC arithmetic operation may be fed back to the step 364.

If the process of the MAC arithmetic operation is fed back to the step 364 from the step 370, the same processes as described with reference to the steps 364 to 370 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 364 from the step 370, the processes from the step 364 to the step 370 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 369, the MAC arithmetic operation may terminate because the row number of '9' is greater than the last row number of '8' at the step 370.

Figure 27:
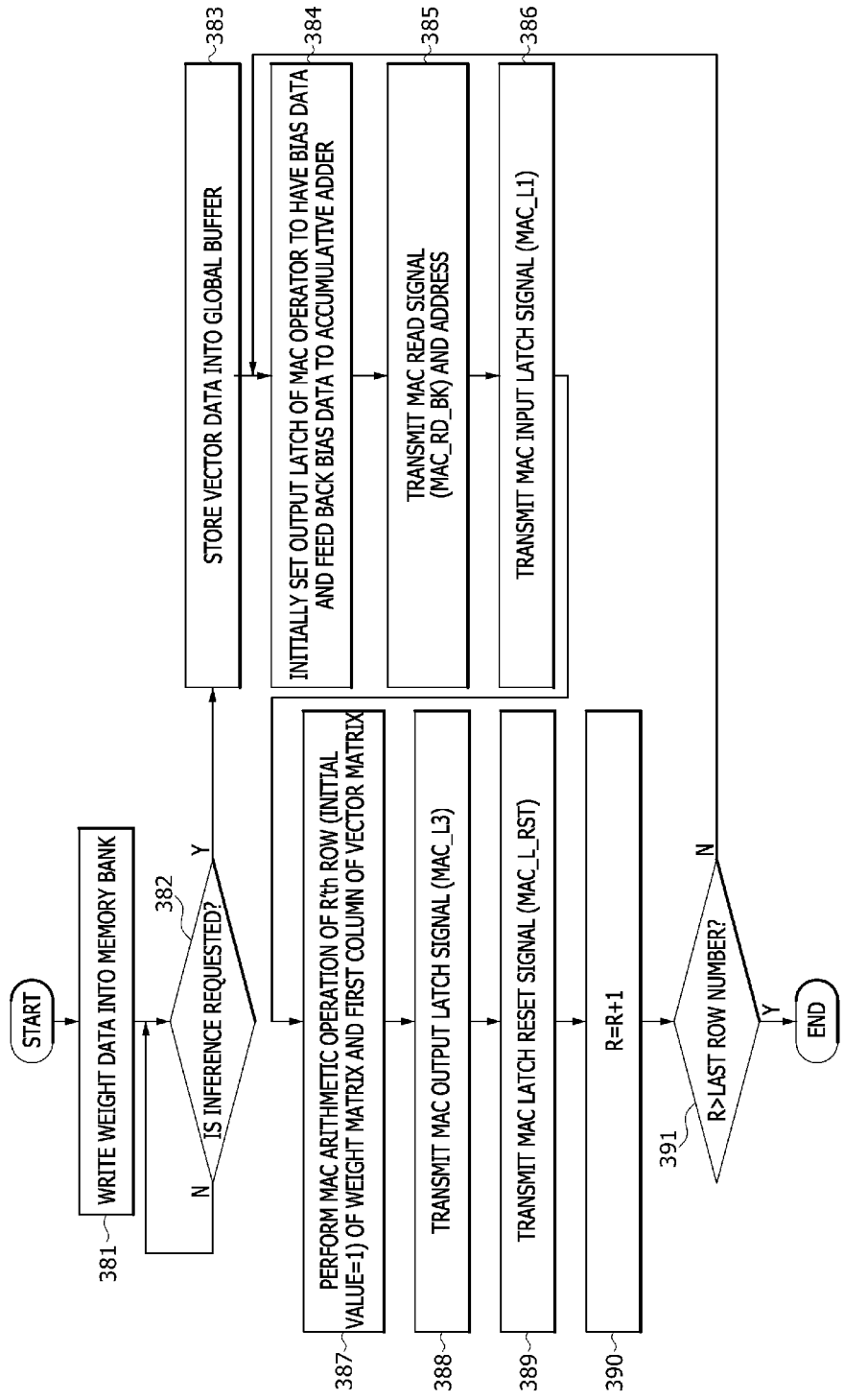
FIG. 27 is a flowchart illustrating processes of the MAC arithmetic operation illustrated in FIG. 14 in a PIM system according to a second embodiment of the present disclosure.

FIG. 27 is a flowchart illustrating processes of the MAC arithmetic operation described with reference to FIG. 14, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-1 illustrated in FIG. 16. Referring to FIGS. 20 and 27, the first data (i.e., the weight data) may be written into the memory bank 411 at a step 381 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 14.

At a step 382, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 500 at the step 382, then the PIM controller 500 may write the vector data transmitted with the inference request signal into the global buffer 412 at a step 383. Accordingly, the vector data may be stored in the global buffer 412 of the PIM device 400.

At a step 384, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 14. That is, as illustrated in FIG. 16, the output latch 123-1 of the data output circuit 123-A included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 385, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 386, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 387, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., MAC result data) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 388, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the transfer gate 123-2 of the data output circuit 123-A.

At a step 389, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the biased result data Y0.0 generated by the MAC operator 420 and a reset operation of the output latch 123-1 included in the MAC operator 420. The transfer gate 123-2 receiving the biased result data Y0.0 from the output latch 123-1 of the MAC operator 420 may be synchronized with the MAC latch reset signal MAC_L_RST to output the biased result data Y0.0. In an embodiment, the biased result data Y0.0 outputted from the MAC operator 120 may be stored into the memory bank 411 through the BIO line in the PIM device 400.

At a step 390, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 390. At a step 391, whether the row number changed at the step 390 is greater than the row number of the last row (i.e., the eighth row) of the weight matrix may be determined. Because the row number of the weight matrix is changed to '2' at the step 390, a process of the MAC arithmetic operation may be fed back to the step 384.

If the process of the MAC arithmetic operation is fed back to the step 384 at the step 391, the same processes as described with reference to the steps 384 to 391 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 384 at the step 391, then the processes from the step 384 to the step 390 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 390, then the MAC arithmetic operation may terminate because the row number of '9' is greater than the last row number of '8' at the step 391.

Figure 28:
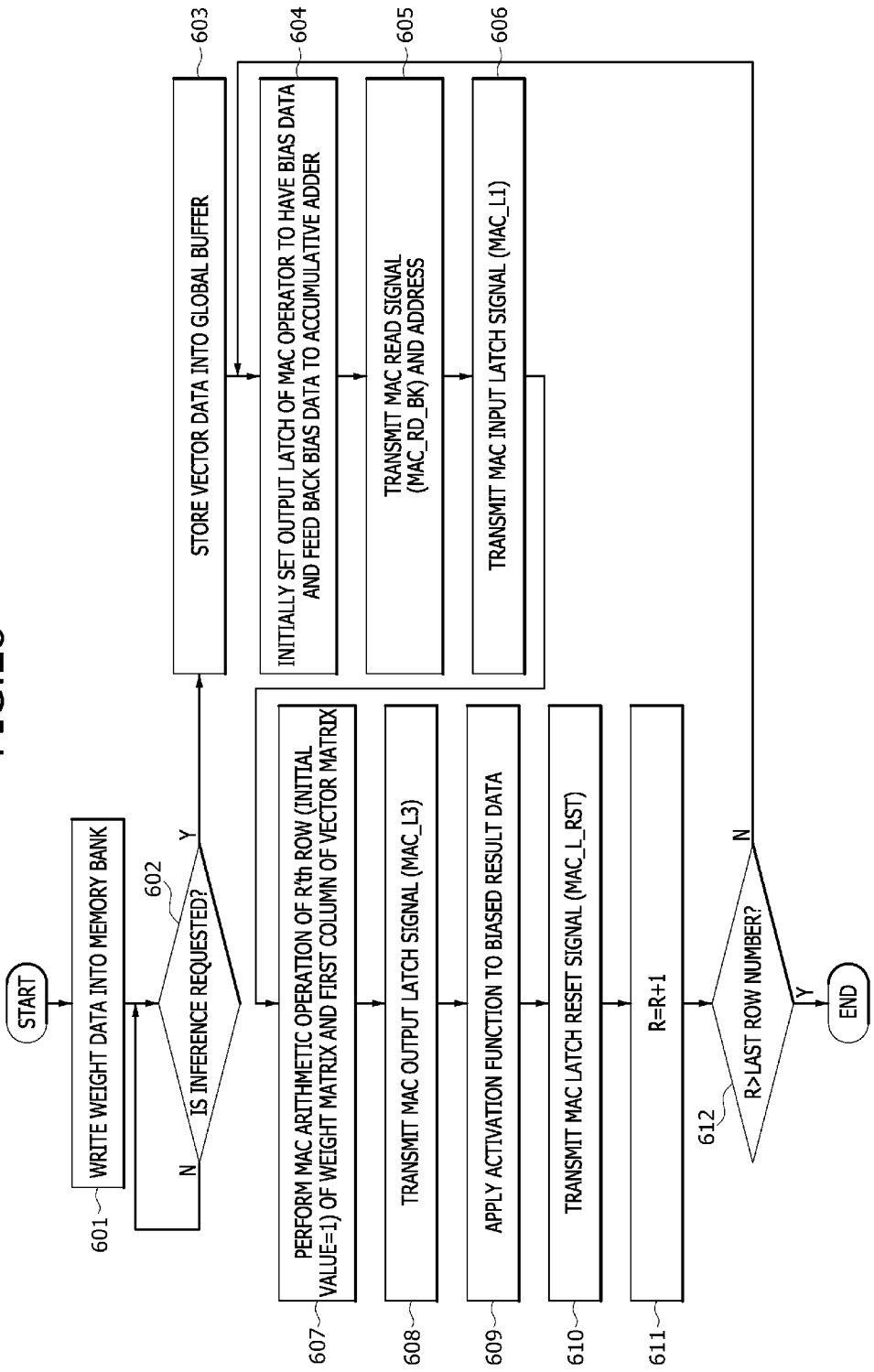
FIG. 28 is a flowchart illustrating processes of the MAC arithmetic operation illustrated in FIG. 17 in a PIM system according to a second embodiment of the present disclosure.

FIG. 28 is a flowchart illustrating processes of the MAC arithmetic operation described with reference to FIG. 17, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-2 illustrated in FIG. 19. Referring to FIGS. 19 and 28, the first data (i.e., the weight data) may be written into the memory bank 411 at a step 601 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 17.

At a step 602, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 500 at the step 602, then the PIM controller 500 may write the vector data transmitted with the inference request signal into the global buffer 412 at a step 603. Accordingly, the vector data may be stored in the global buffer 412 of the PIM device 400.

At a step 604, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 17. That is, as described with reference to FIG. 19, the output latch 123-1 of the data output circuit 123-B included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 outputted from the output latch 123-1 may be inputted to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 outputted from the adder 122-21C disposed at the last stage of the addition logic circuit 122-2 to the bias data B0.0 which is fed back from the output latch 123-1 to generate the biased result data Y0.0 and may output the biased result data Y0.0 to the output latch 123-1. The biased result data Y0.0 may be outputted from the output latch 123-1 in synchronization with the MAC output latch signal MAC_L3 transmitted in a subsequent process.

At a step 605, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK inputted to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK outputted from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 606, the MAC command generator 540 of the PIM controller 500 may generate and transmit the MAC input latch signal MAC_L1 to the PIM device 400, as described with reference to FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be inputted to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be inputted to the first to eighth multipliers 122-11, respectively, and the elements X0.0, . . . , and X7.0 in the first column of the vector matrix may also be inputted to the first to eighth multipliers 122-11, respectively.

At a step 607, the MAC circuit 122 of the MAC operator 420 may perform the MAC arithmetic operation of an $R^{th}$ row of the weight matrix and the first column of the vector matrix, which are inputted to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be inputted to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., the MAC result data MAC0.0) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be inputted to the output latch 123-1 disposed in the data output circuit 123-A of the MAC operator 420.

At a step 608, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 outputted from the output latch 123-1 may be inputted to the activation function logic circuit 123-5, which is illustrated in FIG. 19. At a step 610, the activation function logic circuit 123-5 may apply an activation function to the biased result data Y0.0 to generate a final output value, and the final output value may be inputted to the transfer gate (123-2 of FIG. 4).

At a step 610, the MAC command generator 540 of the PIM controller 500 may generate and transmit the MAC latch reset signal MAC_L_RST to the PIM device 400, as described with reference to FIG. 26. The MAC latch reset signal MAC_L_RST may control an output operation of the final output value generated by the MAC operator 420 and a reset operation of the output latch 123-1 included in the MAC operator 420. The transfer gate 123-2 receiving the final output value from the activation function logic circuit 123-5 of the data output circuit 123-B included in the MAC operator 420 may be synchronized with the MAC latch reset signal MAC_L_RST to output the final output value. In an embodiment, the final output value outputted from the MAC operator 420 may be stored into the memory bank 411 through the BIO line in the PIM device 400.

At a step 611, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 611. At a step 612, whether the row number changed at the step 611 is greater than the row number of the last row (i.e., the eighth row) of the weight matrix may be determined. Because the row number of the weight matrix is changed to '2' at the step 611, a process of the MAC arithmetic operation may be fed back to the step 604.

If the process of the MAC arithmetic operation is fed back to the step 604 from the step 612, the same processes as described with reference to the steps 604 to 612 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix to generate the MAC result data (corresponding to the element MAC1.0 located in the second row of the MAC result matrix) and the bias data (corresponding to the element B1.0 located in the second row of the bias matrix). If the process of the MAC arithmetic operation is fed back to the step 604 from the step 612, the processes from the step 604 to the step 612 may be iteratively performed until the MAC arithmetic operation is performed for all of the rows (i.e., first to eighth rows) of the weight matrix with the vector matrix. If the MAC arithmetic operation for the eighth row of the weight matrix terminates and the row number of the weight matrix changes from '8' to '9' at the step 611, the MAC arithmetic operation may terminate because the row number of '9' is greater than the last row number of '8' at the step 612.

Figure 29:
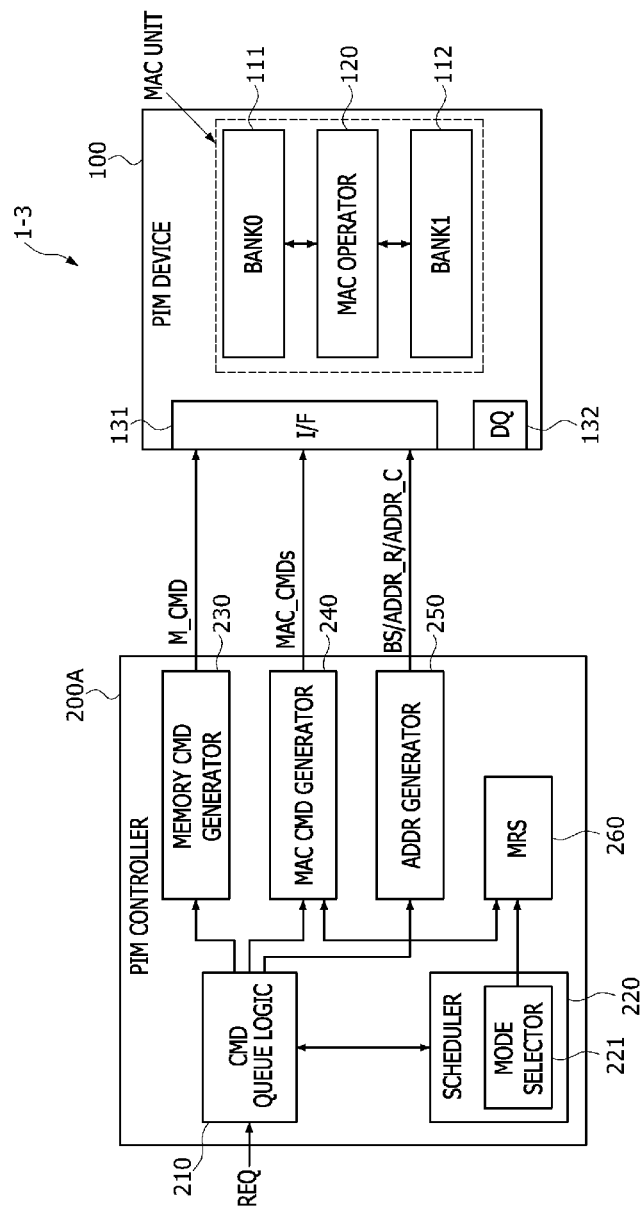
FIG. 29 is a block diagram illustrating a PIM system according to yet another embodiment of the present disclosure.

FIG. 29 is a block diagram illustrating a PIM system 1-3 according to a third embodiment of the present disclosure. As illustrated in FIG. 29, the PIM system 1-3 may have substantially the same configuration as the PIM system 1-1 illustrated in FIG. 2 except that a PIM controller 200A of the PIM system 1-3 further includes a mode register set (MRS) 260 as compared with the PIM controller 200 of the PIM system 1-1. Thus, the same explanation as described with reference to FIG. 2 will be omitted hereinafter. The mode register set 260 in the PIM controller 200A may receive an MRS signal instructing arrangement of various signals necessary for the MAC arithmetic operation of the PIM system 1-3. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 240. For an embodiment, the MRS 260 represents a MRS circuit.

In an embodiment, the MRS signal may include timing information on when the MAC commands MAC_CMDs are generated. In such a case, the deterministic operation of the PIM system 1-3 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the second memory bank 112 of the PIM device 100 by the inference request signal transmitted from an external device to the PIM controller 200A. Alternatively, the generation of the MRS signal in the MRS 260 may be executed after the vector data are stored in the second memory bank 112 of the PIM device 100 by the inference request signal transmitted from an external device to the PIM controller 200A.

Figure 30:
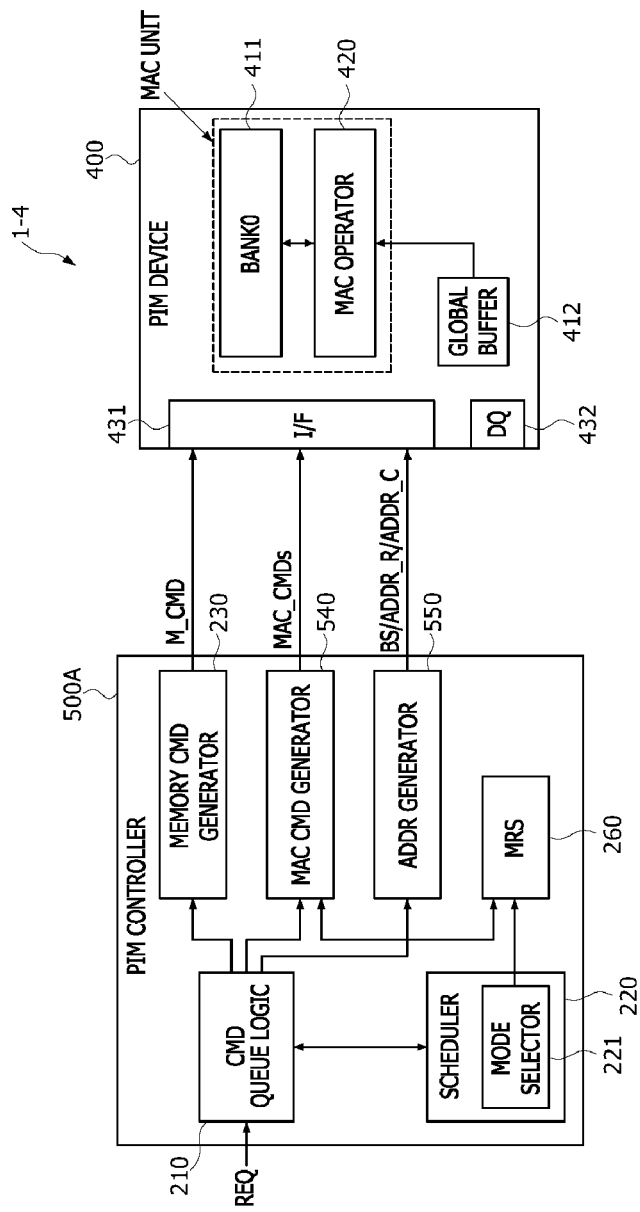
FIG. 30 is a block diagram illustrating a PIM system according to still another embodiment of the present disclosure.

FIG. 30 is a block diagram illustrating a PIM system 1-4 according to a fourth embodiment of the present disclosure. As illustrated in FIG. 30, the PIM system 1-4 may have substantially the same configuration as the PIM system 1-2 illustrated in FIG. 20 except that a PIM controller 500A of the PIM system 1-4 further includes the mode register set (MRS) 260 as compared with the PIM controller 500 of the PIM system 1-2. Thus, the same explanation as described with reference to FIG. 20 will be omitted hereinafter. The mode register set 260 in the PIM controller 500A may receive an MRS signal instructing arrangement of various signals necessary for the MAC arithmetic operation of the PIM system 1-4. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 540.

In an embodiment, the MRS signal may include timing information on when the MAC commands MAC_CMDs are generated. In such a case, the deterministic operation of the PIM system 1-4 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the global buffer 412 of the PIM device 400 by the inference request signal transmitted from an external device to the PIM controller 500A. Alternatively, the generation of the MRS signal in the MRS 260 may be executed after the vector data are stored in the global buffer 412 of the PIM device 400 by the inference request signal transmitted from an external device to the PIM controller 500A.

Figure 31:
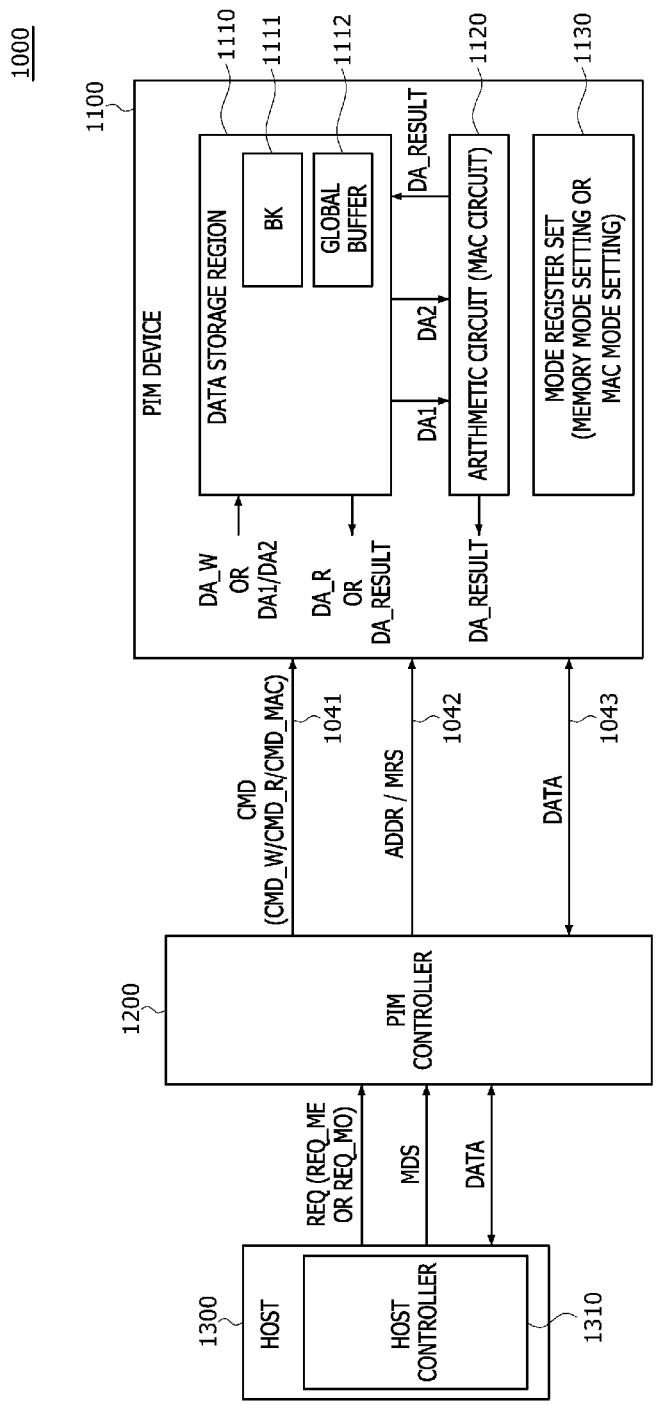
FIG. 31 is a block diagram illustrating a PIM system according to yet still another embodiment of the present disclosure.

FIG. 31 is a block diagram illustrating a PIM system 1000 according to yet still another embodiment of the present disclosure. Referring to FIG. 31, the PIM system 1000 may include a PIM device 1100, a PIM controller 1200, and a host 1300. The PIM device 1100 may function as a general memory device and an arithmetic device. Thus, the PIM device 1100 may perform a memory access operation (i.e., a write operation for accessing to a bank constituting a data storage region 1110 of the PIM device 1100 to store write data provided by an external device into the bank and a read operation for transmitting read data stored in the bank to the external device). The PIM device 1100 may also perform an arithmetic operation for arithmetic data. The PIM device 1100 may also perform a write operation for the arithmetic data and a read operation for arithmetic result data. The PIM controller 1200 may be configured to control operations of the PIM device 1100. The control operation performed by the PIM controller 1200 may be executed in response to a request REQ outputted from the external device, for example, the host 1300. The PIM controller 1200 may receive data DATA from the PIM device 1100 or output the data DATA to the PIM device 1100. In addition, the PIM controller 1200 may also receive the data DATA from the host 1300 or output the data DATA to the host 1300. The host 1300 may be configured to transmit the request REQ for a specific operation of the PIM device 1100 to the PIM controller 1200 according to a requirement or programs provided by users. The host 1300 may include a host controller 1310. Operations of the host 1300 will not be distinguished from operations of the host controller 1310 hereinafter.

Specifically, the PIM device 1100 may include the data storage region 1110, an arithmetic circuit 1120 functioning as a MAC circuit, and a mode register set 1130. The data storage region 1110 may be configured to store data. It may be assumed that the data storage region 1110 includes a memory bank (BK) 1111 and a global buffer 1112. Although the present embodiment illustrates in conjunction with a case that the memory bank 1111 is a single memory bank, the present embodiment is a merely an example of the present disclosure. Accordingly, in some other embodiments, the data storage region 1110 may include a plurality of memory banks. The PIM device 1100 may store write data DA_W provided by an external device (e.g., the PIM controller 1200) into the memory bank 1111 of the data storage region 1110. The PIM device 1100 may store first arithmetic data DA1 and second arithmetic data DA2 provided by the PIM controller 1200 into respective ones of the memory bank 1111 and the global buffer 1112 of the data storage region 1110. The PIM device 1100 may transmit read data DA_R or arithmetic result data DA_RESULT stored in the memory bank 1111 of the data storage region 1110 to the PIM controller 1200. In addition, the PIM device 1100 may transmit the first arithmetic data DA1 and the second arithmetic data DA2, which are stored in respective ones of the memory bank 1111 and the global buffer 1112 of the data storage region 1110, to the arithmetic circuit 1120.

The arithmetic circuit 1120 may receive the first arithmetic data DA1 and the second arithmetic data DA2 from respective ones of the memory bank 1111 and the global buffer 1112 included in the data storage region 1110 and may perform an arithmetic operation for the first arithmetic data DA1 and the second arithmetic data DA2. The PIM device 1100 may transmit the arithmetic result data DA_RESULT generated by the arithmetic circuit 1120 to the PIM controller 1200 or the memory bank 1111 of the data storage region 1110. Hereinafter, it may be assumed that the arithmetic circuit 1120 is a MAC circuit performing a multiplying and accumulating operation (MAC operation). However, the assumption that the arithmetic circuit 1120 is the MAC circuit may be merely an example of the present disclosure. Thus, in some other embodiments, the arithmetic circuit 1120 may be configured to perform an arithmetic operation which is different from the MAC operation. Hereinafter, the term "MAC" may be construed as "arithmetic". The arithmetic circuit 1120 may include a plurality of multipliers and a plurality of adders for performing the MAC operation (also, referred to as a MAC arithmetic operation) for the first arithmetic data DA1 and the second arithmetic data DA2 which are outputted from the data storage region 1110.

The mode register set 1130 may be configured to set various set values which are related to the memory access operation and the MAC operation of the PIM device 1100. The memory access operation and the MAC operation of the PIM device 1100 may be performed based on the set values which are set by the mode register set 1130. The mode register set 1130 may set an operation mode of the PIM device 1100 as a memory mode or a MAC mode. Hereinafter, an operation performed by the PIM device 1100 in the memory mode set by the mode register set 1130 may be defined as a "memory mode operation". In addition, an operation performed by the PIM device 1100 in the MAC mode set by the mode register set 1130 may be defined as a "MAC mode operation". In the memory mode, the mode register set 1130 may have various set values related to execution of the memory mode operation of the PIM device 1100. In the MAC mode, the mode register set 1130 may have various set values related to execution of the MAC mode operation of the PIM device 1100. Thus, in order that the memory mode operation of the PIM device 1100 is appropriately performed, it may be necessary that the memory mode is set by the mode register set 1130. In addition, in order that the MAC mode operation of the PIM device 1100 is appropriately performed, it may be necessary that the MAC mode is set by the mode register set 1130. The mode setting of the mode register set 1130 may be executed by a mode setting signal MRS outputted from the PIM controller 1200.

The PIM controller 1200 may transmit a command CMD and an address ADDR to the PIM device 1100 to control an operation of the PIM device 1100. The PIM controller 1200 may transmit the mode setting signal MRS for changing a mode set of the mode register set 1130 of the PIM device 1100 to the PIM device 1100. The PIM controller 1200 may transmit the data DATA to the PIM device 1100 or receive the data DATA from the PIM device 1100. The command CMD may be transmitted through a command transmission line 1041 coupled between PIM device 1100 and the PIM controller 1200. The address ADDR and the mode setting signal MRS may be transmitted through an address transmission line 1042 coupled between PIM device 1100 and the PIM controller 1200. Although the command transmission line 1041 and the address transmission line 1042 are separated from each other in the present embodiment, the present embodiment may be merely an example provided for the purpose of ease and convenience in explanation. Thus, in some other embodiments, the command CMD, the address ADDR, and the mode setting signal MRS may be transmitted through a single command/address transmission line. The data DATA may be transmitted through a data transmission line 1043 coupled between the PIM device 1100 and the PIM controller 1200.

The command CMD transmitted from the PIM controller 1200 to the PIM device 1100 may control the memory access operation or the MAC operation of the PIM device 1100. The command CMD may include a write command CMD_W controlling the write operation of the PIM device 1100, a read command CMD_R controlling the read operation of the PIM device 1100, or a MAC command CMD_MAC controlling the MAC arithmetic operation of the arithmetic circuit 1120 of the PIM device 1100. The write operation performed by the PIM device 1100 based on the write command CMD_W may be executed in the memory mode or the MAC mode according to the mode setting status of the mode register set 1130. The read operation performed by the PIM device 1100 based on the read command CMD_R may also be executed in the memory mode or the MAC mode according to the mode setting status of the mode register set 1130. In contrast, the MAC arithmetic operation performed by the PIM device 1100 based on the MAC command CMD_MAC may be executed in the MAC mode which is set according to the MAC mode setting status of the mode register set 1130. The operations performed by the PIM device 1100 based on the command CMD will be described in more detail hereinafter.

The address ADDR transmitted from the PIM controller 1200 to the PIM device 1100 may designate specific locations in the memory bank 1111 and the global buffer 1112 included in the data storage region 1110 of the PIM device 1100. For example, the address ADDR transmitted with the write command CMD_W may designate locations in the memory bank 1111 and the global buffer 1112, in which the write data transmitted from the PIM controller 1200 to the PIM device 1100 are stored. In addition, the address ADDR transmitted with the read command CMD_R may designate locations in the memory bank 1111 and the global buffer 1112, in which the read data are stored. Although not shown in the drawings, the address ADDR may include a bank address, a row address, and a column address.

The mode setting signal MRS transmitted from the PIM controller 1200 to the PIM device 1100 may control the mode setting operation of the mode register set 1130. That is, the mode register set 1130 of the PIM device 1100 may set the operation mode of the PIM device 1100 as the memory mode or the MAC mode according to the mode setting signal MRS transmitted from the PIM controller 1200 to the PIM device 1100. The command CMD transmitted from the PIM controller 1200 to the PIM device 1100 may be a command for the memory access operation or the MAC operation of the PIM device 1100. The PIM controller 1200 may transmit the mode setting signal MRS to the PIM device 1100 to change the mode setting status of the mode register set 1130 before the command CMD is transmitted from the PIM controller 1200 to the PIM device 1100 according to the command CMD.

The memory access operation of the PIM device 1100 may include the write operation and the read operation that access the memory bank 1111 included in the data storage region 1110. Thus, the memory access operation is performed while the mode register set 1130 sets the operation mode of the PIM device 1100 as the memory mode. The PIM controller 1200 may transmit the mode setting signal MRS for changing the MAC mode into the memory mode to the PIM device 1100 to change the operation mode of the PIM device 1100 into the memory mode when the operation mode of the PIM device 1100 is set as the MAC mode by the mode register set 1130 before the PIM controller 1200 transmits the command CMD for controlling the memory access operation of the PIM device 1100 to the PIM device 1100. If the operation mode of the PIM device 1100 is set as the memory mode by the mode register set 1130 before the PIM controller 1200 transmits the command CMD for controlling the memory access operation of the PIM device 1100 to the PIM device 1100, the PIM controller 1200 may transmit the command CMD to the PIM device 1100 without transmitting the mode setting signal MRS to the PIM device 1100.

The MAC operation of the PIM device 1100 may be performed in the memory mode or in the MAC mode. The PIM controller 1200 may determine whether the MAC operation of the PIM device 1100 has to be performed in the memory mode or in the MAC mode, based on a mode definition signal MDS transmitted from the host 1300 to the PIM controller 1200. In either case, the PIM controller 1200 may transmit the command CMD to the PIM device 1100 without transmitting the mode setting signal MRS to the PIM device 1100 if the mode setting status of the mode register set 1130 is consistent with a mode of the command CMD to be transmitted to the PIM device 1100 before the PIM controller 1200 transmits the command CMD for controlling the MAC operation of the PIM device 1100 to the PIM device 1100. In contrast, if the mode setting status of the mode register set 1130 is inconsistent with a mode of the command CMD to be transmitted to the PIM device 1100 before the PIM controller 1200 transmits the command CMD for controlling the MAC operation of the PIM device 1100 to the PIM device 1100, the PIM controller 1200 may transmit the mode setting signal MRS to the PIM device 1100 to change the mode setting status of the mode register set 1130.

The host 1300 may transmit the request REQ requesting a specific operation of the PIM device 1100 and the mode definition signal MDS to the PIM controller 1200. The PIM controller 1200 may transmit the command CMD corresponding to the request REQ outputted from the host 1300 and the address ADDR to the PIM device 1100. The mode definition signal MDS may include information on whether the request REQ transmitted from the host 1300 to the PIM controller 1200 requests the memory mode operation or the MAC mode operation of the PIM device 1100. The PIM controller 1200 may transmit the mode setting signal MRS controlling the mode setting status of the mode register set 1130 to the PIM device 1100 in response to the mode definition signal MDS outputted from the host 1300.

The request REQ transmitted from the host 1300 to the PIM controller 1200 may be any one of a memory access operation request REQ_ME and a MAC operation request REQ_MO. The memory access operation request REQ_ME may be defined as a request instructing an operation performed by the PIM device 1100 when the PIM device 1100 is used as a memory device. Thus, the memory access operation request REQ_ME may instruct the PIM controller 1200 to access to the bank 1111 of the data storage region 1110 included in the PIM device 1100 and to receive the data from the PIM device 1100 or to store the data into the PIM device 1100. The memory access operation request REQ_ME may include a memory write request instructing the write operation of the PIM device 1100 and a memory read request instructing the read operation of the PIM device 1100. The MAC operation request REQ_MO may be defined as a request instructing execution of an operation related to the MAC arithmetic operation of the PIM device 1100. The MAC operation request REQ_MO may include a MAC write request instructing an arithmetic data storage operation of the PIM device 1100, a MAC request instructing the MAC arithmetic operation of the PIM device 1100, and a MAC read request instructing the read operation for MAC result data. The host 1300 may transmit the request REQ with the mode definition signal MDS defining the operation mode of the PIM device 1100 to the PIM controller 1200.

In general, the PIM controller 1200 may control the mode setting status of the mode register set 1130 included in the PIM device 1100 in response to a mode change instruction outputted from the host 1300. When it is necessary to change the operation mode of the PIM device 1100, the host 1300 has to transmit the mode change instruction to the PIM controller 1200 before the request REQ is transmitted from the host 1300 to the PIM controller 1200. In such a case, the PIM controller 1200 may require an extra interface for receiving the mode change instruction from the host 1300 in addition to an interface for receiving the request REQ from the host 1300. However, according to the present embodiment, the host 1300 may transmit the mode definition signal MDS with the request REQ to the PIM controller 1200. Thus, the PIM controller 1200 may control the operation mode of the PIM device 1100 using the mode definition signal MDS even without receiving the mode change instruction from the host 1300. That is, in the PIM system 1000 according to the present embodiment, the PIM controller 1200 does not require the extra interface for receiving the mode change instruction from the host 1300 in addition to the interface for receiving the request REQ from the host 1300.

As described above, the memory access operation of the PIM device 1100 has to be performed when the mode register set 1130 is set to provide the memory mode. In contrast, the MAC operation of the PIM device 1100 may be performed even when the mode register set 1130 is set to provide the memory mode as well as the MAC mode. For example, a certain portion of the MAC operation of the PIM device 1100 may be performed in the same way as the memory access operation. That is, the certain portion of the MAC operation may be performed when the mode register set 1130 is set to provide the memory mode. The mode setting status of the mode register set 1130 for performing the MAC operation of the PIM device 1100 may become different according to a configuration of the data storage region 1110 included in the PIM device 1100 and an operation of the arithmetic circuit 1120. Various mode setting statuses of the mode register set 1130 for performing the memory access operation and the MAC operation of the PIM device 1100 will be described in more detail hereinafter.

Figure 32:
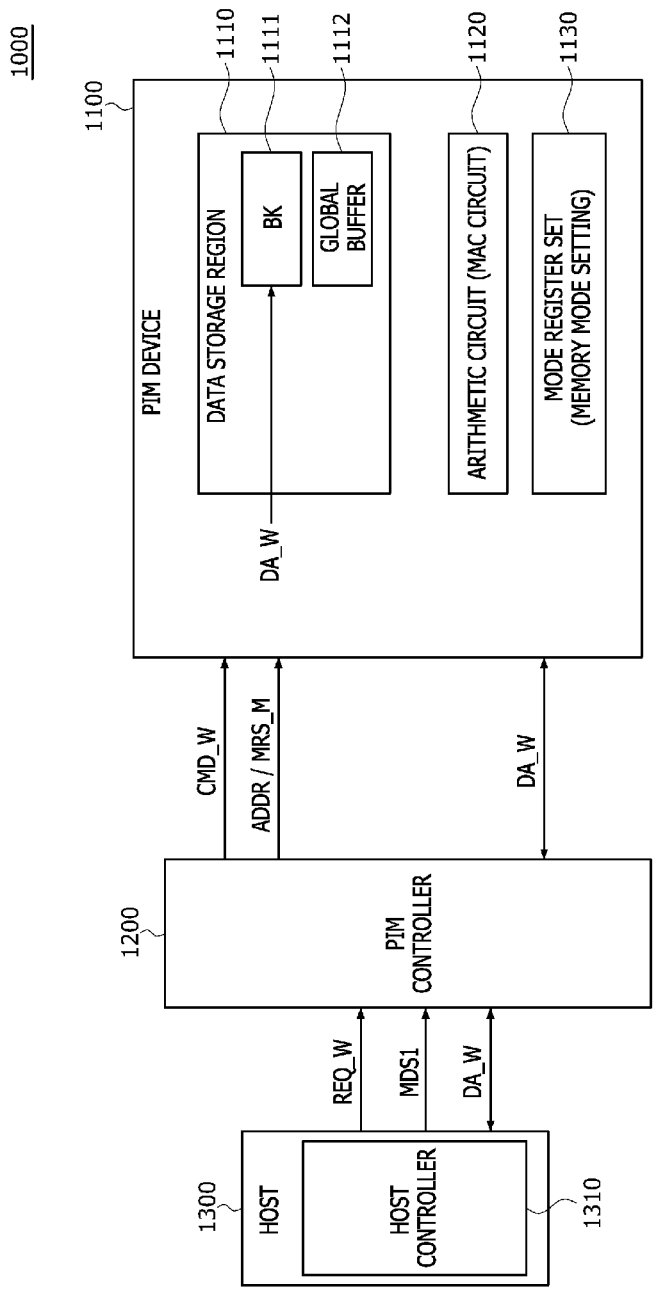
FIG. 32 illustrates an example of a memory write operation of a memory access operation of a PIM device included in the PIM system illustrated in FIG. 31.

FIG. 32 illustrates an example of the memory write operation of the memory access operation of the PIM device 1100 included in the PIM system 1000 illustrated in FIG. 31. In FIG. 32, the same reference numerals or the same reference symbols as used in FIG. 31 denote the same elements. Referring to FIG. 32, the memory write operation of the PIM device 1100 may correspond to an operation for storing the write data DA_W outputted from the PIM controller 1200 into the bank 1111 of the data storage region 1110. The memory write operation of the PIM device 1100 may correspond to an operation (i.e., the memory access operation) performed when the PIM device 1100 functions as a memory device. Thus, the memory write operation of the PIM device 1100 may belong to the memory mode operation. Accordingly, the memory write operation of the PIM device 1100 is performed in the memory mode which is set by the mode register set 1130 of the PIM device 1100.

In order to perform the memory write operation of the PIM device 1100, the host 1300 may transmit a write request REQ_W and a first mode definition signal MDS1 to the PIM controller 1200. The host 1300 may transmit the write data DA_W to the PIM controller 1200. The PIM controller 1200 may regard the write request REQ_W outputted from the host 1300 as a request for the memory write operation of the memory access operation based on the first mode definition signal MDS1. The PIM controller 1200 may generate the write command CMD_W and the address ADDR that correspond to the write request REQ_W. The PIM controller 1200 may determine whether the mode register set 1130 of the PIM device 1100 is set to provide the memory mode before transmitting the write command CMD_W to the PIM device 1100.

The PIM controller 1200 may identify a current operation mode of the PIM device 1100 based on the mode setting signal MRS transmitted to the PIM device 1100 most recently. When the mode register set 1130 of the PIM device 1100 is set to provide the memory mode, the PIM controller 1200 may transmit the write command CMD_W to the PIM device 1100 without transmitting the mode setting signal MRS to the PIM device 1100. In such a case, the PIM device 1100 may perform the memory write operation based on the write command CMD_W without changing the operation mode. When the mode register set 1130 of the PIM device 1100 is set to provide the MAC mode, the PIM controller 1200 may transmit the write command CMD_W to the PIM device 1100 after transmitting a memory mode setting signal MRS_M corresponding to the mode setting signal MRS to the PIM device 1100. The PIM device 1100 may control the mode register set 1130 in response to the memory mode setting signal MRS_M outputted from the PIM controller 1200 such that the mode register set 1130 is set to provide the memory mode. Subsequently, the PIM device 1100 may store the write data DA_W into the bank 1111 in response to the write command CMD_W outputted from the PIM controller 1200.

Figure 33:
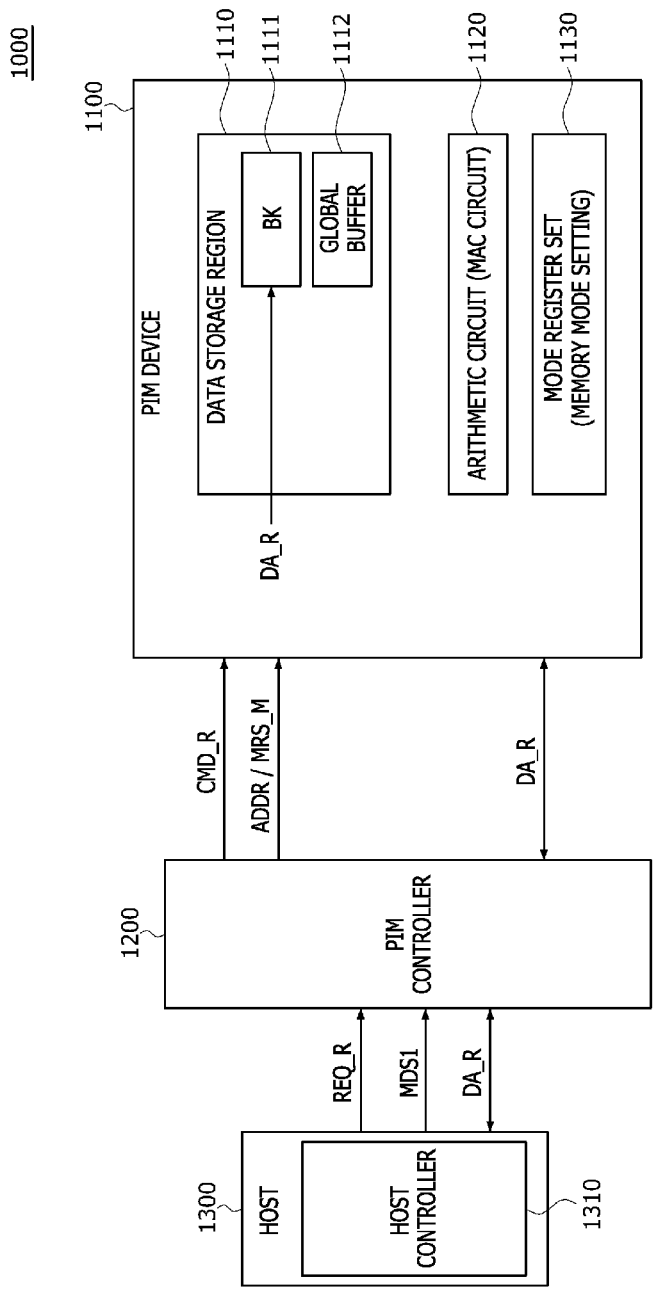
FIG. 33 illustrates an example of a memory read operation of a memory access operation of a PIM device included in the PIM system illustrated in FIG. 31.

FIG. 33 illustrates an example of the memory read operation of the memory access operation of the PIM device 1100 included in the PIM system 1000 illustrated in FIG. 31. In FIG. 33, the same reference numerals or the same reference symbols as used in FIG. 31 denote the same elements. Referring to FIG. 33, the memory read operation of the PIM device 1100 may correspond to an operation for transmitting the read data DA_R stored in the bank 1111 of the data storage region 1110 of the PIM device 1100 to the PIM controller 1200. The memory read operation of the PIM device 1100 may correspond to an operation (i.e., the memory access operation) performed when the PIM device 1100 functions as a memory device. Thus, the memory read operation of the PIM device 1100 may also belong to the memory mode operation. Accordingly, the memory read operation of the PIM device 1100 is performed in the memory mode which is set by the mode register set 1130 of the PIM device 1100.

In order to perform the memory read operation of the PIM device 1100, the host 1300 may transmit a read request REQ_R and the first mode definition signal MDS1 to the PIM controller 1200. The PIM controller 1200 may regard the read request REQ_R outputted from the host 1300 as a request for the memory read operation of the memory access operation based on the first mode definition signal MDS1. The PIM controller 1200 may generate the read command CMD_R and the address ADDR that correspond to the read request REQ_R. The PIM controller 1200 may determine whether the mode register set 1130 of the PIM device 1100 is set to provide the memory mode before transmitting the read command CMD_R to the PIM device 1100.

When the mode register set 1130 of the PIM device 1100 is set to provide the memory mode, the PIM controller 1200 may transmit the read command CMD_R to the PIM device 1100 without transmitting the mode setting signal MRS to the PIM device 1100. In such a case, the PIM device 1100 may perform the memory read operation based on the read command CMD_R without changing the operation mode. When the mode register set 1130 of the PIM device 1100 is set to provide the MAC mode, the PIM controller 1200 may transmit the read command CMD_R to the PIM device 1100 after transmitting the memory mode setting signal MRS_M corresponding to the mode setting signal MRS to the PIM device 1100. The PIM device 1100 may control the mode register set 1130 in response to the memory mode setting signal MRS_M outputted from the PIM controller 1200 such that the mode register set 1130 is set to provide the memory mode. Subsequently, the PIM device 1100 may transmit the read data DA_R stored in the bank 1111 to the PIM controller 1200 in response to the read command CMD_R outputted from the PIM controller 1200. The PIM controller 1200 may transmit the read data DA_R outputted from the PIM device 1100 to the host 1300.

Figure 34:
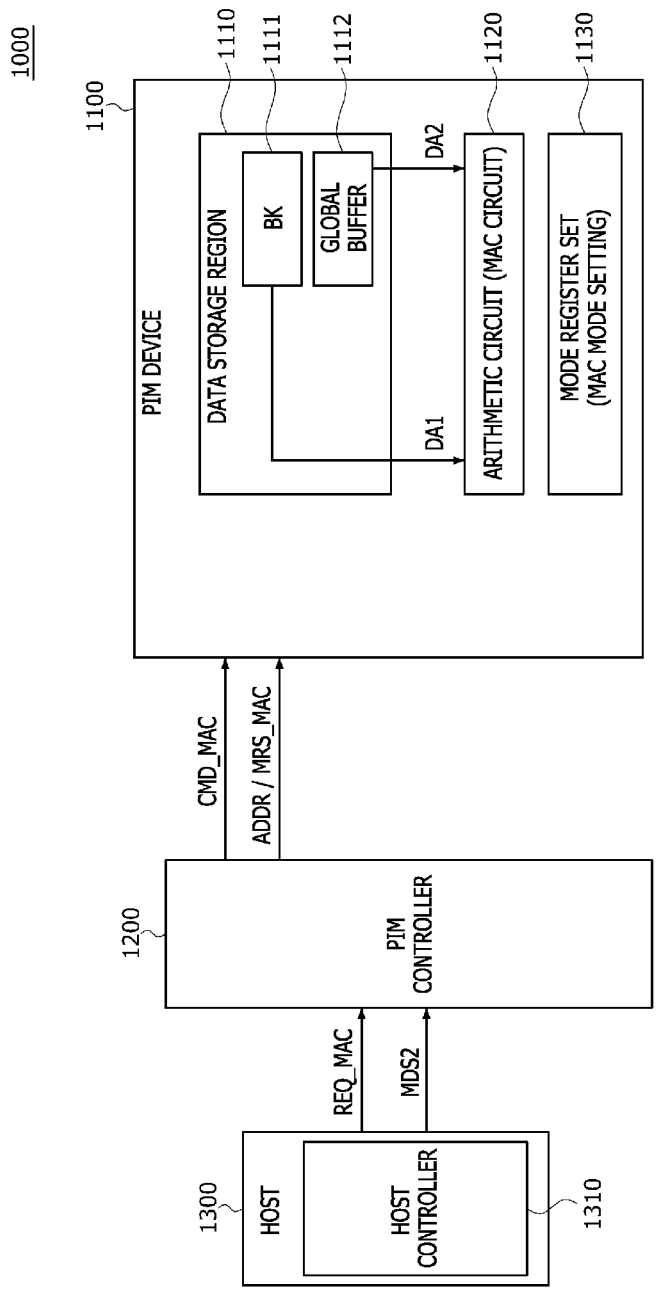
FIG. 34 illustrates an example of a MAC arithmetic operation performed by an arithmetic circuit in a MAC operation of a PIM device included in the PIM system illustrated in FIG. 31.

FIG. 34 illustrates an example of the MAC arithmetic operation performed by the arithmetic circuit 1120 during the MAC operation of the PIM device 1100 included in the PIM system 1000 illustrated in FIG. 31. In FIG. 34, the same reference numerals or the same reference symbols as used in FIG. 31 denote the same elements. Referring to FIG. 34, the MAC arithmetic operation of the arithmetic circuit 1120 included in the PIM device 1100 may correspond to an arithmetic operation performed by the arithmetic circuit 1120. The MAC arithmetic operation of the arithmetic circuit 1120 may correspond to the MAC mode operation of the PIM device 1100. Thus, the MAC arithmetic operation of the arithmetic circuit 1120 is performed while the mode register set 1130 is set to provide the MAC mode. In the present embodiment, it may be assumed that the MAC arithmetic operation of the arithmetic circuit 1120 is performed while the first arithmetic data DA1 and the second arithmetic data DA2 are stored in respective ones of the bank 1111 and the global buffer 1112 included in the data storage region 1110.

In order to perform the MAC arithmetic operation of the arithmetic circuit 1120, the host 1300 may transmit a MAC request REQ_MAC and a second mode definition signal MDS2 to the PIM controller 1200. The PIM controller 1200 may regard the MAC request REQ_MAC outputted from the host 1300 as a request for the MAC mode operation based on the second mode definition signal MDS2. The PIM controller 1200 may generate the MAC command CMD_MAC and the address ADDR that correspond to the MAC request REQ_MAC. The PIM controller 1200 may determine whether the mode register set 1130 of the PIM device 1100 is set to provide the MAC mode before transmitting the MAC command CMD_MAC to the PIM device 1100.

When the mode register set 1130 of the PIM device 1100 is set to provide the MAC mode, the PIM controller 1200 may transmit the MAC command CMD_MAC to the PIM device 1100 without transmitting the mode setting signal MRS to the PIM device 1100. In such a case, the arithmetic circuit 1120 of the PIM device 1100 may perform the MAC arithmetic operation based on the MAC command CMD_MAC without changing the operation mode. Specifically, the arithmetic circuit 1120 of the PIM device 1100 may receive the first arithmetic data DA1 and the second arithmetic data DA2 from respective ones of the bank 1111 and the global buffer 1112 of the data storage region 1110. The arithmetic circuit 1120 may perform the MAC arithmetic operation for the first arithmetic data DA1 and the second arithmetic data DA2 to generate the MAC result data.

When the mode register set 1130 of the PIM device 1100 is set to provide the memory mode, the PIM controller 1200 may transmit the MAC command CMD_MAC to the PIM device 1100 after transmitting a MAC mode setting signal MRS_MAC corresponding to the mode setting signal MRS to the PIM device 1100. The PIM device 1100 may control the mode register set 1130 in response to the MAC mode setting signal MRS_MAC outputted from the PIM controller 1200 such that the mode register set 1130 is set to provide the MAC mode. Subsequently, the arithmetic circuit 1120 of the PIM device 1100 may perform the MAC arithmetic operation based on the MAC command CMD_MAC outputted from the PIM controller 1200.

In the present embodiment, the MAC arithmetic operation may be performed by only the MAC command CMD_MAC, and the MAC command CMD_MAC may be generated by only the MAC request REQ_MAC. Thus, transmission of the mode definition signal MDS may be omitted only when the host 1300 transmits the MAC request REQ_MAC to the PIM controller 1200. However, in such a case, when the MAC request REQ_MAC is transmitted from the host 1300 to the PIM controller 1200, the PIM controller 1200 may conclude that the second mode definition signal MDS2 is transmitted to the PIM controller 1200 together with the MAC request REQ_MAC. Accordingly, the PIM controller 1200 may control the mode status of the mode register set 1130.

Figure 35:
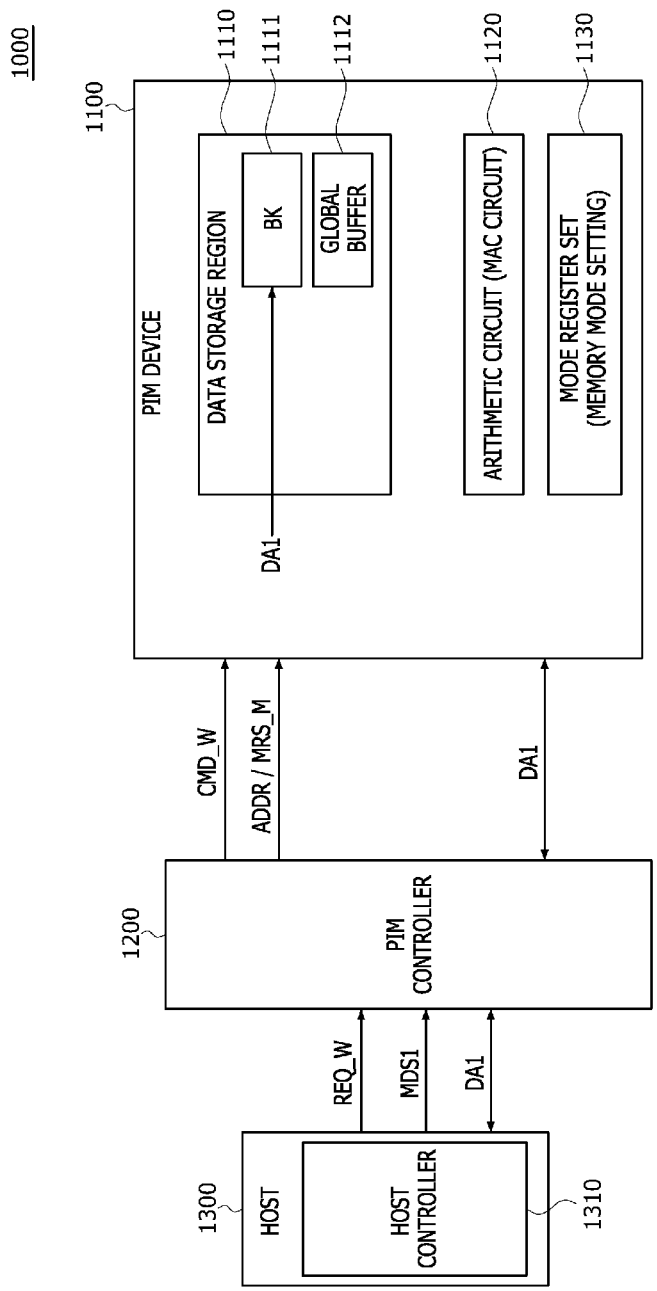
FIG. 35 illustrates an example of a MAC write operation for first arithmetic data in a MAC operation of a PIM device included in the PIM system illustrated in FIG. 31.

FIG. 35 illustrates an example of a MAC write operation for the first arithmetic data DA1 during the MAC operation of the PIM device 1100 included in the PIM system 1000 illustrated in FIG. 31. In FIG. 35, the same reference numerals or the same reference symbols as used in FIG. 31 denote the same elements. Referring to FIG. 35, the MAC write operation for the first arithmetic data DA1 performed by the PIM device 1100 may correspond to an operation for storing the first arithmetic data DA1 outputted from the PIM controller 1200 into the bank 1111 of the data storage region 1110. The MAC write operation for the first arithmetic data DA1 performed by the PIM device 1100 may correspond to an operation (i.e., the memory access operation) performed when the PIM device 1100 functions as a memory device. Thus, the MAC write operation for the first arithmetic data DA1 may belong to the memory mode operation. Accordingly, the MAC write operation for the first arithmetic data DA1 performed by the PIM device 1100 is performed in the memory mode which is set by the mode register set 1130 of the PIM device 1100.

In order to perform the MAC write operation for the first arithmetic data DA1 of the PIM device 1100, the host 1300 may transmit the write request REQ_W and the first mode definition signal MDS1 to the PIM controller 1200. The host 1300 may also transmit the first arithmetic data DA1 to the PIM controller 1200. The PIM controller 1200 may regard the write request REQ_W outputted from the host 1300 as a request for the memory write operation of the memory access operation based on the first mode definition signal MDS1. The PIM controller 1200 may generate the write command CMD_W and the address ADDR that correspond to the write request REQ_W. The PIM controller 1200 may determine whether the mode register set 1130 of the PIM device 1100 is set to provide the memory mode before transmitting the write command CMD_W to the PIM device 1100.

The PIM controller 1200 may identify a current operation mode of the PIM device 1100 based on the mode setting signal MRS transmitted to the PIM device 1100 most recently. When the mode register set 1130 of the PIM device 1100 is set to provide the memory mode, the PIM controller 1200 may transmit the write command CMD_W to the PIM device 1100 without transmitting the mode setting signal MRS to the PIM device 1100. In such a case, the PIM device 1100 may store the first arithmetic data DA1 into the bank 1111 based on the write command CMD_W without changing the operation mode. When the mode register set 1130 of the PIM device 1100 is set to provide the MAC mode, the PIM controller 1200 may transmit the write command CMD_W to the PIM device 1100 after transmitting the memory mode setting signal MRS_M corresponding to the mode setting signal MRS to the PIM device 1100. The PIM device 1100 may control the mode register set 1130 in response to the memory mode setting signal MRS_M outputted from the PIM controller 1200 such that the mode register set 1130 is set to provide the memory mode. Subsequently, the PIM device 1100 may store the first arithmetic data DA1 into the bank 1111 in response to the write command CMD_W outputted from the PIM controller 1200.

Figure 36:
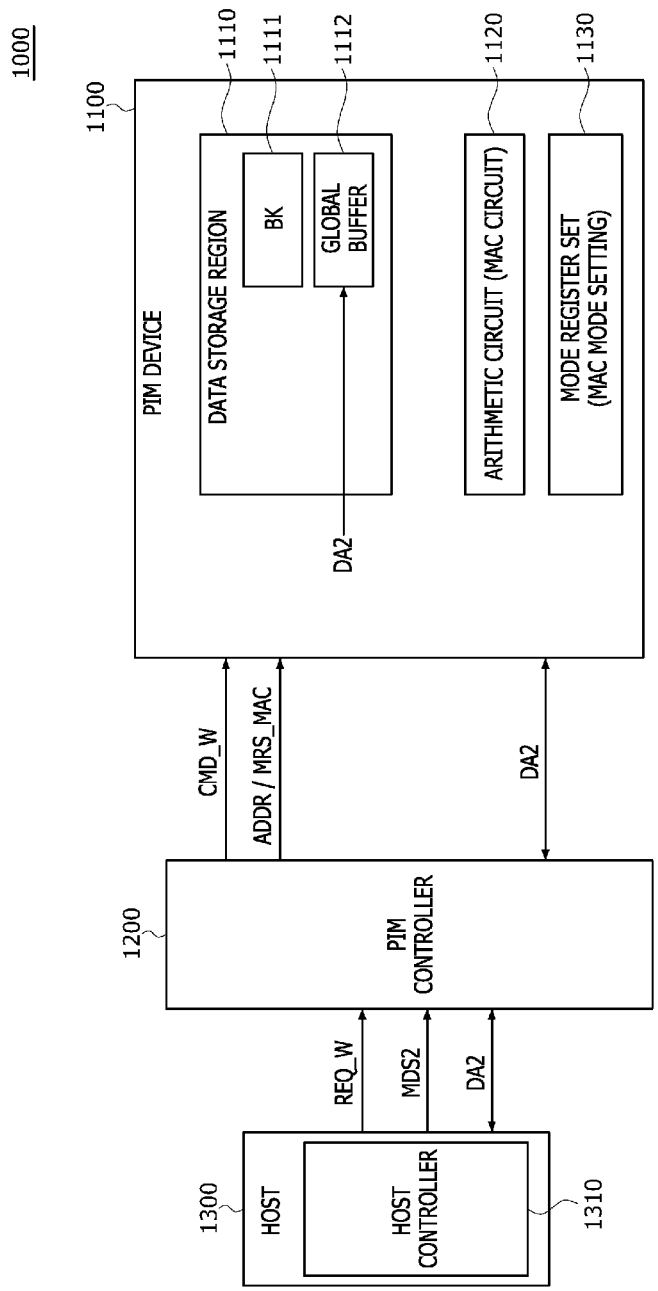
FIG. 36 illustrates an example of a MAC write operation for second arithmetic data in a MAC operation of a PIM device included in the PIM system illustrated in FIG. 31.

FIG. 36 illustrates an example of the MAC write operation for the second arithmetic data DA2 during the MAC operation of the PIM device 1100 included in the PIM system 1000 illustrated in FIG. 31. In FIG. 36, the same reference numerals or the same reference symbols as used in FIG. 31 denote the same elements. Referring to FIG. 36, the MAC write operation for the second arithmetic data DA2 performed by the PIM device 1100 may correspond to an operation for storing the second arithmetic data DA2 outputted from the PIM controller 1200 into the global buffer 1112 of the data storage region 1110. Thus, the MAC write operation for the second arithmetic data DA2 does not belong to the memory mode operation performed when the PIM device 1100 functions as a memory device but belongs to the MAC mode operation. Accordingly, the MAC write operation for the second arithmetic data DA2 performed by the PIM device 1100 is performed in the MAC mode which is set by the mode register set 1130 of the PIM device 1100.

In order to perform the MAC write operation for the second arithmetic data DA2 of the PIM device 1100, the host 1300 may transmit the write request REQ_W and the second mode definition signal MDS2 to the PIM controller 1200. The host 1300 may also transmit the second arithmetic data DA2 to the PIM controller 1200. The PIM controller 1200 may regard the write request REQ_W outputted from the host 1300 as a request for the MAC mode operation based on the second mode definition signal MDS2. The PIM controller 1200 may generate the write command CMD_W and the address ADDR that correspond to the write request REQ_W. The PIM controller 1200 may determine whether the mode register set 1130 of the PIM device 1100 is set to provide the MAC mode before transmitting the write command CMD_W to the PIM device 1100.

The PIM controller 1200 may identify a current operation mode of the PIM device 1100 based on the mode setting signal MRS transmitted to the PIM device 1100 most recently. When the mode register set 1130 of the PIM device 1100 is set to provide the MAC mode, the PIM controller 1200 may transmit the write command CMD_W to the PIM device 1100 without transmitting the mode setting signal MRS to the PIM device 1100. In such a case, the PIM device 1100 may store the second arithmetic data DA2 into the global buffer 1112 based on the write command CMD_W without changing the operation mode. When the mode register set 1130 of the PIM device 1100 is set to provide the memory mode, the PIM controller 1200 may transmit the write command CMD_W to the PIM device 1100 after transmitting the MAC mode setting signal MRS_MAC corresponding to the mode setting signal MRS to the PIM device 1100. The PIM device 1100 may control the mode register set 1130 in response to the MAC mode setting signal MRS_MAC outputted from the PIM controller 1200 such that the mode register set 1130 is set to provide the MAC mode. Subsequently, the PIM device 1100 may store the second arithmetic data DA2 into the global buffer 1112 in response to the write command CMD_W outputted from the PIM controller 1200.

Figure 37:
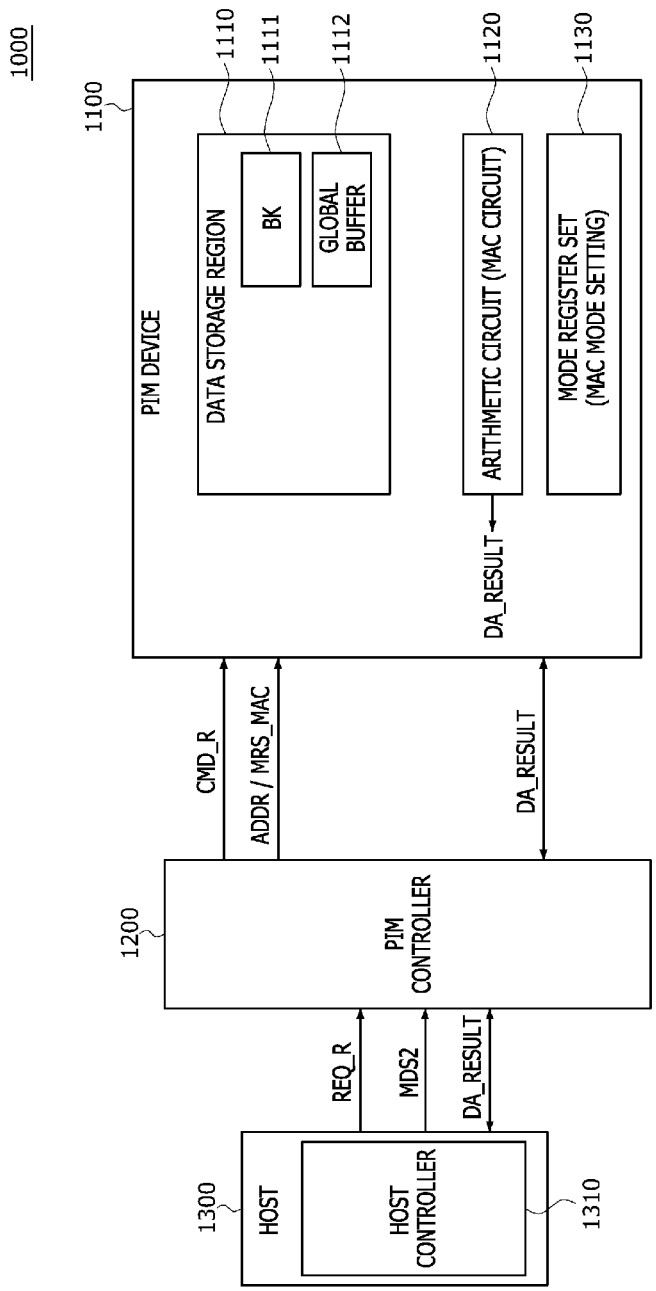
FIG. 37 illustrates an example of a MAC read operation for arithmetic result data in a MAC operation of a PIM device included in the PIM system illustrated in FIG. 31.

FIG. 37 illustrates an example of a MAC read operation for the arithmetic result data DA_RESULT during the MAC operation of the PIM device 1100 included in the PIM system 1000 illustrated in FIG. 31. In FIG. 37, the same reference numerals or the same reference symbols as used in FIG. 31 denote the same elements. Referring to FIG. 37, the MAC read operation for the arithmetic result data DA_RESULT performed by the PIM device 1100 may correspond to an operation for transmitting the arithmetic result data DA_RESULT, which are generated from an arithmetic operation of the arithmetic circuit 1120 included in the PIM device 1100, to the host 1300 through the PIM controller 1200. The MAC read operation for the arithmetic result data DA_RESULT performed by the PIM device 1100 may belong to the MAC operation of the PIM device 1100. Thus, the MAC read operation of the PIM device 1100 is performed in the MAC mode which is set by the mode register set 1130 of the PIM device 1100.

In order to perform the MAC read operation for the arithmetic result data DA_RESULT of the PIM device 1100, the host 1300 may transmit the read request REQ_R and the second mode definition signal MDS2 to the PIM controller 1200. The PIM controller 1200 may regard the read request REQ_R outputted from the host 1300 as a request for the MAC operation based on the second mode definition signal MDS2. The PIM controller 1200 may generate the read command CMD_R corresponding to the read request REQ_R. The PIM controller 1200 may determine whether the mode register set 1130 of the PIM device 1100 is set to provide the MAC mode before transmitting the read command CMD_R to the PIM device 1100.

When the mode register set 1130 of the PIM device 1100 is set to provide the MAC mode, the PIM controller 1200 may transmit the read command CMD_R to the PIM device 1100 without transmitting the mode setting signal MRS to the PIM device 1100. In such a case, the PIM device 1100 may perform the read operation for the arithmetic result data DA_RESULT based on the read command CMD_R without changing the operation mode. When the mode register set 1130 of the PIM device 1100 is set to provide the memory mode, the PIM controller 1200 may transmit the read command CMD_R to the PIM device 1100 after transmitting the MAC mode setting signal MRS_MAC corresponding to the mode setting signal MRS to the PIM device 1100. The PIM device 1100 may control the mode register set 1130 in response to the MAC mode setting signal MRS_MAC outputted from the PIM controller 1200 such that the mode register set 1130 is set to provide the MAC mode. Subsequently, the PIM device 1100 may transmit the arithmetic result data DA_RESULT generated by the arithmetic circuit 1120 to the PIM controller 1200 in response to the read command CMD_R outputted from the PIM controller 1200. The PIM controller 1200 may transmit the arithmetic result data DA_RESULT, which are outputted from the PIM device 1100, to the host 1300.

FIG. 38 is a table illustrating various signals transmitted among the host 1300, the PIM controller 1200, and the PIM device 1100 included in the PIM system 1000 illustrated in FIG. 31, various operations of the PIM device 1100 according to the various signals, and various mode statuses of the mode register set 1130 according to the various signals. Referring to FIGS. 31 to 38, the request REQ transmitted from the host 1300 to the PIM controller 1200 may be one of the write request REQ_W, the read request REQ_R, and the MAC request REQ_MAC. The write request REQ_W may belong to any one of the memory access operation request REQ_ME and the MAC operation request REQ_MO. When the write request REQ_W belongs to the memory access operation request REQ_ME, the host 1300 may transmit the first mode definition signal MDS1 with the write request REQ_W to the PIM controller 1200. The PIM controller 1200 may transmit the write command CMD_W to the PIM device 1100. When the mode register set 1130 of the PIM device 1100 is set to provide the MAC mode, the PIM controller 1200 may transmit the memory mode setting signal MRS_M to the PIM device 1100 before transmitting the write command CMD_W to the PIM device 1100. The PIM device 1100 may perform the memory write operation while the mode register set 1130 is set to provide the memory mode.

The write request REQ_W belonging to the MAC operation request REQ_MO may be categorized as either the write request REQ_W for the first arithmetic data DA1 or the write request REQ_W for the second arithmetic data DA2. When the write request REQ_W is the write request REQ_W for the first arithmetic data DA1, the write request REQ_W for the first arithmetic data DA1 may be processed in the same way as the write request REQ_W belonging to the memory access operation request REQ_ME and the PIM device 1100 may perform the MAC write operation for the first arithmetic data DA1 while the mode register set 1130 is set to provide the memory mode. In contrast, when the write request REQ_W is the write request REQ_W for the second arithmetic data DA2, the host 1300 may transmit the second mode definition signal MDS2 with the write request REQ_W to the PIM controller 1200. The PIM controller 1200 may transmit the write command CMD_W to the PIM device 1100. When the mode register set 1130 of the PIM device 1100 is set to provide the memory mode, the PIM controller 1200 may transmit the MAC mode setting signal MRS_MAC to the PIM device 1100 before transmitting the write command CMD_W to the PIM device 1100. The PIM device 1100 may perform the memory write operation for the second arithmetic data DA2 while the mode register set 1130 is set to provide the MAC mode.

The read request REQ_R may also belong to any one of the memory access operation request REQ_ME and the MAC operation request REQ_MO. When the read request REQ_R belongs to the memory access operation request REQ_ME, the host 1300 may transmit the first mode definition signal MDS1 with the read request REQ_R to the PIM controller 1200. The PIM controller 1200 may transmit the read command CMD_R to the PIM device 1100. When the mode register set 1130 of the PIM device 1100 is set to provide the MAC mode, the PIM controller 1200 may transmit the memory mode setting signal MRS_M to the PIM device 1100 before transmitting the read command CMD_R to the PIM device 1100. The PIM device 1100 may perform the memory read operation while the mode register set 1130 is set to provide the memory mode.

When the read request REQ_R belongs to the MAC operation request REQ_MO, the host 1300 may transmit the second mode definition signal MDS2 with the read request REQ_R to the PIM controller 1200. The PIM controller 1200 may transmit the read command CMD_R to the PIM device 1100. Meanwhile, when the mode register set 1130 of the PIM device 1100 is set to provide the memory mode, the PIM controller 1200 may transmit the MAC mode setting signal MRS_MAC to the PIM device 1100 before transmitting the read command CMD_R to the PIM device 1100. The PIM device 1100 may perform the MAC read operation for the arithmetic result data DA_RESULT while the mode register set 1130 is set to provide the MAC mode.

In case of the MAC request REQ_MAC belonging to the MAC operation request REQ_MO, the host 1300 may transmit the second mode definition signal MDS2 with the MAC request REQ_MAC to the PIM controller 1200. The PIM controller 1200 may then transmit the MAC command CMD_MAC to the PIM device 1100. When the mode register set 1130 of the PIM device 1100 is set to provide the memory mode, the PIM controller 1200 may transmit the MAC mode setting signal MRS_MAC to the PIM device 1100 before transmitting the MAC command CMD_MAC to the PIM device 1100. The PIM device 1100 may perform the MAC operation while the mode register set 1130 is set to provide the MAC mode.

Figure 39:
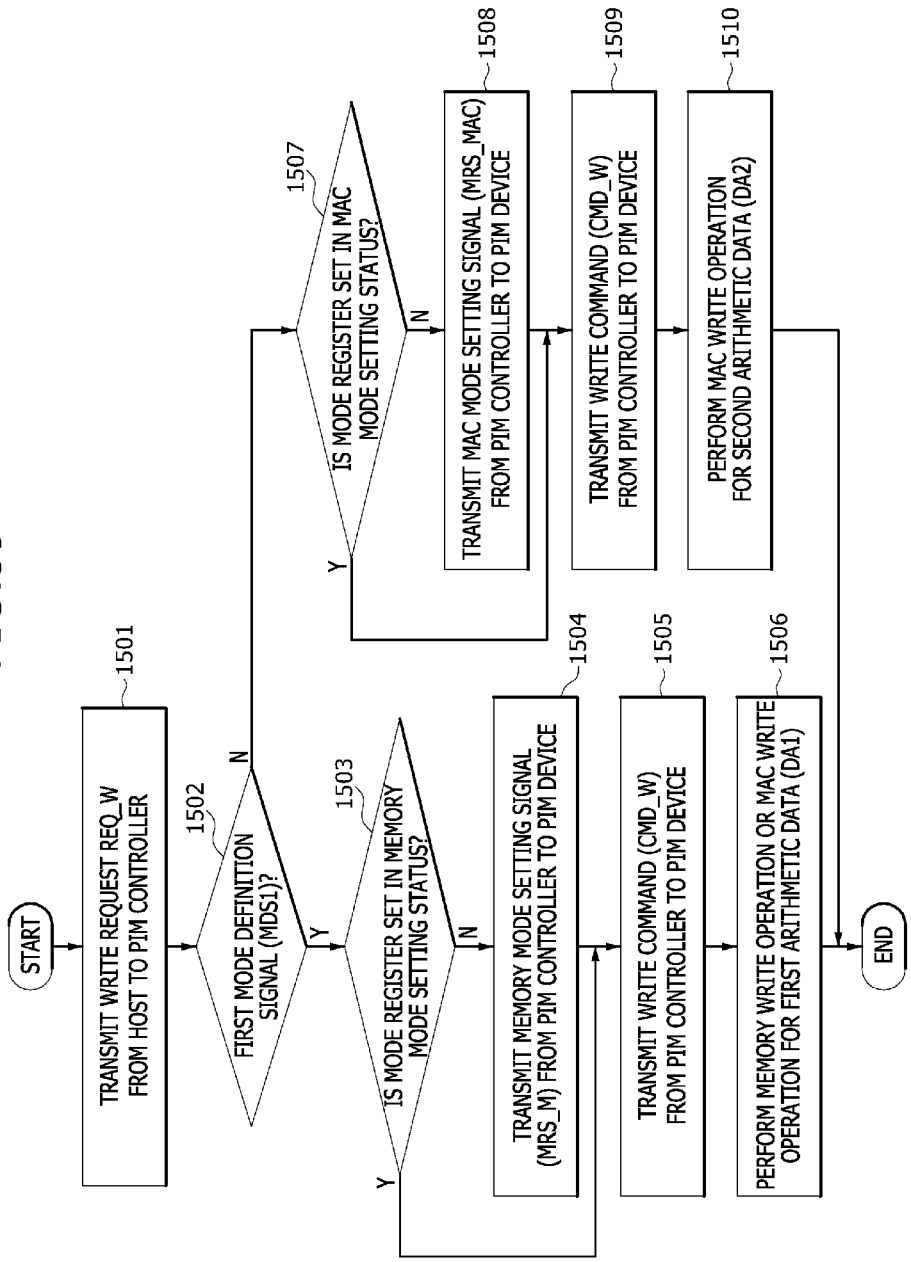
FIG. 39 is a flowchart illustrating an operation performed when a write request is generated by a host of the PIM system illustrated in FIG. 31.

FIG. 39 is a flowchart illustrating an operation performed when the write request REQ_W is generated by the host 1300 of the PIM system 1000 illustrated in FIG. 31. Referring to FIGS. 31 and 39, when the write request REQ_W is transmitted from the host 1300 to the PIM controller 1200 at a step 1501, the PIM controller 1200 may determine whether the mode definition signal MDS transmitted to the PIM controller 1200 with the write request REQ_W is the first mode definition signal MDS1 (see step 1502). When the first mode definition signal MDS1 is transmitted from the host 1300 to the PIM controller 1200 at the step 1502, the PIM controller 1200 may determine whether the mode register set 1130 of the PIM device 1100 is set to provide the memory mode (see step 1503). When the mode register set 1130 of the PIM device 1100 is not set to provide the memory mode at the step 1503, the PIM controller 1200 may transmit the memory mode setting signal MRS_M to the PIM device 1100 (see step 1504). Thus, the mode register set 1130 of the PIM device 1100 may be set to provide the memory mode. Thereafter, the PIM controller 1200 may transmit the write command CMD_W to the PIM device 1100 (see step 1505). When the mode register set 1130 of the PIM device 1100 is set to provide the memory mode at the step 1503, the step 1504 may be skipped and the step 1505 may be executed. Subsequently, the PIM device 1100 may perform the memory write operation or the MAC write operation for the first arithmetic data DA1 in response to the write command CMD_W (see step 1506). As described with reference to FIGS. 32 and 35, both of the memory write operation and the MAC write operation for the first arithmetic data DA1 may correspond to operations for storing data into the bank 1111. Accordingly, the memory write operation and the MAC write operation for the first arithmetic data DA1 may be performed through the same memory access operation.

When the first mode definition signal MDS1 is not transmitted from the host 1300 to the PIM controller 1200 at the step 1502 (i.e., the second mode definition signal MDS2 is transmitted from the host 1300 to the PIM controller 1200 at the step 1502), the PIM controller 1200 may determine whether the mode register set 1130 of the PIM device 1100 is set to provide the MAC mode (see step 1507). When the mode register set 1130 of the PIM device 1100 is not set to provide the MAC mode at the step 1507, the PIM controller 1200 may transmit the MAC mode setting signal MRS_MAC to the PIM device 1100 (see step 1508). Thus, the mode register set 1130 of the PIM device 1100 may be set to provide the MAC mode. Thereafter, the PIM controller 1200 may transmit the write command CMD_W to the PIM device 1100 (see step 1509). When the mode register set 1130 of the PIM device 1100 is set to provide the MAC mode at the step 1507, the step 1508 may be skipped and the step 1509 may be executed. Subsequently, the PIM device 1100 may perform the MAC write operation for the second arithmetic data DA2 in response to the write command CMD_W (see step 1510). As described with reference to FIG. 36, the MAC write operation for the second arithmetic data DA2 may correspond to an operation for storing data into the global buffer 1112 not into the bank 1111. Accordingly, the MAC write operation for the second arithmetic data DA2 may be performed in the MAC mode not in the memory mode.

Figure 40:
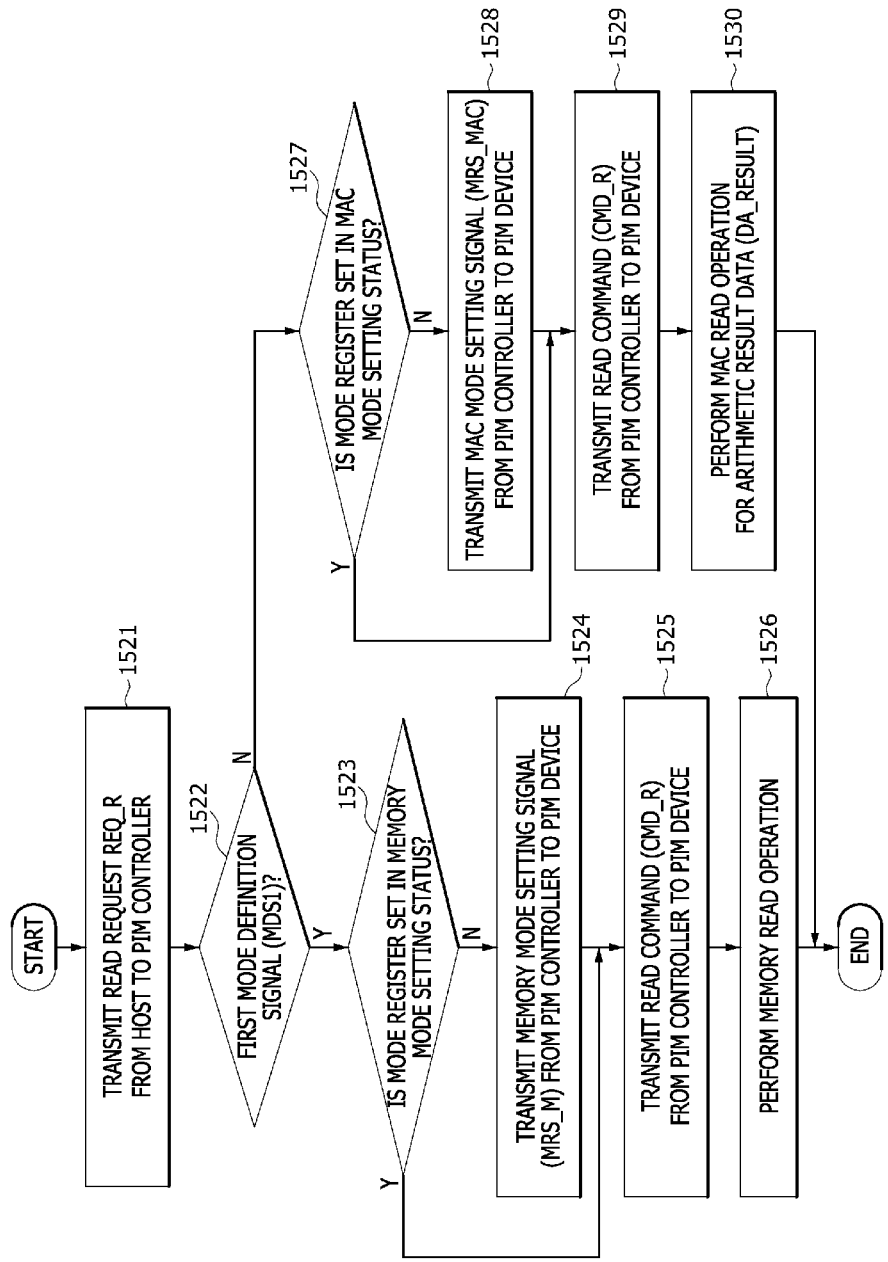
FIG. 40 is a flowchart illustrating an operation performed when a read request is generated by a host of the PIM system illustrated in FIG. 31.

FIG. 40 is a flowchart illustrating an operation performed when the read request REQ_R is generated by the host 1300 of the PIM system 1000 illustrated in FIG. 31. Referring to FIGS. 31 and 40, when the read request REQ_R is transmitted from the host 1300 to the PIM controller 1200 at a step 1521, the PIM controller 1200 may determine whether the mode definition signal MDS transmitted to the PIM controller 1200 with the read request REQ_R is the first mode definition signal MDS1 (see step 1522). When the first mode definition signal MDS1 is transmitted from the host 1300 to the PIM controller 1200 at the step 1522, the PIM controller 1200 may determine whether the mode register set 1130 of the PIM device 1100 is set to provide the memory mode (see step 1523). When the mode register set 1130 of the PIM device 1100 is not set to provide the memory mode at the step 1523, the PIM controller 1200 may transmit the memory mode setting signal MRS_M to the PIM device 1100 (see step 1524). Thus, the mode register set 1130 of the PIM device 1100 may be set to provide the memory mode. Thereafter, the PIM controller 1200 may transmit the read command CMD_R to the PIM device 1100 (see step 1525). When the mode register set 1130 of the PIM device 1100 is set to provide the memory mode at the step 1523, the step 1524 may be skipped and the step 1525 may be executed. Subsequently, the PIM device 1100 may perform the memory read operation in response to the read command CMD_R (see step 1526).

When the first mode definition signal MDS1 is not transmitted from the host 1300 to the PIM controller 1200 at the step 1522 (i.e., the second mode definition signal MDS2 is transmitted from the host 1300 to the PIM controller 1200 at the step 1522), the PIM controller 1200 may determine whether the mode register set 1130 of the PIM device 1100 is set to provide the MAC mode (see step 1527). When the mode register set 1130 of the PIM device 1100 is not set to provide the MAC mode at the step 1527, the PIM controller 1200 may transmit the MAC mode setting signal MRS_MAC to the PIM device 1100 (see step 1528). Thus, the mode register set 1130 of the PIM device 1100 may be set to provide the MAC mode. Thereafter, the PIM controller 1200 may transmit the read command CMD_R to the PIM device 1100 (see step 1529). When the mode register set 1130 of the PIM device 1100 is set to provide the MAC mode at the step 1527, the step 1528 may be skipped and the step 1529 may be executed. Subsequently, the PIM device 1100 may perform the MAC read operation for the arithmetic result data DA_RESULT in response to the read command CMD_R (see step 1530). As described with reference to FIG. 37, the MAC read operation for the arithmetic result data DA_RESULT may correspond to an operation for outputting data from the arithmetic circuit 1120 not from the bank 1111. Accordingly, the MAC read operation for the arithmetic result data DA_RESULT may be performed in the MAC mode not in the memory mode.

Figure 41:
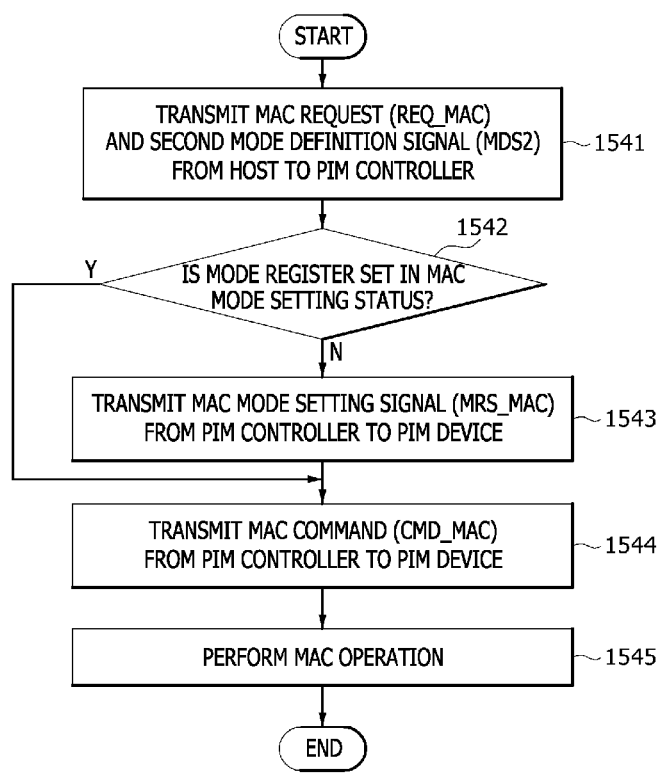
FIG. 41 is a flowchart illustrating an operation performed when a MAC request is generated by a host of the PIM system illustrated in FIG. 31.

FIG. 41 is a flowchart illustrating an operation performed when the MAC request REQ_MAC is generated by the host 1300 of the PIM system 1000 illustrated in FIG. 31. Referring to FIGS. 31 and 41, when the MAC request REQ_MAC and the second mode definition signal MDS2 are transmitted from the host 1300 to the PIM controller 1200 at a step 1541, the PIM controller 1200 may determine whether the mode register set 1130 of the PIM device 1100 is set to provide the MAC mode (see step 1542). When the mode register set 1130 of the PIM device 1100 is not set to provide the MAC mode at the step 1542, the PIM controller 1200 may transmit the MAC mode setting signal MRS_MAC to the PIM device 1100 (see step 1543). Thus, the mode register set 1130 of the PIM device 1100 may be set to provide the MAC mode. Thereafter, the PIM controller 1200 may transmit the MAC command CMD_MAC to the PIM device 1100 (see step 1544). When the mode register set 1130 of the PIM device 1100 is set to provide the MAC mode at the step 1542, the step 1543 may be skipped and the step 1544 may be executed. Subsequently, the PIM device 1100 may perform the MAC operation in response to the MAC command CMD_MAC (see step 1545). As described with reference to FIG. 34, the MAC operation of the PIM device 1100 may correspond to the MAC arithmetic operation executed by the arithmetic circuit 1120. Accordingly, the MAC operation may be performed in the MAC mode not in the memory mode.

Figure 42:
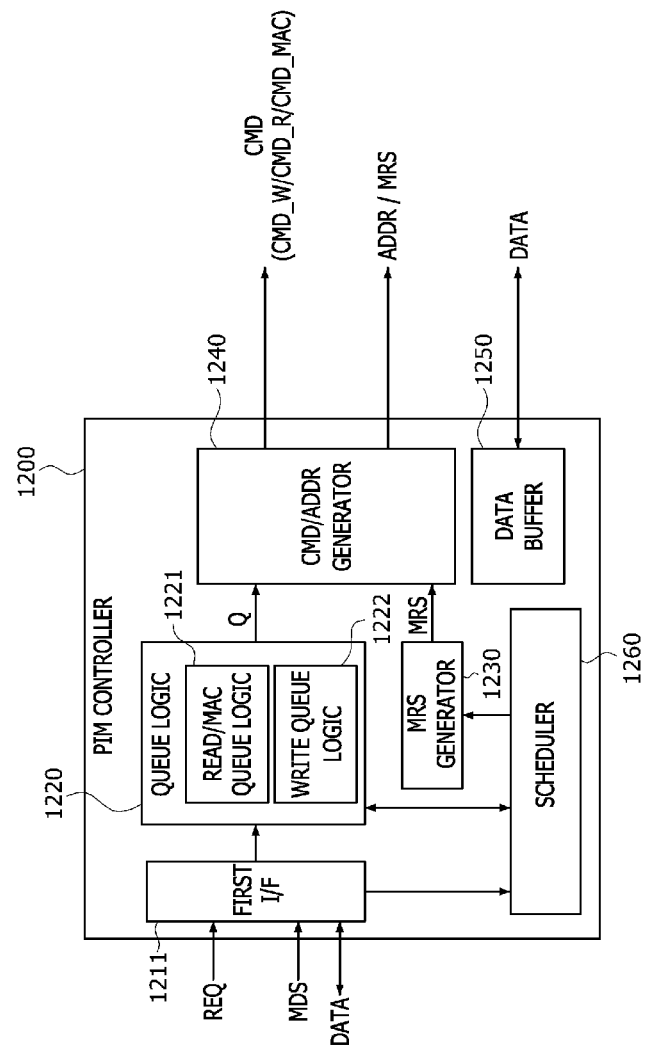
FIG. 42 is a block diagram illustrating an example of a configuration of a PIM controller included in the PIM system illustrated in FIG. 31.

FIG. 42 is a block diagram illustrating an example of a configuration of the PIM controller 1200 included in the PIM system 1000 illustrated in FIG. 31. Referring to FIG. 42, the PIM controller 1200 may include a first interface 1211, a queue logic circuit 1220, a mode setting signal generator 1230, a command/address generator 1240, a data buffer 1250, and a scheduler 1260. The first interface 1211 may execute an interfacing operation between the host 1300 and the PIM controller 1200. The first interface 1211 and the host 1300 may communicate with each other through a channel coupled therebetween. The channel between the first interface 1211 and the host 1300 may include write channels and read channels. The channel between the first interface 1211 and the host 1300 will be described in more detail with reference to FIGS. 45 and 46. The first interface 1211 may receive the request REQ and the mode definition signal MDS from the host 1300. The first interface 1211 may receive the data from the host 1300 or may transmit the data to the host 1300.

The queue logic circuit 1220 may be configured to store a queue Q corresponding to the request REQ transmitted through the first interface 1211. The queue logic circuit 1220 may include a read/MAC queue logic circuit 1221 and a write queue logic circuit 1222. The read/MAC queue logic circuit 1221 may store a read queue and a MAC queue corresponding to respective ones of the read request REQ_R and the MAC request REQ_MAC which are transmitted from the host 1300 to the queue logic circuit 1220 through the first interface 1211. In an embodiment, each of the read queue and the MAC queue may include address information and index information. Although the read queue and the MAC queue are all stored in the read/MAC queue logic circuit 1221 in the present embodiment, the present embodiment may be merely an example of the present disclosure. For example, in some other embodiments, a logic circuit storing the read queue may be disposed to be separated from a logic circuit storing the MAC queue. The write queue logic circuit 1222 may store a write queue corresponding to the write request REQ_W which is transmitted from the host 1300 to the queue logic circuit 1220 through the first interface 1211. In an embodiment, the write queue may include address information, index information, and data to be written (i.e., the write data DA_W of FIG. 32). The queue logic circuit 1220 may sequentially output the queues Q stored in the read/MAC queue logic circuit 1221 and the write queue logic circuit 1222 in order of an output priority from a highest output priority to a lowest output priority.

The mode setting signal generator 1230 may be configured to output the mode setting signal MRS in response to a predetermined control signal. The mode setting signal generator 1230 may output the memory mode setting signal MRS_M or the MAC mode setting signal MRS_MAC. The predetermined control signal controlling an operation of the mode setting signal generator 1230 may be outputted from the scheduler 1260. For example, when the predetermined control signal is not transmitted from the scheduler 1260 to the mode setting signal generator 1230, the mode setting signal generator 1230 does not output the mode setting signal MRS. When the predetermined control signal having a first level is transmitted from the scheduler 1260 to the mode setting signal generator 1230, the mode setting signal generator 1230 may output the memory mode setting signal MRS_M. When the predetermined control signal having a second level is transmitted from the scheduler 1260 to the mode setting signal generator 1230, the mode setting signal generator 1230 may output the MAC mode setting signal MRS_MAC.

The command/address generator 1240 may be configured to receive the queue Q from the queue logic circuit 1220 and to output the command CMD and the address ADDR. In addition, the command/address generator 1240 may be configured to receive the mode setting signal MRS from the mode setting signal generator 1230 and to output the mode setting signal MRS. When the read queue is transmitted from the queue logic circuit 1220 to the command/address generator 1240, the command/address generator 1240 may output the read command CMD_R. When the write queue is transmitted from the queue logic circuit 1220 to the command/address generator 1240, the command/address generator 1240 may output the write command CMD_W. When the MAC queue is transmitted from the queue logic circuit 1220 to the command/address generator 1240, the command/address generator 1240 may output the MAC command CMD_MAC. When the mode setting signal MRS is transmitted from the queue logic circuit 1220 to the command/address generator 1240, the command/address generator 1240 may output the mode setting signal MRS through an address transmission line. The data buffer 1250 may temporarily store data to be transmitted to the host 1300 or data received from the PIM device 1100 or the host 1300.

The scheduler 1260 may perform a scheduling operation for outputting the queue Q from the queue logic circuit 1220 and for outputting the mode setting signal MRS from the mode setting signal generator 1230. The scheduler 1260 may receive information on the request REQ and the mode definition signal MDS from the first interface 1211. The scheduler 1260 may analyze the information on the request REQ and the mode definition signal MDS to determine output priorities of the queue Q outputted from the queue logic circuit 1220 and the mode setting signal MRS outputted from the mode setting signal generator 1230. The scheduler 1260 may transmit the predetermined control signal to the queue logic circuit 1220 and the mode setting signal generator 1230 in order to output the queue Q and the mode setting signal MRS from the queue logic circuit 1220 and the mode setting signal generator 1230 in order of the output priorities which are determined by the scheduler 1260.

Figure 43:
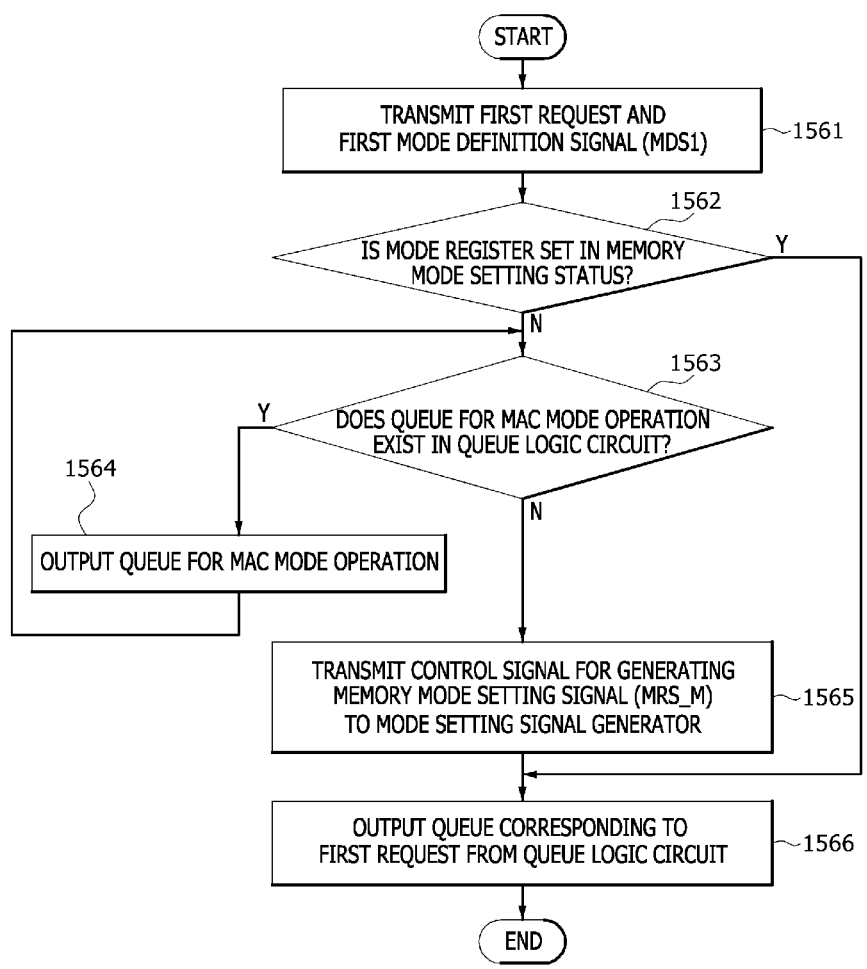
FIG. 43 is a flowchart illustrating an example of a scheduling operation performed by a scheduler included in the PIM controller illustrated in FIG. 42.

FIG. 43 is a flowchart illustrating an example of the scheduling operation performed by the scheduler 1260 included in the PIM controller 1200 illustrated in FIG. 42. Referring to FIG. 43, it may be assumed that the present embodiment corresponds to a case that a first request and the first mode definition signal MDS1 are transmitted to the scheduler 1260 through the first interface 1211 at a step 1561. At a step 1562, the scheduler 1260 may determine whether the mode register set 1130 of the PIM device 1100 is set to provide the memory mode. This determination may be executed using a control signal transmitted to the mode setting signal generator 1230 most recently. When the mode register set 1130 of the PIM device 1100 is set to provide the MAC mode at the step 1562, the scheduler 1260 may determine whether the queue for the MAC mode operation exists in the queue logic circuit 1220 (e.g., the queue corresponding to the MAC write request for the second arithmetic data DA2, the MAC request, or the MAC read request for the MAC result data DA_RESULT exists in the queue logic circuit 1220) (see step 1563).

When the queue for the MAC mode operation exists in the queue logic circuit 1220 at the step 1563, the queue for the MAC mode operation may be outputted from the queue logic circuit 1220 (see step 1564). After the step 1564, the process may be fed back to the step 1563. The steps 1563 and 1564 may be iteratively executed until all of the queues for the MAC mode operation are outputted from the queue logic circuit 1220. While the step 1564 is repeatedly executed, the scheduler 1260 does not transmit any control signal to the mode setting signal generator 1230. Thus, while the MAC mode operation corresponding to the queues outputted from the queue logic circuit 1220 is performed by the PIM device 1100, the mode register set 1130 of the PIM device 1100 may maintain the MAC mode setting status.

When the queue for the MAC mode operation does not exist in the queue logic circuit 1220 at the step 1563, the scheduler 1260 may transmit the predetermined control signal to the mode setting signal generator 1230 such that the mode setting signal generator 1230 outputs the memory mode setting signal MRS_M (see step 1565). Thus, the mode register set 1130 of the PIM device 1100 may be set to provide the memory mode. Subsequently, the scheduler 1260 may control the queue logic circuit 1220 such that the queue logic circuit 1220 outputs the queue corresponding to the first request (see step 1566). The PIM device 1100 may perform the memory mode operation (e.g., the memory write operation, the memory read operation, or the MAC write operation for the first arithmetic data DA1) corresponding to the first request while the operation mode of the PIM device 1100 is changed into the memory mode by the mode register set 1130 of the PIM device 1100. When the mode register set 1130 of the PIM device 1100 is set to provide the memory mode at the step 1562, the steps 1563, 1564, and 1565 may be skipped and the step 1566 described above may be executed.

Figure 44:
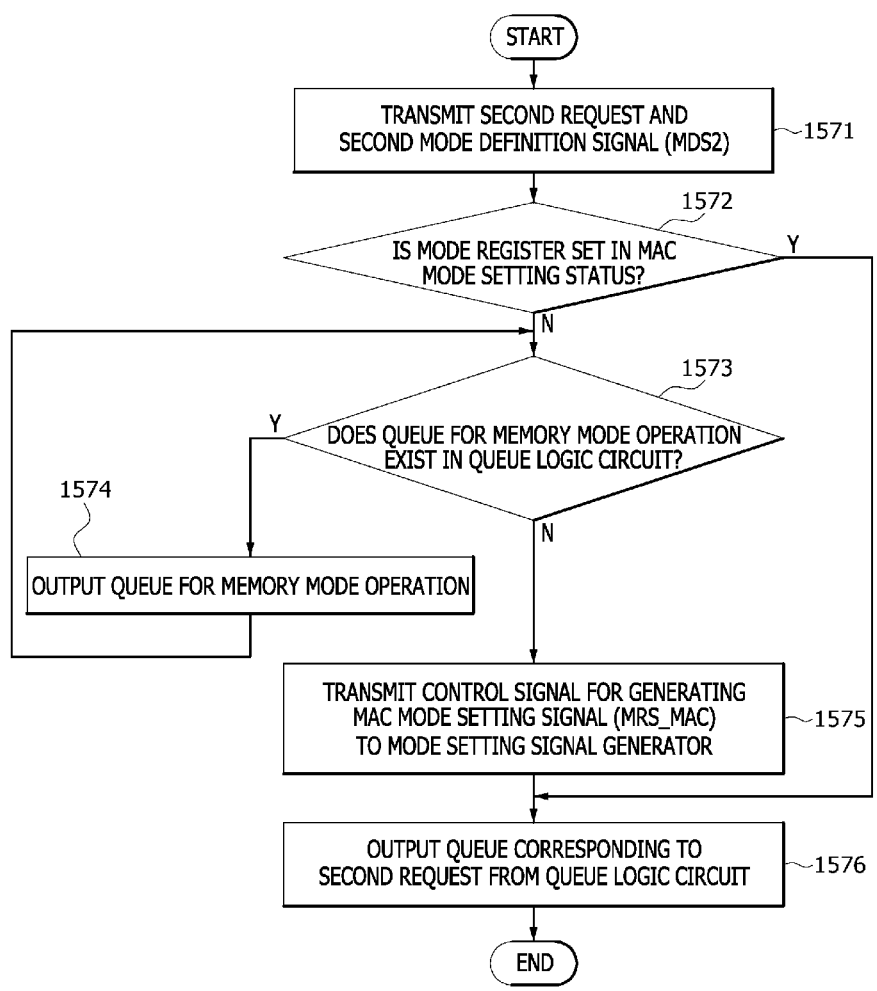
FIG. 44 is a flowchart illustrating another example of a scheduling operation performed by a scheduler included in the PIM controller illustrated in FIG. 42.

FIG. 44 is a flowchart illustrating another example of the scheduling operation performed by the scheduler 1260 included in the PIM controller 1200 illustrated in FIG. 42. Referring to FIG. 44, it may be assumed that the present embodiment corresponds to a case that a second request and the second mode definition signal MDS2 are transmitted to the scheduler 1260 through the first interface 1211 at a step 1571. At a step 1572, the scheduler 1260 may determine whether the mode register set 1130 of the PIM device 1100 is set to provide the MAC mode. This determination may be executed using a control signal transmitted to the mode setting signal generator 1230 most recently. When the mode register set 1130 of the PIM device 1100 is set to provide the memory mode at the step 1572, the scheduler 1260 may determine whether the queue for the memory mode operation exists in the queue logic circuit 1220 (e.g., the queue corresponding to the memory write request, the memory read request, or the MAC write request for the first arithmetic data DA1 exists in the queue logic circuit 1220) (see step 1573).

When the queue for the memory mode operation exists in the queue logic circuit 1220 at the step 1573, the queue for the memory mode operation may be outputted from the queue logic circuit 1220 (see step 1574). After the step 1574, the process may be fed back to the step 1573. The steps 1573 and 1574 may be iteratively executed until all of the queues for the memory mode operation are outputted from the queue logic circuit 1220. While the step 1574 is repeatedly executed, the scheduler 1260 does not transmit any control signal to the mode setting signal generator 1230. Thus, while the memory mode operation corresponding to the queues outputted from the queue logic circuit 1220 is performed by the PIM device 1100, the mode register set 1130 of the PIM device 1100 may maintain the memory mode setting status.

When the queue for the memory mode operation does not exist in the queue logic circuit 1220 at the step 1573, the scheduler 1260 may transmit the predetermined control signal to the mode setting signal generator 1230 such that the mode setting signal generator 1230 outputs the MAC mode setting signal MRS_M (see step 1575). Thus, the mode register set 1130 of the PIM device 1100 may be set to provide the MAC mode. Subsequently, the scheduler 1260 may control the queue logic circuit 1220 such that the queue logic circuit 1220 outputs the queue corresponding to the second request (see step 1576). The PIM device 1100 may perform the MAC mode operation (e.g., the MAC write operation for the second arithmetic data DA2, the MAC operation, or the MAC read operation for the arithmetic result data DA_RESULT) corresponding to the second request while the operation mode of the PIM device 1100 is changed into the MAC mode by the mode register set 1130 of the PIM device 1100. When the mode register set 1130 of the PIM device 1100 is set to provide the MAC mode at the step 1572, the steps 1573, 1574, and 1575 may be skipped and the step 1576 described above may be executed.

Figure 45:
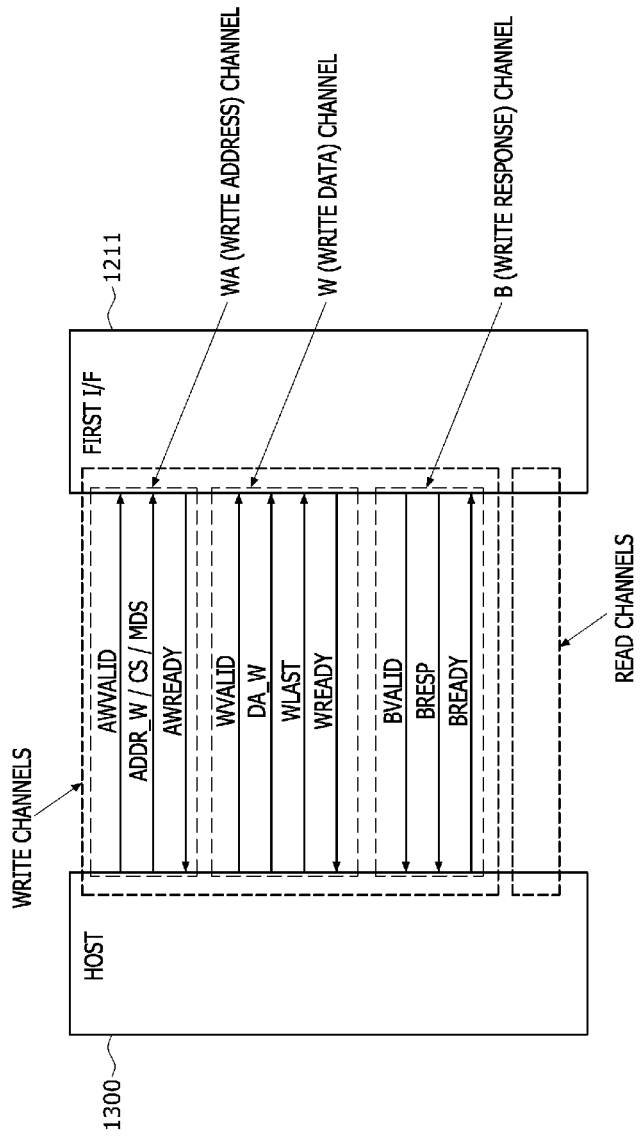
FIGS. 45 and 46 illustrate an example of a channel configuration between a host and a first interface included in the PIM controller illustrated in FIG. 42.
Figure 46:
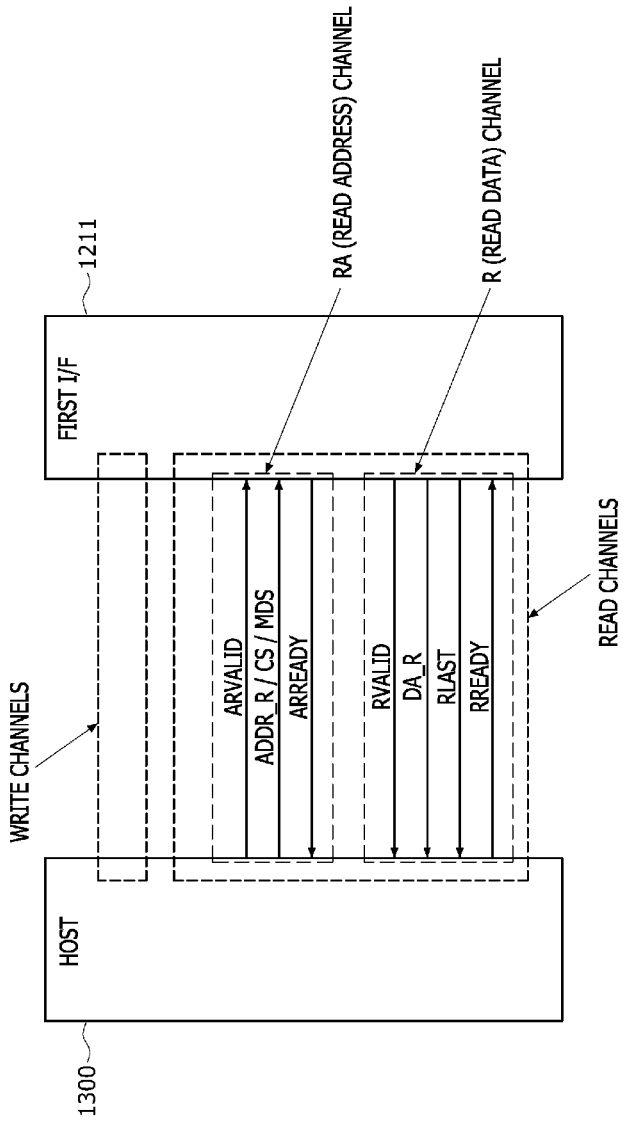

FIGS. 45 and 46 illustrate an example of a channel configuration between the host 1300 and the first interface 1211 included in the PIM controller 1200 illustrated in FIG. 42. For the purpose of ease and convenience in explanation, a detailed configuration of read channels is not illustrated in FIG. 45 and a detailed configuration of write channels is not illustrated in FIG. 46. A multi-channel network, for example, an advanced extendable interface (AXI) may be disposed between the host 1300 and the first interface 1211 of the PIM controller 1200. The multi-channel network may include the write channels and the read channels. In the multi-channel network, data transmission through the write channels may be executed separately and independently from data transmission through the read channels. In addition, a plurality of channels constituting the write channels or the read channels may also transmit signals independently. In the present embodiment, the host 1300 may function as an AXI master, and the first interface 1211 of the PIM controller 1200 may function as an AXI slave. Although not shown in the drawings, the host 1300 may include a host interface that functions as the AXI master.

First, referring to FIG. 45, the write channels may include a write address channel (WA channel), a write data channel (W channel), and a write response channel (B channel). In the present embodiment, the WA channel may be used for transmission of a write address ADDR_W, a control signal CS, and the mode definition signal MDS. Further, the W channel may be used for transmission of the write data DA_W. Furthermore, the B channel may be used for transmission of a response signal BRESP of the first interface 1211 functioning as the AXI slave. Specifically, the host 1300 may put forth a signal AWVALID transmitted to the first interface 1211 through the WA channel to provide the signal AWVALID having an active-high status. In addition, the host 1300 may transmit the write address ADDR_W, the control signal CS, and the mode definition signal MDS to the first interface 1211. In an embodiment, the control signal CS may include a burst length, a data width, and a data type. Moreover, the control signal CS may include information on whether the write request is the memory write request or the MAC write request. If the transmission of the write address ADDR_W, the control signal CS, and the mode definition signal MDS through the WA channel terminates, the signal AWVALID may be put forth to have an active-low status. The first interface 1211 may put forth a signal AWREADY to indicate to the host 1300 that the first interface 1211 is ready to receive the write data DA_W, at a point in time when a level of the signal AWVALID is changed into a low level.

If the signal AWVALID is put forth, the host 1300 may put forth a signal BREADY which is transmitted to the first interface 1211 through the B channel. In addition, the host 1300 may transmit the write data DA_W to the first interface 1211 through the W channel. While the write data DA_W is transmitted, a signal WVALID may maintain a high level. After all of the write data DA_W are transmitted from the host 1300 to the first interface 1211, the host 1300 may put forth a signal WLAST to indicate to the first interface 1211 termination of the transmission of the write data DA_W. The first interface 1211 may check the receipt of the write data DA_W and may put forth a signal BVALID which is transmitted to the host 1300 through the B channel. The host 1300 may put forth the signal BREADY at a point in time when the host 1300 is ready to receive the response signal BRESP outputted from the first interface 1211. The first interface 1211 may transmit the response signal BRESP to the host 1300 at a point in time when the signal BVALID is put forth together with the signal BREADY.

Next, referring to FIG. 46, the read channels may include a read address channel (RA channel), a read data channel (R channel). In the present embodiment, the RA channel may be used for transmission of a rea address ADDR_R, the control signal CS, and the mode definition signal MDS. The control signal CS may include information on whether the read request is the memory read request or the MAC read request. The control signal CS may include the MAC request instead of the read request. The R channel may be used for transmission of the read data DA_R. Specifically, the host 1300 may put forth a signal ARVAILD transmitted to the first interface 1211 through the RA channel to provide the signal ARVALID having an active-high status. The first interface 1211 may put forth a signal ARREADY to provide the signal ARREADY having an active-low status. The host 1300 may transmit the rea address ADDR_R, the control signal CS, and the mode definition signal MDS to the first interface 1211 at a point in time when a level of the signal ARREADY is changed into a low level while the signal ARVALID has a high level. In an embodiment, the control signal CS may include a burst length, a data width, and a data type. When the transmission of the rea address ADDR_R, the control signal CS, and the mode definition signal MDS terminates, the signal ARVAILD may be put forth to have an active-low status. The host 1300 may maintain a high level of a signal RREADY, which is transmitted to the first interface 1211 through the R channel, to indicate to the first interface 1211 that the host 1300 is ready to receive the read data DA_R. The first interface 1211 may transmit the read data DA_R to the host 1300 through the R channel. After all of the read data DA_R are transmitted from the first interface 1211 to the host 1300, the first interface 1211 may put forth a signal RLAST to provide the signal RLAST having an active-high level. In such a case, the host 1300 may change a level of the signal RREADY into a low level.

Figure 47:
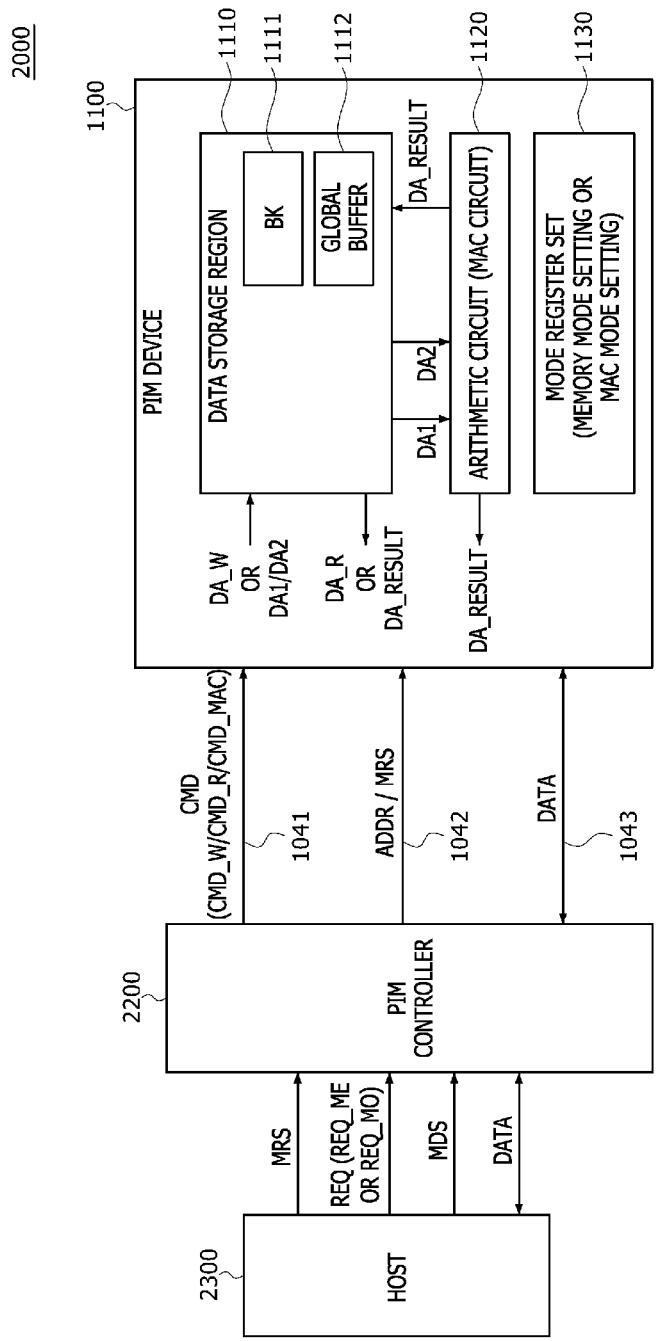
FIG. 47 is a block diagram illustrating a PIM system according to another further embodiment of the present disclosure.

FIG. 47 is a block diagram illustrating a PIM system 2000 according to another further embodiment of the present disclosure. Referring to FIG. 47, the PIM system 2000 may include the PIM device 1100, a PIM controller 2200, and a host 2300. The PIM device 1100 included in the PIM system 2000 may be designed to have substantially the same configuration as the PIM device 1100 described with reference to FIGS. 31 to 37. Thus, descriptions of the PIM device 1100 included in the PIM system 2000 will be omitted or briefly mentioned hereinafter to avoid duplicate explanation. In the PIM system 2000, the host 2300 may be configured to transmit the mode setting signal MRS to the PIM controller 2200. That is, the host 2300 may transmit the request REQ and the mode definition signal MDS to the PIM controller 2200 and may also directly generate the mode setting signal MRS to transmit the mode setting signal MRS to the PIM controller 2200 if necessary. For example, when the mode register set 1130 of the PIM device 1100 is set to provide the memory mode, the host 2300 may directly transmit the mode setting signal MRS for changing a mode status of the mode register set 1130 of the PIM device 1100 into the MAC mode setting status to the PIM controller 2200 before transmitting the request REQ for the MAC mode operation to the PIM controller 2200. Similarly, when the mode register set 1130 of the PIM device 1100 is set to provide the MAC mode, the host 2300 may directly transmit the mode setting signal MRS for changing a mode status of the mode register set 1130 of the PIM device 1100 into the memory mode setting status to the PIM controller 2200 before transmitting the request REQ for the memory mode operation to the PIM controller 2200.

Figure 48:
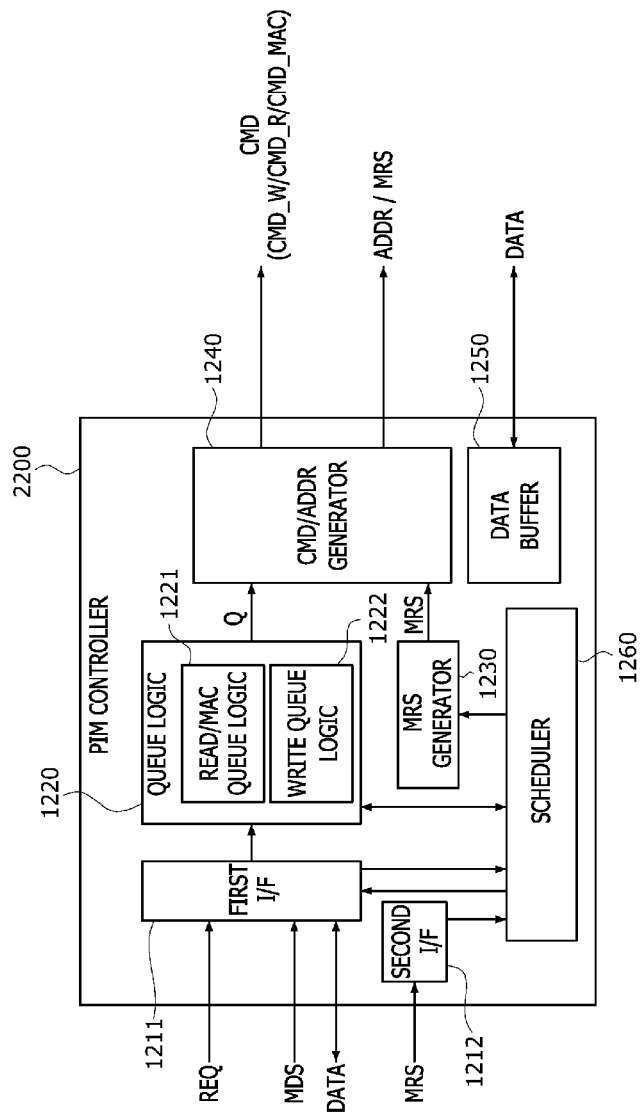
FIG. 48 is a block diagram illustrating an example of a configuration of a PIM controller included in the PIM system illustrated in FIG. 47.

FIG. 48 is a block diagram illustrating an example of a configuration of the PIM controller 2200 included in the PIM system 2000 illustrated in FIG. 47. The PIM controller 2200 may have substantially the same configuration as the PIM controller 1200 described with reference to FIG. 42 except that the PIM controller 2200 further includes a second interface 1212. Thus, the scheduling operation performed when the request REQ and the mode definition signal MDS are inputted to the PIM controller 2200 through the first interface 1211 may be the same as the scheduling operation described with reference to FIGS. 43 and 44. Accordingly, the same descriptions as described with reference to FIGS. 43 and 44 will be omitted or briefly mentioned hereinafter. Referring to FIG. 48, the PIM controller 2200 may include the first interface 1211 and the second interface 1212 which are physically distinguished from each other. As described with reference to FIG. 42, the first interface 1211 may be configured to receive the request REQ and the mode definition signal MDS from the host 2300 and to communicate with the host 2300 using the data DATA. The first interface 1211 may communicate with the host 2300 through the multi-channel network including a plurality channels that operate independently. The second interface 1212 may receive the mode setting signal MRS from the host 2300. While the first interface 1211 is configured to communicate with the host 2300 through the multi-channel network, the second interface 1212 may be configured to communicate with the host 2300 through a single channel. In an embodiment, the second interface 1212 may be configured to perform a serial access process executed through a wrapper serial port (WSP), a parallel access process executed through a wrapper parallel port (WPP), or a hybrid access process using both of the WSP and the WPP.

When the mode setting signal MRS is transmitted from the host 2300 to the second interface 1212, the second interface 1212 may transmit the mode setting signal MRS to the scheduler 1260. When the mode setting signal MRS is transmitted from the second interface 1212 to the scheduler 1260, the scheduler 1260 may perform the scheduling operation that transmits the mode setting signal MRS for changing the mode set of the mode register set 1130 of the PIM device 1100 to the PIM device 1100. Specifically, when the mode setting signal MRS is transmitted from the second interface 1212 to the scheduler 1260, the scheduler 1260 may transmit a control signal to the mode setting signal generator 1230 such that the mode setting signal generator 1230 generates and outputs the mode setting signal MRS. The scheduler 1260 may interrupt the reception operation of the first interface 1211 until the mode setting signal MRS is outputted from the PIM controller 2200. In addition, the scheduler 1260 may reactivate the reception operation of the first interface 1211 after the mode setting signal MRS is outputted from the PIM controller 2200.

Figure 49:
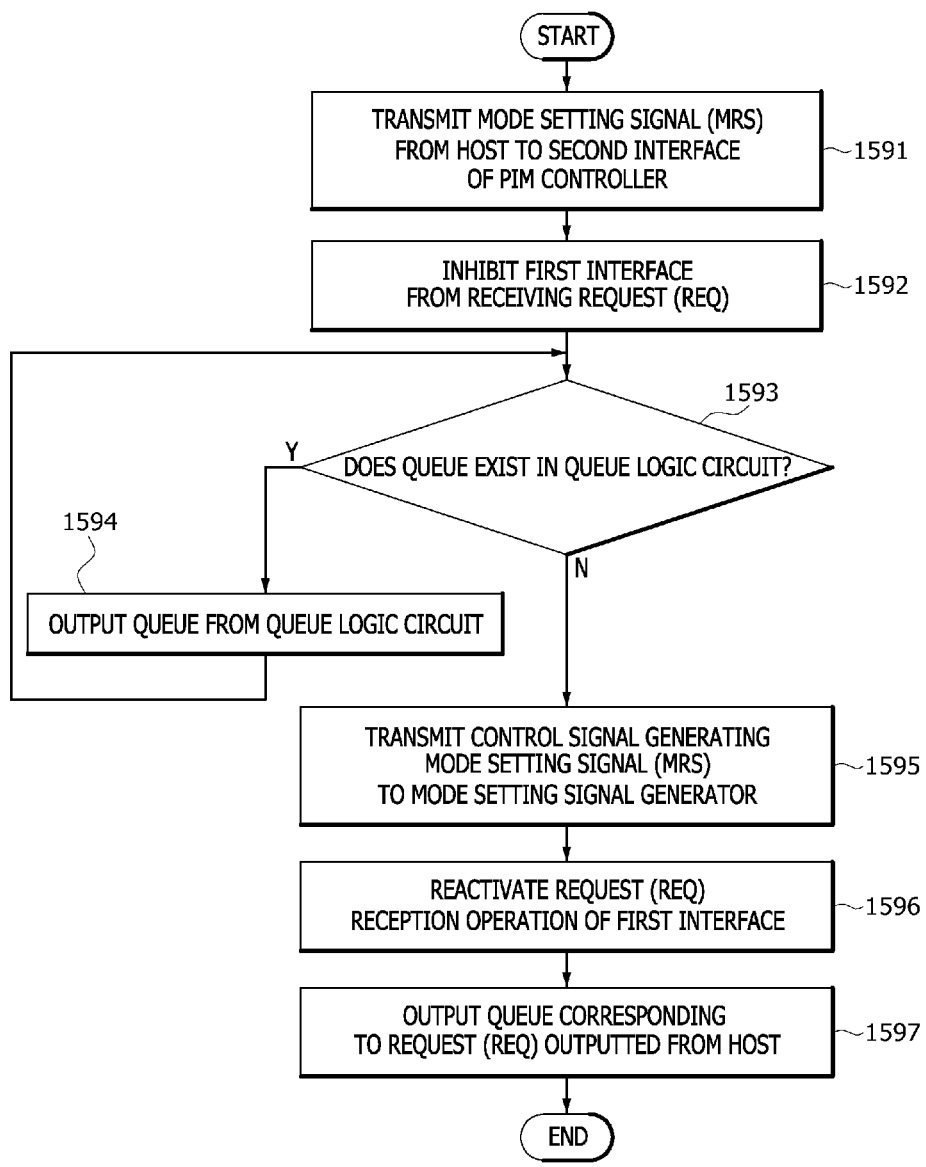
FIG. 49 is a flowchart illustrating a scheduling operation performed when a mode setting signal is generated and outputted from a host in the PIM system illustrated in FIG. 47.

FIG. 49 is a flowchart illustrating the scheduling operation performed by the scheduler 1260 when the mode setting signal MRS is generated and outputted from the host 2300 in the PIM system 2000 illustrated in FIG. 47. Referring to FIG. 49, when the mode setting signal MRS is transmitted from the host 2300 to the second interface 1212 of the PIM controller 2200 at a step 1591, the scheduler 1260 may inhibit the first interface 1211 from receiving the request REQ (see step 1592). Thus, the request REQ is not inputted to the PIM controller 2200. At a step 1593, the scheduler 1260 may determine whether the queue Q exists in the queue logic circuit 1220. When the queue Q exists in the queue logic circuit 1220 at the step 1593, the queue Q may be outputted from the queue logic circuit 1220 (see step 1594) and the process may be fed back to the step 1593. The steps 1593 and 1594 may be iteratively executed until all of the queues Q in the queue logic circuit 1220 are outputted.

When the queue Q does not exist in the queue logic circuit 1220 at the step 1593, the scheduler 1260 may transmit a control signal generating the mode setting signal MRS to the mode setting signal generator 1230 (see step 1595) and may output all of the queues Q in the queue logic circuit 1220. The mode setting signal generator 1230 may transmit the mode setting signal MRS to the command/address generator 1240. The command/address generator 1240 may transmit the mode setting signal MRS for changing a current mode set of the mode register set 1130 of the PIM device 1100 into another mode set to the PIM device 1100. When the mode setting signal MRS is transmitted from the command/address generator 1240 to the PIM device 1100, the scheduler 1260 may reactivate the request reception operation of the first interface 1211 (see step 1596). Subsequently, the scheduler 1260 may control the queue logic circuit 1220 such that the queue logic circuit 1220 outputs the queue Q corresponding to the request REQ outputted from the host 2300 (see step 1597).

Figure 50:
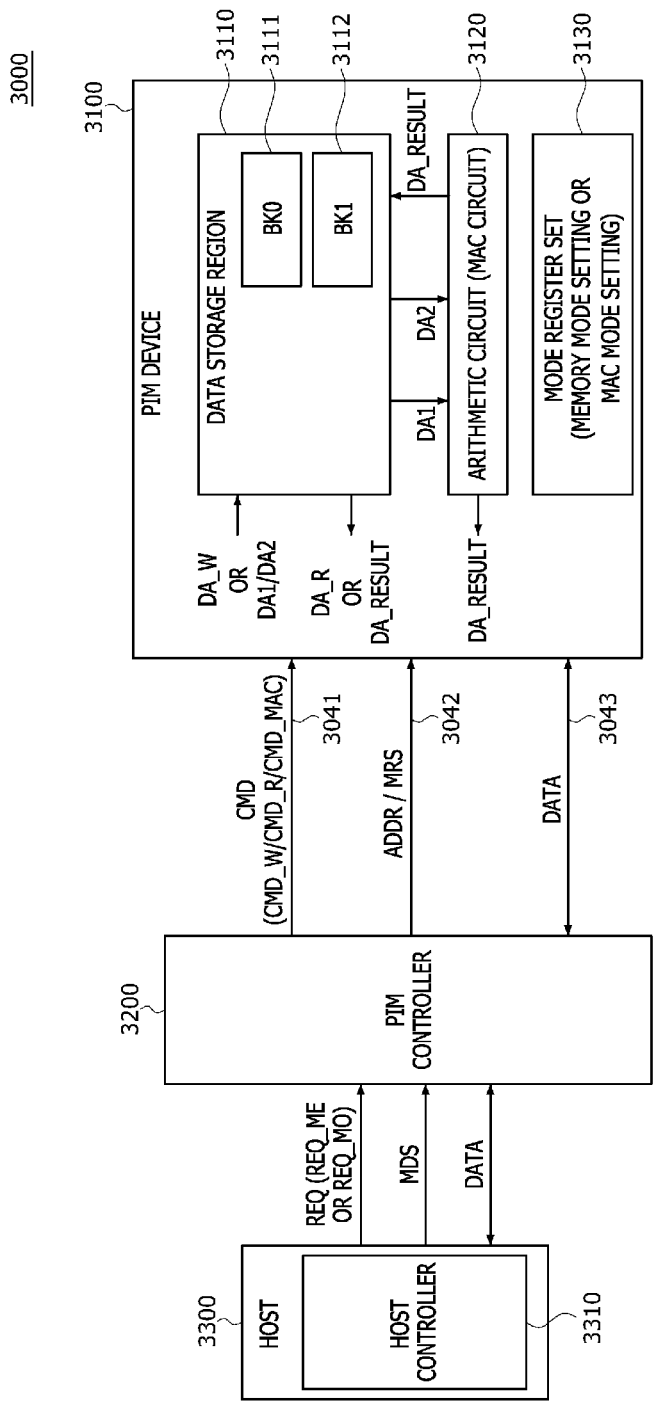
FIG. 50 is a block diagram illustrating a PIM system according to still another further embodiment of the present disclosure.

FIG. 50 is a block diagram illustrating a PIM system 3000 according to still another further embodiment of the present disclosure. Referring to FIG. 50, the PIM system 3000 may include a PIM device 3100, a PIM controller 3200, and a host 3300. The PIM device 3100 may perform a memory access operation and a MAC operation. The PIM device 3100 may perform at least one of a memory write operation and a memory read operation during the memory access operation. The PIM device 3100 may perform a MAC write operation for first arithmetic data DA1 and second arithmetic data DA2, a MAC arithmetic operation for the first arithmetic data DA1 and the second arithmetic data DA2, and a MAC read operation for arithmetic result data generated by the MAC arithmetic operation during the MAC operation. The PIM controller 3200 may be configured to control operations of the PIM device 3100. The control operation performed by the PIM controller 3200 may be executed in response to a request REQ outputted from the host 3300. The PIM controller 3200 may receive data DATA from the PIM device 3100 or output the data DATA to the PIM device 3100. In addition, the PIM controller 3200 may also receive the data DATA from the host 3300 or output the data DATA to the host 3300. The host 3300 may be configured to transmit the request REQ for a specific operation of the PIM device 3100 to the PIM controller 3200 according to requirement or programs provided by users. The host 3300 may include a host controller 3310.

Specifically, the PIM device 3100 may include a data storage region 3110, an arithmetic circuit 3120 functioning as a MAC circuit, and a mode register set 3130. In the present embodiment, it may be assumed that the data storage region 3110 includes a plurality of memory banks. That is, in the PIM system 3000, no global buffer may be included in the data storage region 3110 of the PIM device 3100. The plurality of memory banks may include a first memory bank (BK0) 3111 and a second memory bank (BK1) 3112. The PIM device 3100 may store write data DA_W provided by an external device (e.g., the PIM controller 3200) into the first memory bank 3111 and the second memory bank 3112 of the data storage region 3110. The PIM device 3100 may store the first arithmetic data DA1 and the second arithmetic data DA2 provided by the PIM controller 3200 into respective ones of the first memory bank 3111 and the second memory bank 3112. The PIM device 3100 may transmit read data DA_R or arithmetic result data DA_RESULT stored in the first and second memory banks 3111 and 3112 of the data storage region 3110 to the PIM controller 3200. In addition, the PIM device 3100 may transmit the first arithmetic data DA1 and the second arithmetic data DA2, which are stored in respective ones of the first and second memory banks 3111 and 3112 of the data storage region 3110, to the arithmetic circuit 3120.

The arithmetic circuit 3120 may be configured to receive the first arithmetic data DA1 and the second arithmetic data DA2 from respective ones of the first memory bank 3111 and the second memory bank 3112 included in the data storage region 3110 and may be configured to perform a MAC arithmetic operation (hereinafter, also referred to as a 'MAC operation') for the first arithmetic data DA1 and the second arithmetic data DA2. The PIM device 3100 may transmit the arithmetic result data DA_RESULT generated by the arithmetic circuit 3120 to the PIM controller 3200 or to the first and second memory banks 3111 and 3112 of the data storage region 3110. The arithmetic circuit 3120 may include a plurality of multipliers and a plurality of adders for performing the MAC arithmetic operation for the first arithmetic data DA1 and the second arithmetic data DA2 which are outputted from the data storage region 3110.

The mode register set 3130 may be configured to set various set values which are related to the memory access operation and the MAC operation of the PIM device 3100. The memory access operation and the MAC operation of the PIM device 3100 may be performed based on the set values which are set by the mode register set 3130. The mode register set 3130 may set an operation mode of the PIM device 13100 as a memory mode or a MAC mode. In the memory mode, the mode register set 3130 may have various set values related to execution of the memory mode operation of the PIM device 3100. In the MAC mode, the mode register set 3130 may have various set values related to execution of the MAC mode operation of the PIM device 3100. Thus, in order that the memory mode operation of the PIM device 3100 is appropriately performed, it may be necessary that the memory mode is set by the mode register set 3130. In addition, in order that the MAC mode operation of the PIM device 3100 is appropriately performed, it may be necessary that the MAC mode is set by the mode register set 3130. The mode setting of the mode register set 3130 may be executed by a mode setting signal MRS outputted from the PIM controller 3200.

The PIM controller 3200 may transmit a command CMD and an address ADDR to the PIM device 3100 to control an operation of the PIM device 3100. The PIM controller 3200 may transmit the mode setting signal MRS for changing a mode set of the mode register set 3130 of the PIM device 3100 to the PIM device 3100. The PIM controller 3200 may transmit the data DATA to the PIM device 3100 or receive the data DATA from the PIM device 3100. The command CMD may be transmitted through a command transmission line 3041 coupled between the PIM device 3100 and the PIM controller 3200. The address ADDR and the mode setting signal MRS may be transmitted through an address transmission line 3042. Although the command transmission line 3041 and the address transmission line 3042 are separated from each other in the present embodiment, the present embodiment may be merely an example provided for the purpose of ease and convenience in explanation. Thus, in some other embodiments, the command CMD, the address ADDR, and the mode setting signal MRS may be transmitted through a single command/address transmission line. The data DATA may be transmitted through a data transmission line 3043 between the PIM device 3100 and the PIM controller 3200.

The command CMD transmitted from the PIM controller 3200 to the PIM device 3100 may control the memory access operation or the MAC operation of the PIM device 3100. The command CMD may be a write command CMD_W controlling the write operation of the PIM device 3100, a read command CMD_R controlling the read operation of the PIM device 3100, or a MAC command CMD_MAC controlling the MAC operation of the arithmetic circuit 3120 of the PIM device 3100. The write operation performed by the PIM device 3100 based on the write command CMD_W may be executed in the memory mode according to the mode setting status of the mode register set 3130. The read operation performed by the PIM device 3100 based on the read command CMD_R may be executed in the memory mode or the MAC mode according to the mode setting status of the mode register set 3130. The MAC operation performed by the PIM device 3100 based on the MAC command CMD_MAC may be executed in the MAC mode which is set according to the MAC mode setting status of the mode register set 3130.

The address ADDR transmitted from the PIM controller 3200 to the PIM device 3100 may designate specific locations in the first and second memory banks 3111 and 3112 constituting the data storage region 3110 of the PIM device 3100. For example, the address ADDR transmitted with the write command CMD_W may designate locations in the first memory bank 3111 and the second memory bank 3112, in which the write data transmitted from the PIM controller 3200 to the PIM device 3100 are stored. In addition, the address ADDR transmitted with the read command CMD_R may designate locations in the first memory bank 3111 and the second memory bank 3112, in which the read data are stored. Although not shown in the drawings, the address ADDR may include a bank address, a row address, and a column address.

The mode setting signal MRS transmitted from the PIM controller 3200 to the PIM device 3100 may control the mode setting operation of the mode register set 3130. That is, the mode register set 3130 of the PIM device 3100 may set the operation mode of the PIM device 3100 as the memory mode or the MAC mode according to the mode setting signal MRS transmitted from the PIM controller 3200 to the PIM device 3100. The command CMD transmitted from the PIM controller 3200 to the PIM device 3100 may be a command for the memory access operation or the MAC operation of the PIM device 3100. The PIM controller 3200 may transmit the mode setting signal MRS to the PIM device 3100 to change the mode setting status of the mode register set 3130 before the command CMD is transmitted from the PIM controller 3200 to the PIM device 3100 according to the command CMD.

The memory access operation of the PIM device 3100 may include the write operation and the read operation that access to the first and second memory banks 3111 and 3112 included in the data storage region 3110. Thus, the memory access operation may correspond to a memory mode operation which is performed while the mode register set 3130 sets the operation mode of the PIM device 3100 as the memory mode. The PIM controller 3200 may transmit the mode setting signal MRS for changing the MAC mode into the memory mode to the PIM device 3100 to change the operation mode of the PIM device 3100 into the memory mode when the operation mode of the PIM device 3100 is set as the MAC mode by the mode register set 3130 before the PIM controller 3200 transmits the command CMD for controlling the memory access operation of the PIM device 3100 to the PIM device 3100. If the operation mode of the PIM device 3100 is set as the memory mode by the mode register set 3130 before the PIM controller 3200 transmits the command CMD for controlling the memory access operation of the PIM device 3100 to the PIM device 3100, the PIM controller 3200 may transmit the command CMD to the PIM device 3100 without transmitting the mode setting signal MRS to the PIM device 3100.

The MAC operation of the PIM device 3100 may be performed in the memory mode or in the MAC mode. The PIM controller 3200 may determine whether the MAC operation of the PIM device 3100 is performed in the memory mode or in the MAC mode, based on a mode definition signal MDS transmitted from the host 3300 to the PIM controller 3200. In either case, the PIM controller 3200 may transmit the command CMD to the PIM device 3100 without transmitting the mode setting signal MRS to the PIM device 3100 if the mode setting status of the mode register set 3130 is consistent with a mode of the command CMD to be transmitted to the PIM device 3100 before the PIM controller 3200 transmits the command CMD for controlling the MAC operation of the PIM device 3100 to the PIM device 3100. In contrast, if the mode setting status of the mode register set 3130 is inconsistent with a mode of the command CMD to be transmitted to the PIM device 3100 before the PIM controller 3200 transmits the command CMD for controlling the MAC operation of the PIM device 3100 to the PIM device 3100, the PIM controller 3200 may transmit the mode setting signal MRS to the PIM device 3100 to change the mode setting status of the mode register set 3130.

The PIM controller 3200 of the PIM system 3000 according to the present embodiment may have substantially the same configuration as the PIM controller 1200 described with reference to FIG. 42. Thus, the PIM controller 3200 may perform substantially the same operation as the PIM controller 1200 described with reference to FIGS. 42 to 44. In addition, the PIM controller 3200 may also have substantially the same configuration as the PIM controller 2200 described with reference to FIG. 48. Thus, the operation of the PIM controller 3200 performed when the mode setting signal MRS is directly transmitted from the host 3300 to the PIM controller 3200 may be substantially the same as the operation of the PIM controller 2200 described with reference to FIG. 49.

The host 3300 may transmit the request REQ requesting a specific operation of the PIM device 3100 and the mode definition signal MDS to the PIM controller 3200. The PIM controller 3200 may transmit the command CMD corresponding to the request REQ outputted from the host 3300 and the address ADDR to the PIM device 3100. The mode definition signal MDS may include information on whether the request REQ transmitted from the host 3300 to the PIM controller 3200 requests the memory mode operation or the MAC mode operation of the PIM device 3100. The PIM controller 3200 may transmit the mode setting signal MRS controlling the mode setting status of the mode register set 3130 to the PIM device 3100 in response to the mode definition signal MDS outputted from the host 3300.

The request REQ transmitted from the host 3300 to the PIM controller 3200 may be any one of a memory access operation request REQ_ME and a MAC operation request REQ_MO. The memory access operation request REQ_ME may be defined as a request instructing an operation performed by the PIM device 3100 when the PIM device 3100 is used as a memory device. Thus, the memory access operation request REQ_ME may instruct the PIM controller 3200 to access to the first and second banks 3111 and 3112 of the data storage region 3110 included in the PIM device 3100 and to receive the data from the PIM device 3100 or to store the data into the PIM device 3100. The memory access operation request REQ_ME may include a memory write request instructing the write operation of the PIM device 3100 and a memory read request instructing the read operation of the PIM device 3100. The MAC operation request REQ_MO may be defined as a request instructing execution of an operation related to the MAC arithmetic operation of the PIM device 3100. The MAC operation request REQ_MO may include a MAC write request instructing an arithmetic data storage operation of the PIM device 3100, a MAC request instructing the MAC arithmetic operation of the PIM device 3100, and a MAC read request instructing the read operation for MAC result data generated by the MAC arithmetic operation. The host 3300 may transmit the request REQ together with the mode definition signal MDS defining an operation mode of the PIM device 3100 performing an operation corresponding to the request REQ to the PIM controller 3200.

As described above, the memory access operation of the PIM device 3100 is performed in the memory mode which is set by the mode register set 3130. In contrast, the MAC operation of the PIM device 3100 may be performed in the memory mode or the MAC mode which is set by the mode register set 3130. For example, at least one of various operations included in the MAC operation may be performed in the same way as the memory access operation. In such a case, the MAC operation may be performed while the mode register set 3130 is set to provide the memory mode.

The memory write operation and the memory read operation of the memory access operation of the PIM system 3000 may be performed in the same ways as the memory write operation and the memory read operation described with reference to FIGS. 32 and 33, respectively. Further, the MAC write operation for the first arithmetic data DA1 belonging to the MAC operation of the PIM system 3000 may be performed in the same way as the MAC write operation for the first arithmetic data DA1 described with reference to FIG. 35. Furthermore, the MAC read operation for the arithmetic result data DA_RESULT belonging to the MAC operation of the PIM system 3000 may be performed in the same way as the MAC read operation for the arithmetic result data DA_RESULT described with reference to FIG. 37. Thus, only some operations of the PIM system 3000 different from the operations of the PIM system 1000 illustrated in FIG. 31 will be described hereinafter with reference to FIGS. 51 and 52.

Figure 51:
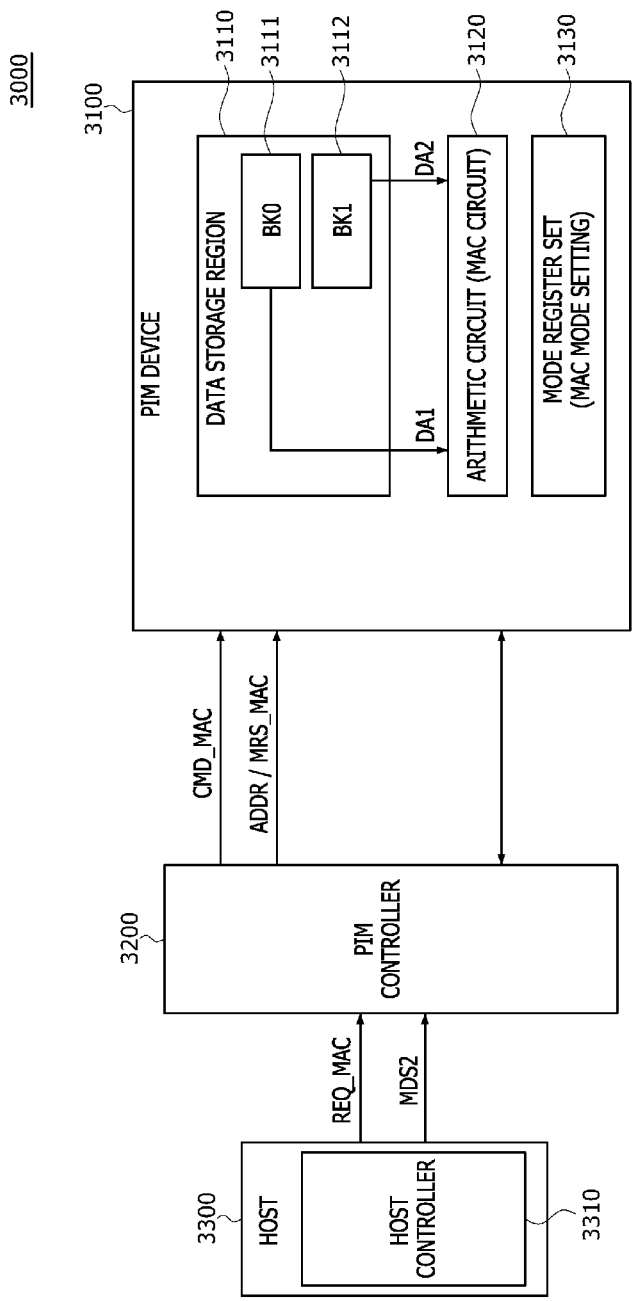
FIG. 51 illustrates an example of a MAC arithmetic operation performed by an arithmetic circuit in a MAC operation of a PIM device included in the PIM system illustrated in FIG. 50.

FIG. 51 illustrates an example of the MAC arithmetic operation performed by the arithmetic circuit 3120 in the MAC operation of the PIM device 3100 included in the PIM system 3000 illustrated in FIG. 50. In FIG. 51, the same reference numerals or the same reference symbols as used in FIG. 50 denote the same elements. Referring to FIG. 51, the MAC arithmetic operation of the arithmetic circuit 3120 included in the PIM device 3100 may correspond to an arithmetic operation performed by the arithmetic circuit 3120. The MAC arithmetic operation of the arithmetic circuit 3120 may correspond to the MAC mode operation of the PIM device 3100. Thus, the MAC arithmetic operation of the arithmetic circuit 3120 is performed while the mode register set 3130 is set to provide the MAC mode. In the present embodiment, it may be assumed that the MAC arithmetic operation of the arithmetic circuit 3120 is performed while the first arithmetic data DA1 and the second arithmetic data DA2 are stored in respective ones of the first memory bank 3111 and the second memory bank 3112 included in the data storage region 3110.

In order to perform the MAC arithmetic operation of the arithmetic circuit 3120, the host 3300 may transmit a MAC request REQ_MAC and a second mode definition signal MDS2 to the PIM controller 3200. The PIM controller 3200 may regard the MAC request REQ_MAC outputted from the host 3300 as a request for the MAC mode operation based on the second mode definition signal MDS2. The PIM controller 3200 may generate a MAC command CMD_MAC and an address ADDR that correspond to the MAC request REQ_MAC. The PIM controller 3200 may determine whether the mode register set 3130 of the PIM device 3100 is set to provide the MAC mode before transmitting the MAC command CMD_MAC to the PIM device 3100.

When the mode register set 3130 of the PIM device 3100 is set to provide the MAC mode, the PIM controller 3200 may transmit the MAC command CMD_MAC to the PIM device 3100 without transmitting the mode setting signal MRS to the PIM device 3100. In such a case, the arithmetic circuit 3120 of the PIM device 3100 may perform the MAC arithmetic operation based on the MAC command CMD_MAC without changing the operation mode. Specifically, the arithmetic circuit 3120 of the PIM device 3100 may receive the first arithmetic data DA1 and the second arithmetic data DA2 from respective ones of the first memory bank 3111 and the second memory bank 3112 of the data storage region 3110. The arithmetic circuit 3120 may perform the MAC arithmetic operation for the first arithmetic data DA1 and the second arithmetic data DA2 to generate MAC result data.

When the mode register set 3130 of the PIM device 3100 is set to provide the memory mode before the MAC command CMD_MAC is transmitted to the PIM device 3100, the PIM controller 3200 may transmit the MAC command CMD_MAC to the PIM device 3100 after transmitting a MAC mode setting signal MRS_MAC corresponding to the mode setting signal MRS to the PIM device 3100. The PIM device 3100 may control the mode register set 3130 in response to a MAC mode setting signal MRS_MAC outputted from the PIM controller 3200 such that the mode register set 3130 is set to provide the MAC mode. Subsequently, the arithmetic circuit 3120 of the PIM device 3100 may perform the MAC arithmetic operation based on the MAC command CMD_MAC outputted from the PIM controller 3200.

Figure 52:
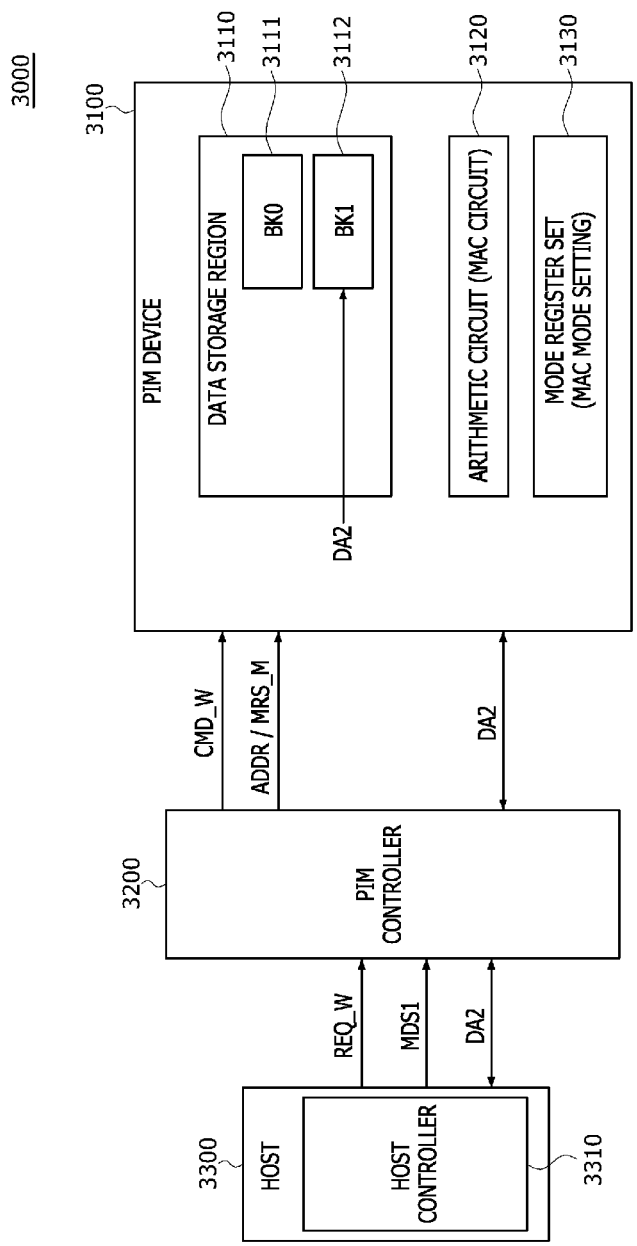
FIG. 52 illustrates an example of a MAC write operation for second arithmetic data in a MAC operation of a PIM device included in the PIM system illustrated in FIG. 50.

FIG. 52 illustrates an example of the MAC write operation for the second arithmetic data DA2 during the MAC operation of the PIM device 3100 included in the PIM system 3000 illustrated in FIG. 50. In FIG. 52, the same reference numerals or the same reference symbols as used in FIG. 50 denote the same elements. Referring to FIG. 52, the MAC write operation for the second arithmetic data DA2 performed by the PIM device 3100 may correspond to an operation for storing the second arithmetic data DA2 outputted from the PIM controller 3200 into the second memory bank 3112 of the data storage region 3110. The MAC write operation for the second arithmetic data DA2 performed by the PIM device 3100 may correspond to the memory access operation of the PIM device 3100. Thus, the MAC write operation for the second arithmetic data DA2 may belong to the memory mode operation. Accordingly, the MAC write operation for the second arithmetic data DA2 performed by the PIM device 3100 is performed in the memory mode which is set by the mode register set 3130 of the PIM device 3100.

In order to perform the MAC write operation for the second arithmetic data DA2 of the PIM device 3100, the host 3300 may transmit a write request REQ_W and the first mode definition signal MDS1 to the PIM controller 3200. The host 3300 may also transmit the second arithmetic data DA2 to the PIM controller 3200. The PIM controller 3200 may regard the write request REQ_W outputted from the host 3300 as a request for the memory mode operation based on the first mode definition signal MDS1. The PIM controller 3200 may generate the write command CMD_W and the address ADDR that correspond to the write request REQ_W. The PIM controller 3200 may determine whether the mode register set 3130 of the PIM device 3100 is set to provide the MAC mode before transmitting the write command CMD_W to the PIM device 3100.

The PIM controller 3200 may identify a current operation mode of the PIM device 3100 based on the mode setting signal MRS transmitted to the PIM device 3100 most recently. When the mode register set 3130 of the PIM device 3100 is set to provide the memory mode, the PIM controller 3200 may transmit the write command CMD_W to the PIM device 3100 without transmitting the mode setting signal MRS to the PIM device 3100. In such a case, the PIM device 3100 may store the second arithmetic data DA2 into the second memory bank 3112 based on the write command CMD_W without changing the operation mode. When the mode register set 3130 of the PIM device 3100 is set to provide the MAC mode, the PIM controller 3200 may transmit the write command CMD_W to the PIM device 3100 after transmitting a memory mode setting signal MRS_M corresponding to the mode setting signal MRS to the PIM device 3100. The PIM device 3100 may control the mode register set 3130 in response to a memory mode setting signal MRS_M outputted from the PIM controller 3200 such that the mode register set 3130 is set to provide the memory mode. Subsequently, the PIM device 3100 may store the second arithmetic data DA2 into the second memory bank 3112 in response to the write command CMD_W outputted from the PIM controller 3200.

FIG. 53 is a table illustrating various signals transmitted among the host 3300, the PIM controller 3200, and the PIM device 3100 included in the PIM system 3000 illustrated in FIG. 50, various operations of the PIM device 3100 according to the various signals, and various mode statuses of the mode register set 3130 according to the various signals. Referring to FIG. 53, the request REQ transmitted from the host 3300 to the PIM controller 3200 may be one of a write request REQ_W, a read request REQ_R, and the MAC request REQ_MAC. The write request REQ_W may belong to any one of the memory access operation request REQ_ME and the MAC operation request REQ_MO. When the write request REQ_W belongs to the memory access operation request REQ_ME, the host 3300 may transmit the first mode definition signal MDS1 with the write request REQ_W to the PIM controller 3200. The PIM controller 3200 may transmit the write command CMD_W to the PIM device 3100. When the mode register set 3130 of the PIM device 3100 is set to provide the MAC mode, the PIM controller 3200 may transmit the memory mode setting signal MRS_M to the PIM device 3100 before transmitting the write command CMD_W to the PIM device 3100. The PIM device 3100 may perform the memory write operation while the mode register set 3130 is set to provide the memory mode.

The write request REQ_W belonging to the MAC operation request REQ_MO may be categorized as either the write request REQ_W for the first arithmetic data DA1 or the write request REQ_W for the second arithmetic data DA2. In the present embodiment, the first arithmetic data DA1 and the second arithmetic data DA2 may be stored into the first memory bank 3111 and the second memory bank 3112, respectively. Thus, the write request REQ_W for each of the first arithmetic data DA1 and the second arithmetic data DA2 may be processed in the same way as the write request REQ_W belonging to the memory access operation request REQ_ME. That is, the PIM device 3100 may perform the MAC write operations for the first arithmetic data DA1 and the second arithmetic data DA2 based on the write requests REQ_W for the first arithmetic data DA1 and the second arithmetic data DA2 while the mode register set 3130 is set to provide the memory mode.

The read request REQ_R may also belong to any one of the memory access operation request REQ_ME and the MAC operation request REQ_MO. When the read request REQ_R belongs to the memory access operation request REQ_ME, the host 3300 may transmit the first mode definition signal MDS1 with the read request REQ_R to the PIM controller 3200. The PIM controller 3200 may transmit the read command CMD_R to the PIM device 3100. When the mode register set 3130 of the PIM device 3100 is set to provide the MAC mode, the PIM controller 3200 may transmit the memory mode setting signal MRS_M to the PIM device 3100 before transmitting the read command CMD_R to the PIM device 3100. The PIM device 3100 may perform the memory read operation while the mode register set 3130 is set to provide the memory mode.

When the read request REQ_R belongs to the MAC operation request REQ_MO, the host 3300 may transmit the second mode definition signal MDS2 with the read request REQ_R to the PIM controller 3200. The PIM controller 3200 may transmit the read command CMD_R to the PIM device 3100. Meanwhile, when the mode register set 3130 of the PIM device 3100 is set to provide the memory mode, the PIM controller 3200 may transmit the MAC mode setting signal MRS_MAC to the PIM device 3100 before transmitting the read command CMD_R to the PIM device 3100. The PIM device 3100 may perform the MAC read operation for arithmetic result data DA_RESULT generated by the MAC operation while the mode register set 3130 is set to provide the MAC mode.

In case of the MAC request REQ_MAC belonging to the MAC operation request REQ_MO, the host 3300 may transmit the second mode definition signal MDS2 with the MAC request REQ_MAC to the PIM controller 3200. The PIM controller 3200 may then transmit the MAC command CMD_MAC to the PIM device 3100. When the mode register set 3130 of the PIM device 3100 is set to provide the memory mode, the PIM controller 3200 may transmit the MAC mode setting signal MRS_MAC to the PIM device 3100 before transmitting the MAC command CMD_MAC to the PIM device 3100. The PIM device 3100 may perform the MAC operation while the mode register set 3130 is set to provide the MAC mode.

Figure 54:
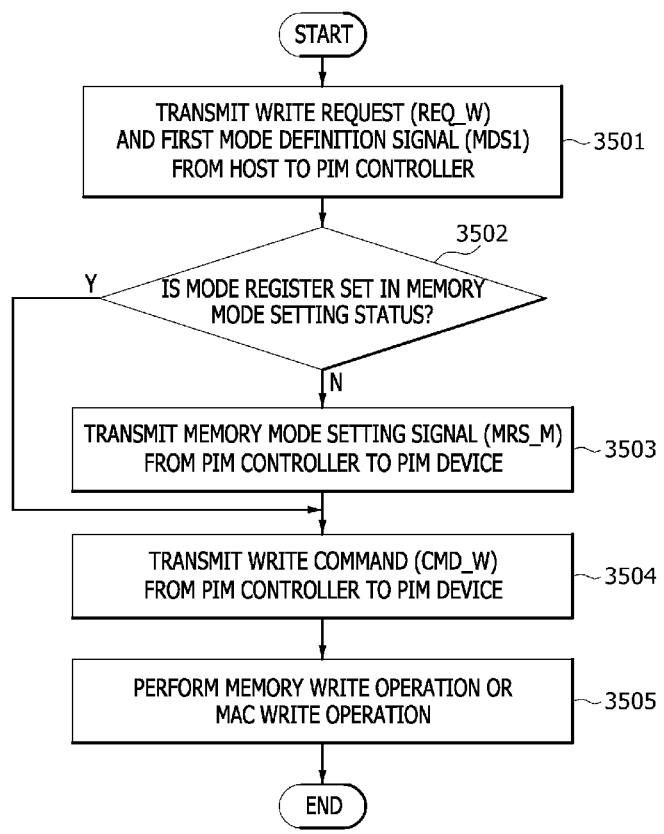
FIG. 54 is a flowchart illustrating an operation performed when a write request and a first mode definition signal are generated by a host of the PIM system illustrated in FIG. 50.

FIG. 54 is a flowchart illustrating an operation performed when the write request REQ_W and the first mode definition signal MDS1 are generated by the host 3300 of the PIM system 3000 illustrated in FIG. 50. Referring to FIGS. 50 and 54, when the write request REQ_W and the first mode definition signal MDS1 are transmitted from the host 3300 to the PIM controller 3200 at a step 3501, the PIM controller 3200 may determine whether the mode register set 3130 of the PIM device 3100 is set to provide the memory mode (see step 3502). When the mode register set 3130 of the PIM device 3100 is not set to provide the memory mode at the step 3502, the PIM controller 3200 may transmit the memory mode setting signal MRS_M to the PIM device 3100 (see step 3503). Thus, the mode register set 3130 of the PIM device 3100 may be set to provide the memory mode. Thereafter, the PIM controller 3200 may transmit the write command CMD_W to the PIM device 3100 (see step 3504). When the mode register set 3130 of the PIM device 3100 is set to provide the memory mode at the step 3502, the step 3503 may be skipped and the step 3504 may be executed. Subsequently, the PIM device 3100 may perform the memory write operation, the MAC write operation for the first arithmetic data DA1, or the MAC write operation for the second arithmetic data DA2 in response to the write command CMD_W (see step 3505).

Figure 55:
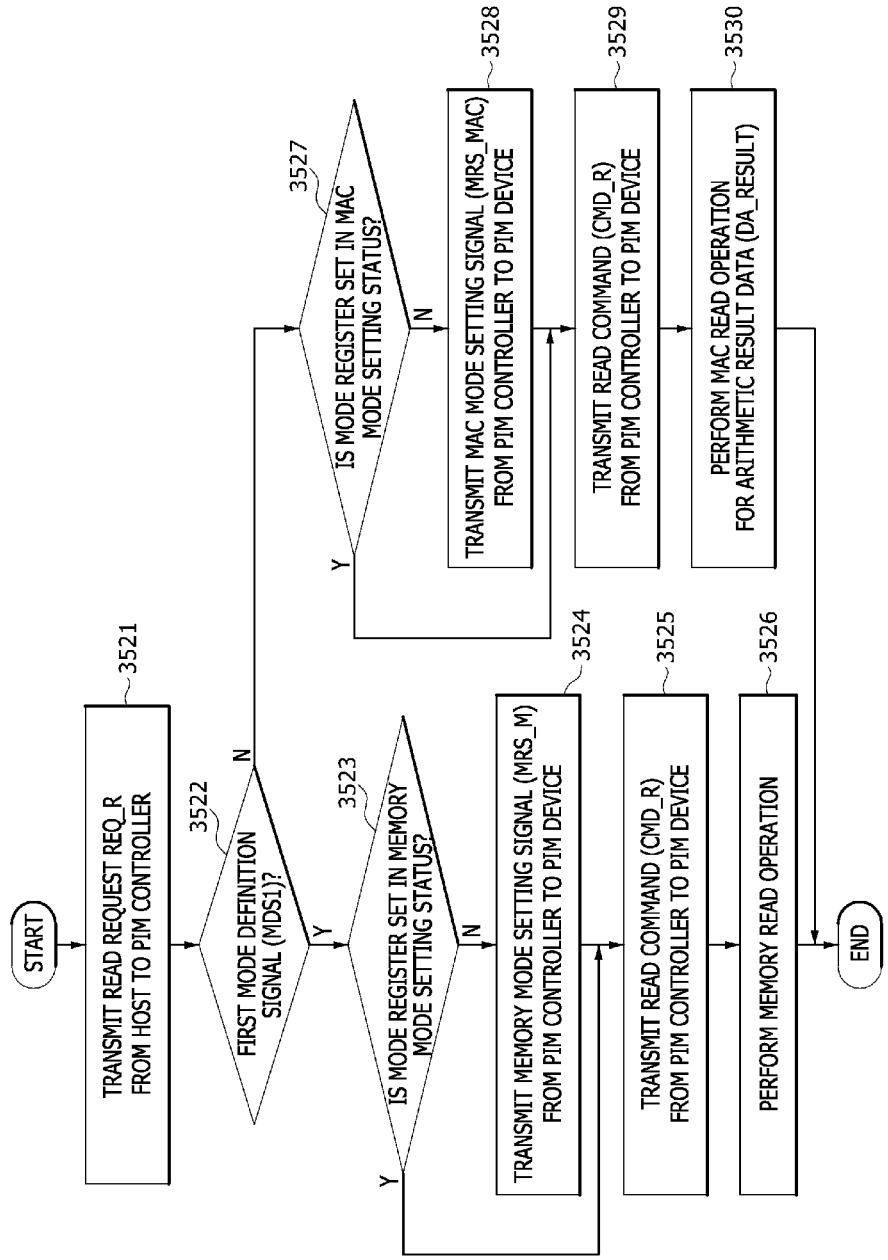
FIG. 55 is a flowchart illustrating an operation performed when a read request is generated by a host of the PIM system illustrated in FIG. 50.

FIG. 55 is a flowchart illustrating an operation performed when the read request REQ_R is generated by the host 3300 of the PIM system 3000 illustrated in FIG. 50. Referring to FIGS. 50 and 55, when the read request REQ_R is transmitted from the host 3300 to the PIM controller 3200 at a step 3521, the PIM controller 3200 may determine whether the mode definition signal MDS transmitted to the PIM controller 3200 with the read request REQ_R is the first mode definition signal MDS1 (see step 3522). When the first mode definition signal MDS1 is transmitted from the host 3300 to the PIM controller 3200 at the step 3522, the PIM controller 3200 may determine whether the mode register set 3130 of the PIM device 3100 is set to provide the memory mode (see step 3523). When the mode register set 3130 of the PIM device 3100 is not set to provide the memory mode at the step 3523, the PIM controller 3200 may transmit the memory mode setting signal MRS_M to the PIM device 3100 (see step 3524). Thus, the mode register set 3130 of the PIM device 3100 may be set to provide the memory mode. Thereafter, the PIM controller 3200 may transmit the read command CMD_R to the PIM device 3100 (see step 3525). When the mode register set 3130 of the PIM device 3100 is set to provide the memory mode at the step 3523, the step 3524 may be skipped and the step 3525 may be executed.

Subsequently, the PIM device 3100 may perform the memory read operation in response to the read command CMD_R (see step 3526).

When the first mode definition signal MDS1 is not transmitted from the host 3300 to the PIM controller 3200 at the step 3522 (i.e., the second mode definition signal MDS2 is transmitted from the host 3300 to the PIM controller 3200 at the step 3522), the PIM controller 3200 may determine whether the mode register set 3130 of the PIM device 3100 is set to provide the MAC mode (see step 3527). When the mode register set 3130 of the PIM device 3100 is not set to provide the MAC mode at the step 3527, the PIM controller 3200 may transmit the MAC mode setting signal MRS_MAC to the PIM device 3100 (see step 3528). Thus, the mode register set 3130 of the PIM device 3100 may be set to provide the MAC mode. Thereafter, the PIM controller 3200 may transmit the read command CMD_R to the PIM device 3100 (see step 3529). When the mode register set 3130 of the PIM device 3100 is set to provide the MAC mode at the step 3527, the step 3528 may be skipped and the step 3529 may be executed. Subsequently, the PIM device 3100 may perform the MAC read operation for the arithmetic result data DA_RESULT in response to the read command CMD_R (see step 3530).

Figure 56:
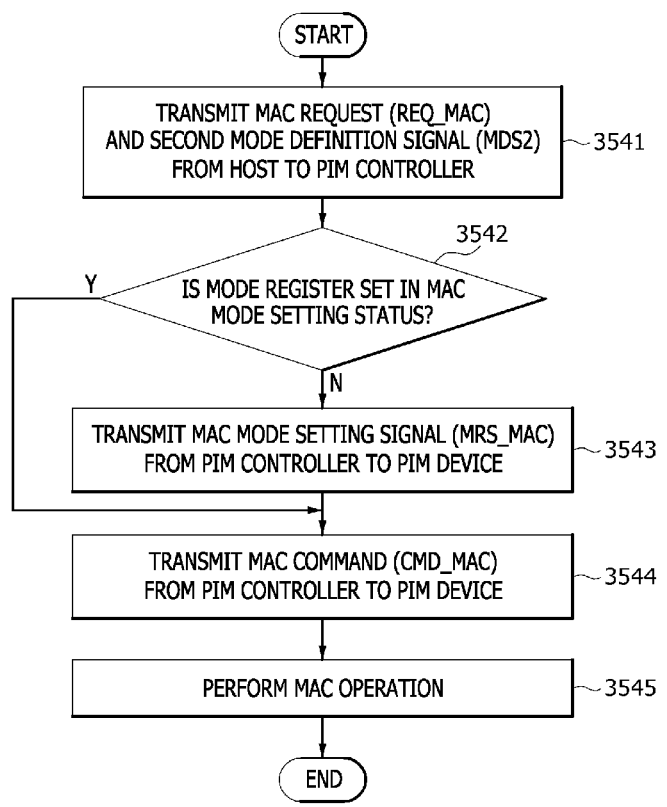
FIG. 56 is a flowchart illustrating an operation performed when a MAC request is generated by a host of the PIM system illustrated in FIG. 50.

FIG. 56 is a flowchart illustrating an operation performed when the MAC request REQ_MAC is generated by the host 3300 of the PIM system 3000 illustrated in FIG. 50. Referring to FIGS. 50 and 56, when the MAC request REQ_MAC and the second mode definition signal MDS2 are transmitted from the host 3300 to the PIM controller 3200 at a step 3541, the PIM controller 3200 may determine whether the mode register set 3130 of the PIM device 3100 is set to provide the MAC mode (see step 3542). When the mode register set 3130 of the PIM device 3100 is not set to provide the MAC mode at the step 3542, the PIM controller 3200 may transmit the MAC mode setting signal MRS_MAC to the PIM device 3100 (see step 3543). Thus, the mode register set 3130 of the PIM device 3100 may be set to provide the MAC mode. Thereafter, the PIM controller 3200 may transmit the MAC command CMD_MAC to the PIM device 3100 (see step 3544). When the mode register set 3130 of the PIM device 3100 is set to provide the MAC mode at the step 3542, the step 3543 may be skipped and the step 3544 may be executed. Subsequently, the PIM device 3100 may perform the MAC operation in response to the MAC command CMD_MAC (see step 3545).

Figure 57:
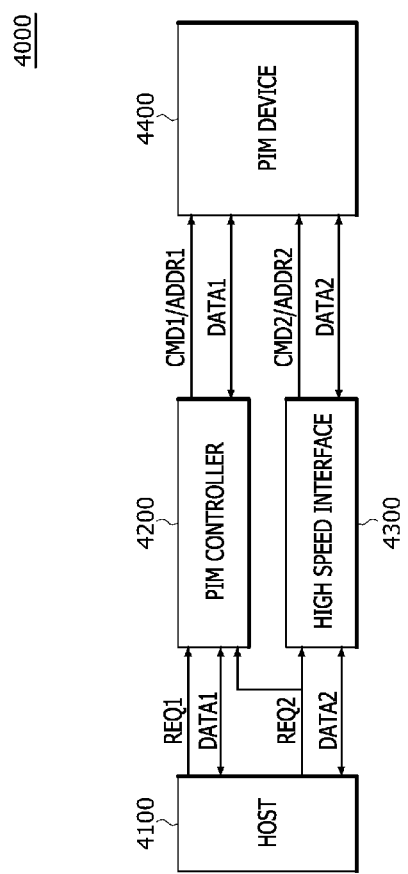
FIG. 57 is a block diagram illustrating a PIM system according to another further embodiment of the present disclosure.

FIG. 57 is a block diagram illustrating a PIM system 4000 according to another further embodiment of the present disclosure. Referring to FIG. 57, the PIM system 4000 may include a host 4100, a PIM controller 4200, a high speed interface 4300, and a PIM device 4400. The host 4100 may generate a first request REQ1 and a second request REQ2. The host 4100 may transmit the first request REQ1 to the PIM controller 4200. The host 4100 may transmit the second request REQ2 to the PIM controller 4200 and the high speed interface 4300. When the first request REQ1 from the host 4100 is a request for a data write operation in the PIM device 4400, the host 4100 may transmit first data DATA1 (i.e., write data) together with the first request REQ1 to the PIM device 4400 through the PIM controller 4200. When the first request REQ1 from the host 4100 is a request for a data read operation in the PIM device 4400, the host 4100 may receive first data DATA1 (i.e., read data) from the PIM device 4400 through the PIM controller 4200 in response to the first request REQ1. The host 4100 and the PIM controller 4200 may communicate with each other through the channel described with reference to FIGS. 45 and 46. On the other hand, the host 4100 and the high speed interface 4300 may communicate with each other through a peripheral component interconnect express (PCIe) protocol or a compute express link (CXL) protocol.

When the second request REQ2 from the host 4100 is a request for a vector data copy operation in the PIM device 4400, the host 4100 may transmit second data DATA2 (i.e., vector data) together with the second request REQ2 to the PIM device 4400 through the high speed interface 4300. When the second request REQ2 from the host 4100 is a request for a read operation for an operation result in the PIM device 4400, the host 4100 may receive second data DATA2 (i.e., operation result data) from the PIM device 4400 through the high speed interface 4300 in response to the second request REQ2. When the second request REQ2 from the host 4100 is a request for a MAC arithmetic operation, an element-wise multiplication (EWM) operation, and an active function process in the PIM device 4400, the host 4100 might not transmit data to the high speed interface 4300.

The PIM controller 4200 may generate a first command CMD1 and a first address signal ADDR1 to transmit the first command CMD1 and the first address signal ADDR1 to the PIM device 4400 based on the first request REQ1 or the second request REQ2 transmitted from the host 4100. When the first request REQ1 or the second request REQ2 is a request for an active operation or a pre-charge operation in the PIM device 4400, the PIM controller 4200 may generate an active command or a pre-charge command, respectively, as the first command CMD1 to transmit the active command or the pre-charge command to the PIM device 4400. In this case, the PIM controller 4200 may transmit a first address signal ADDR1 including a row address of the row to be activated or pre-charged to the PIM device 4400, together with the active command or the pre-charge command. When the first request REQ1 from the host 4100 is a request for a refresh operation in the PIM device 4400, the PIM controller 4200 may generate a refresh command to transmit the refresh command to the PIM device 4400. In this case, the PIM controller 4200 may transmit a first address signal ADDR1 including a row address of the row to be refreshed to the PIM device 4400, together with the refresh command.

When the first request REQ1 from the host 4100 is a request for a data write operation in the PIM device 4400, the PIM controller 4200 may generate a write command as the first command CMD1 to transmit the write command to the PIM device 4400. In this case, the PIM controller 4200 may transmit the first data DATA1 (i.e., write data) transmitted from the host 4100 to the PIM device 4400, together with the write command and the first address signal ADDR1 (i.e., bank address and column address). When the first request REQ1 from the host 4100 is a request for a data read operation, the PIM controller 4200 may generate a read command as the first command CMD1 to transmit the read command to the PIM device 4400, together with the first address signal ADDR1 (i.e., bank address and column address). In addition, the PIM controller 4200 may transmit the first data DATA1 (i.e., read data) transmitted from the PIM device 4400 to the host 4100.

The high speed interface 4300 may generate a second command CMD2 and a second address signal ADDR2 based on the second request REQ2 from the host 4100 to transmit the second command CMD2 and the second address signal ADDR2 to the PIM device 4400. When the second request REQ2 from the host 4100 is a request for an arithmetic operation (i.e., a MAC arithmetic operation, an EWM arithmetic operation, an active function operation), the high speed interface 4300 may generate an operation command (i.e., a MAC arithmetic command, an EWM operation command, and an active function command) as the second command CMD2 to transmit the operation command to the PIM device 4400, together with the second address signal ADDR2. When the second request REQ2 from the host 4100 is a request for the arithmetic operation (i.e., a vector data copy operation in the PIM device 4400), the high speed interface 4300 may generate a vector data copy command as the second command CMD2 to transmit the vector copy command to the PIM device 4400. In this case, the high speed interface 4300 may transmit the second data DATA2 (i.e., vector data) transmitted from the host 4100 to the PIM device 440, together with the vector data copy command and the second command signal ADDR2. When the second request REQ2 from the host 4100 is a request for a read operation on operation result data, the high speed interface 4300 may generate an operation result data read command as the second command CMD2 to transmit the operation result data read command to the PIM device 4400, together with the second address signal ADDR2. In addition, the high speed interface 4300 may transmit the second data DATA2 (i.e., operation result data) transmitted from the PIM device 4400 to the host 4100.

Figure 58:
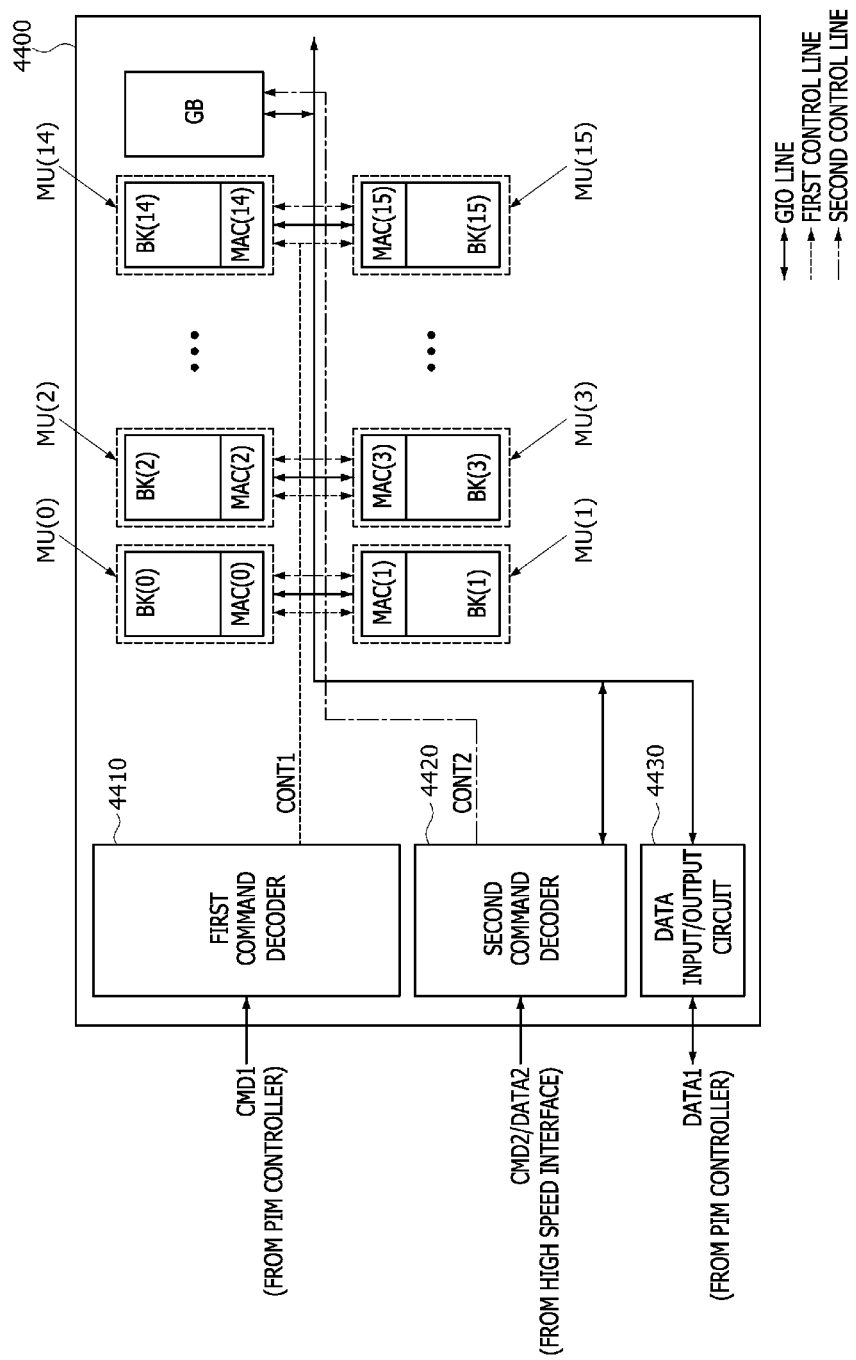
FIG. 58 is a block diagram illustrating an example of a configuration of a PIM device in the PIM system of FIG. 57.

FIG. 58 is a block diagram illustrating an example of a configuration of the PIM device 4400 in the PIM system 4000 of FIG. 57. Referring to FIG. 58, the PIM device 4400 may include a plurality of MAC units MU(0)-MU(15), a global buffer GB, a first command decoder 4410, a second command decoder 4420, and a data input/output circuit 4430. Each of the plurality of MAC units MU(0)-MU(15) may include a memory bank BK and a MAC operator MAC. As illustrated in FIG. 58, the first MAC unit MU(0) may include a first memory bank BK(0) and a first MAC operator MAC(0). The second MAC unit MU(1) may include a second memory bank BK(1) and a second MAC operator MAC(1). The third MAC unit MU(2) may include a third memory bank BK(2) and a third MAC operator MAC(2). The fourth MAC unit MU(3) may include a fourth memory bank BK(3) and a fourth MAC operator MAC(3). The fifteenth MAC unit MU(14) may include a fifteenth memory bank BK(14) and a fifteenth MAC operator MAC(14). The sixteenth MAC unit MU(15) may include a sixteenth memory bank BK(15) and a sixteenth MAC operator MAC(15).

The memory banks BK(0)-BK(15) and the MAC operators MAC(0)-MAC(15) may receive or transmit data through a GIO line. The memory banks BK(0)-BK(15) and the MAC operators MAC(0)-MAC(15) may receive a first control signal CONT1 through a first control line. In addition, the memory banks BK(0)-BK(15) and the MAC operators MAC(0)-MAC(15) may receive a second control signal CONT2 through a second control line. The memory banks BK(0)-BK(15) may perform a memory access operation, for example, an active operation, a pre-charge operation, a refresh operation, a data read operation, and a data write operation in response to the first control signal CONT1. In addition, the memory banks BK(0)-BK(15) may provide weight data that is used for the operations to the MAC operators MAC(0)-MAC(15) in response to the second control signal CONT2. For example, the first memory bank BK(0) may provide a first set of the weight data to the first MAC operator MAC(0). The second memory bank BK(1) may provide a second set of the weight data to the second MAC operator MAC(1). Similarly, the sixteenth memory bank BK(15) may provide a sixteenth set of the weight data to the sixteenth MAC operator MAC(15).

The global buffer GB may perform a vector data copy operation of receiving and storing vector data transmitted from the high speed interface (4300 in FIG. 57) through the second command decoder 4420 through the GIO line in response to the second control signal CONT2. The global buffer GB may provide the vector data to the MAC operators MAC(0)-MAC(15) in response to the second control signal CONT2. The MAC operators MAC(0)-MAC(15) may perform arithmetic operations using the weight data and the vector data transmitted from the memory banks BK(0)-BK(15) and the global buffer GB, respectively. For example, the first MAC operator MAC(0) may perform a MAC arithmetic operation or an EWM operation using the first set of weight data provided from the first memory bank BK(0) and vector data provided from the global buffer GB. The remaining second to sixteenth MAC operators MAC(1)-MAC(15) may also perform MAC arithmetic operations or EWM operations in the same manner. The MAC operators MAC(0)-MAC(15) may perform active function processing operations using active function data transmitted from the memory banks BK(0)-BK(15).

The first command decoder 4410 may decode the first command CMD1 transmitted from the PIM controller (4200 of FIG. 57) to generate the first control signal CONT1. The first command decoder 4410 may be coupled to the PIM controller 4200 through the channel described with reference to FIGS. 45 and 46. The first command decoder 4410 may transmit the first control signal CONT1 to the memory banks BK(0)-BK(15) through the first control line. The memory banks BK(0)-BK(15) may perform memory access operations, that is, an active operation, a pre-charge operation, a refresh operation, a data read operation, and a data write operation by the first control signal CONT1 transmitted from the first command decoder 4410. Although omitted in the drawing, the first command decoder 4410 may receive the first address signal (ADDR1 of FIG. 57) from the PIM controller (4200 of FIG. 57) to generate a first internal address signal (not shown) and transmit the first internal address signal to the memory banks BK(0)-BK(15).

The second command decoder 4420 may decode the second command CMD2 transmitted from the high speed interface (4300 of FIG. 57) to generate the second control signal CONT2. The second command decoder 4420 may be coupled to the high speed interface 4300 through a PCIe protocol or a CXL protocol. The second command decoder 4420 may transmit the second control signal CONT2 to the memory banks BK(0)-BK(15), the global buffer GB, or the MAC operators MAC(0)-MAC(15) through the second control line. The memory banks BK(0)-BK(15) may generate a clock signal that synchronizes the arithmetic operations in the MAC operators MAC(0)-MAC(15) to transmit the clock signal to the MAC operators MAC(0)-MAC(15) in response to the second control signal CONT2 transmitted from the second command decoder 4420. The MAC operators MAC(0)-MAC(15) may perform arithmetic operations in synchronization with the clock signal transmitted from the memory banks BK(0)-BK(15). The MAC operators MAC(0)-MAC(15) may perform the arithmetic operations in response to the second control signal CONT2. The second command decoder 4420 may be directly coupled to the GIO line. Accordingly, the second command decoder 4420 may transmit the second data DATA2 (i.e., vector data) transmitted from the high speed interface (4300 of FIG. 57) to the global buffer GB through the GIO line. In addition, the second command decoder 4420 may directly transmit the operation result transmitted from the MAC operators MAC(0)-MAC(15) through the GIO line to the high speed interface (4300 of FIG. 57).

The data input/output circuit 4430 may be coupled to the GIO line. The data input/output circuit 4430 may transmit the first data DATA1 (i.e., write data) transmitted from the PIM controller (4200 of FIG. 57) to the memory banks BK(0)-BK(15) through the GIO line. The data input/output circuit 4430 may transmit the first data DATA1 (i.e., read data) transmitted from the memory banks BK(0)-BK(15) through the GIO line to the PIM controller (4200 of FIG. 57).

Figure 59:
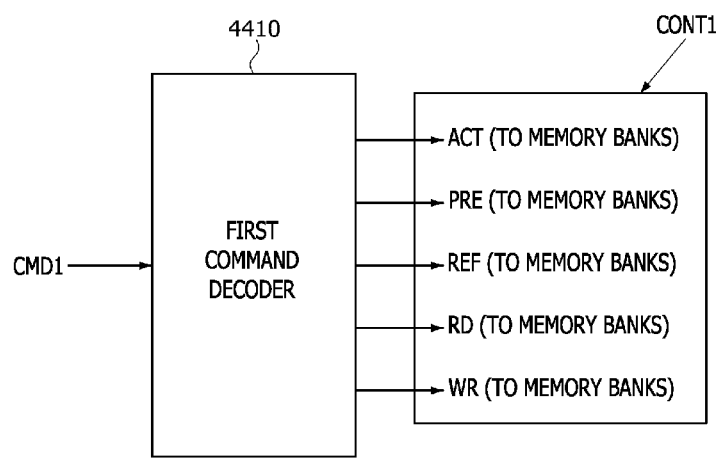
FIG. 59 illustrates an example of an operation of a first command decoder of the PIM device of FIG. 58.

FIG. 59 illustrates an example of an operation of the first command decoder 4410 of the PIM device 4400 of FIG. 58. Referring to FIG. 59, the first command decoder 4410 may receive the first command CMD1 from the PIM controller (4200 of FIG. 57) to generate and output the first control signal CONT1. The first control signal CONT1 output from the first command decoder 4410 may be one of an active control signal ACT, a pre-charge control signal PRE, a refresh control signal REF, a read control signal RD, and a write control signal WR. The first control signal CONT1 output from the first command decoder 4410 may be transmitted to the memory banks BK(0)-BK(15) through the first control line.

When an active command is transmitted from the PIM controller (4200 of FIG. 57) as the first command CMD1, the first command decoder 4410 may generate an active control signal ACT as the first control signal CNT1 to transmit the active control signal ACT to the memory banks BK(0)-BK(15) through the first control line. The memory banks BK(0)-BK(15) of the PIM device 4400 may activate a row selected by a first internal address signal in response to the active control signal ACT. When a pre-charge command is transmitted as the first command CMD1 from the PIM controller (4200 of FIG. 57), the first command decoder 4410 may generate a pre-charge control signal PRE as the first control signal CONT1 to transmit the pre-charge control signal PRE to the memory banks BK(0)-BK(15) of the PIM device 4400. The memory banks BK(0)-BK(15) of the PIM device 4400 may pre-charge the row selected by the first internal address signal in response to the pre-charge control signal PRE. When a refresh command is transmitted as the first command CMD1 from the PIM controller (4200 of FIG. 57), the first command decoder 4410 may generate a refresh control signal REF as the first control signal CONT1 to transmit the refresh control signal REF to the memory banks BK(0)-BK(15) of the PIM device 4400 through the first control line. The memory banks BK(0)-BK(15) of the PIM device 4400 may refresh the row selected by the first internal address signal in response to the refresh control signal REF.

When a read command is transmitted as the first command CMD1 from the PIM controller (4200 of FIG. 57), the first command decoder 4410 may generate a read control signal RD as the first control signal CONT1 to transmit the read control signal RD to the memory banks BK(0)-BK(15) of the PIM device 4400. The memory banks BK(0)-BK(15) of the PIM device 4400 may transmit column data selected by the first internal address signal to the PIM controller (4200 of FIG. 57) through the GIO line and the data input/output circuit (4430 of FIG. 58), in response to the read control signal RD. When a write command is transmitted as the first command CMD1 from the PIM controller (4200 of FIG. 57), the first command decoder 4410 may generate a write control signal WR as the first control signal CONT1 to transmit the write control signal WR to the memory banks BK(0)-BK(15) of the PIM device 4400 through the first control line. The memory banks BK(0)-BK(15) of the PIM device 4400 may write data transmitted from the PIM controller (4200 of FIG. 57) through the data input/output circuit (4430 of FIG. 58) and the GIO line in a column selected by the first internal address signal in response to the write control signal WR.

Figure 60:
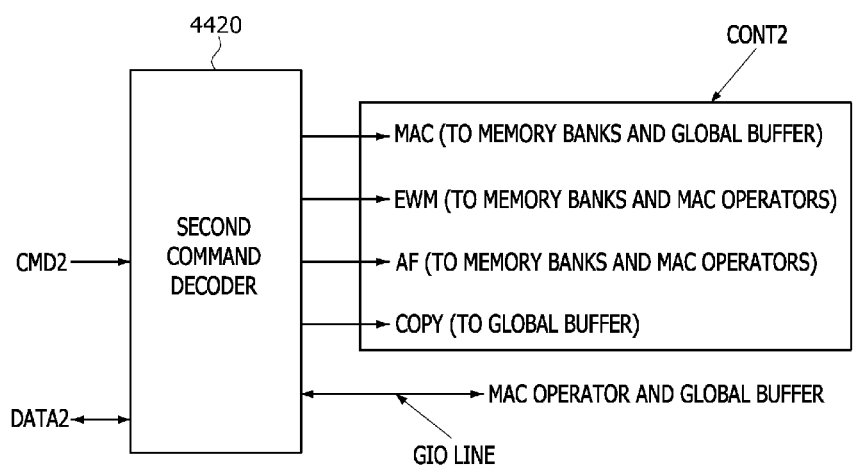
FIG. 60 illustrates an example of an operation of a second command decoder of the PIM device of FIG. 58.

FIG. 60 illustrates an example of an operation of the second command decoder 4420 of the PIM device 4400 of FIG. 58. Referring to FIG. 60, the second command decoder 4420 may receive the second command CMD2 from the high speed interface (4300 of FIG. 57), and may generate and output the second control signal CONT2. The second control signal CONT2 output from the second command decoder 4420 may be one of a MAC operation control signal MAC, an EWM operation control signal EWM, an active function control signal AF, and a vector data copy control signal COPY. When the second data DATA2 (i.e., vector data) is transmitted from the high speed interface (4300 of FIG. 57), together with the second command CMD2, the second command decoder 4420 may transmit the second data DATA2 to the global buffer (GB of FIG. 58) through the GIO line. When the second data DATA2 (i.e., operation result data) is transmitted from the MAC operators (MAC(0)-MAC(15) of FIG. 58) through the GIO line, the second command decoder 4420 may transmit the second data DATA2 to the high speed interface (4300 of FIG. 57).

When a MAC operation command is transmitted as the second command CMD2 from the high speed interface (4300 of FIG. 57), the second command decoder 4420 may generate a MAC operation control signal MAC as the second control signal CONT2 to transmit the MAC operation control signal MAC to the memory banks BK(0)-BK(15) of the PIM device 4400 and the global buffer GB through the second control line. The memory banks BK(0)-BK(15) may transmit weight data to the MAC operators (MAC(0)-MAC(15) of FIG. 58) in response to the MAC operation control signal MAC. In addition, the memory banks BK(0)-BK(15) may transmit a clock signal to the MAC operators (MAC(0)-MAC(15) of FIG. 58) in response to the MAC operation control signal MAC. The global buffer (GB of FIG. 58) may transmit vector data to the MAC operators (MAC(0)-MAC(15) of FIG. 58) in response to the MAC operation control signal MAC. The MAC operators (MAC(0)-MAC(15) of FIG. 58) may perform MAC arithmetic operations using the weight data and the vector data in synchronization with the clock signal. The MAC operators (MAC(0)-MAC(15) of FIG. 58) may transmit MAC result data generated as a result of the MAC arithmetic operations to the high speed interface (4430 of FIG. 57) through the GIO line and the second command decoder 4420. To this end, the second command decoder 4420 may generate a MAC result data read control signal (not shown) and transmit the MAC result data read control signal to the MAC operators (MAC(0)-MAC(15) of FIG. 58).

When an EWM operation command is transmitted as the second command CMD2 from the high speed interface (4300 of FIG. 57), the second command decoder 4420 may generate an EWM operation control signal EWM to transmit the EWM operation control signal EWM to the memory banks (BK(0)-BK(15) of FIG. 58) and the MAC operators (MAC(0)-MAC(15) of FIG. 58) of the PIM device 4400. The memory banks (BK(0)-BK(15) of FIG. 58) may transmit the first data and the second data to the MAC operators (MAC(0)-MAC(15) of FIG. 58) in response to the EWM operation control signal EWM. In addition, the memory banks (BK(0)-BK(15) of FIG. 58) may transmit the clock signal to the MAC operators (MAC(0)-MAC(15) of FIG.

58) in response to the EWM operation control signal EWM. The MAC operators (MAC(0)-MAC(15) of FIG. 58) may perform an EWM operation using the first data and the second data in synchronization with the clock signal. The EWM operation in the MAC operators (MAC(0)-MAC(15) of FIG. 58) may be performed through a vector multiplication operation on the first data and the second data. In an embodiment, the MAC operators (MAC(0)-MAC(15) of FIG. 58) may store EWM result data generated as a result of the EWM operation in the memory banks (BK(0)-BK(15) of FIG. 58). In another embodiment, the MAC operators (MAC(0)-MAC(15) of FIG. 58) may transmit the EWM result data generated as a result of the EWM operation to the high speed interface (4430 of FIG. 57) through the GIO line and the second command decoder 4420.

When an active function command is transmitted as the second command CMD2 from the high speed interface (4300 of FIG. 57), the second command decoder 4420 may generate an active function control signal AF as the second control signal CONT2 to transmit the active function control signal AF to the memory banks (BK(0)-BK(15) of FIG. 58) and the MAC operators (MAC(0)-MAC(15) of FIG. 58) of the PIM device 4400 through the second control line. The memory banks (BK(0)-BK(15) of FIG. 58) may transmit active function data to the MAC operators (MAC(0)-MAC(15) of FIG. 58) in response to the active function control signal AF. The MAC operators (MAC(0)-MAC(15) of FIG. 58) may perform an active function process using the active function data in response to the active function control signal AF.

When a vector data copy command is transmitted as the second command CMD2 from the high speed interface (4300 of FIG. 57), the second command decoder 4420 may generate a vector data copy control signal COPY as the second control signal CONT2 to transmit the vector data copy control signal COPY to the global buffer (GB of FIG. 58) of the PIM device 4400 through the second control line. The global buffer (GB of FIG. 58) may transmit the second data DATA2 (i.e., vector data) transmitted from the high speed interface (4300 of FIG. 57) to the global buffer (GB of FIG. 58) through the GIO line in response to the vector data copy control signal COPY. The global buffer (GB of FIG. 58) may store the vector data transmitted through the GIO line in response to the vector data copy control signal COPY.

Figure 61:
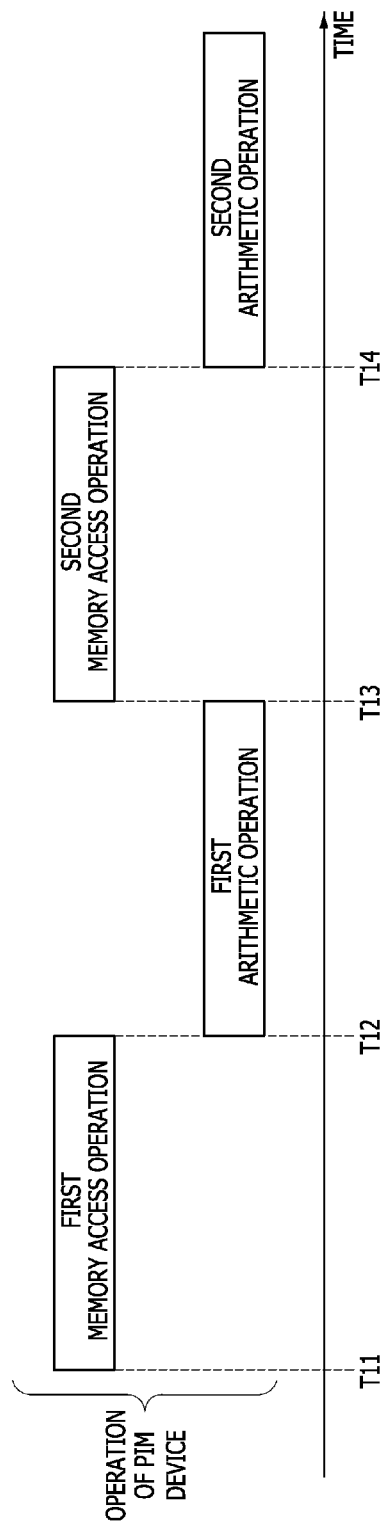
FIG. 61 illustrates an example illustrating a memory access operation and an arithmetic operation of the PIM device in the PIM system of FIG. 57.

FIG. 61 illustrates an example showing a memory access operation and an arithmetic operation of the PIM device 4400 in the PIM system 4000 of FIG. 57. Referring to FIG. 61, the PIM device 4400 may sequentially perform a first memory access operation, a first arithmetic operation, a second memory access operation, and a second arithmetic operation. That is, as illustrated in the drawing, the PIM device 4400 may start to perform the first memory access operation, for example, a read operation at a first time point T11. The PIM device 4400 may start to perform the first arithmetic operation, for example, a MAC arithmetic operation at a second time point T12 when the first memory access operation is finished. The PIM device 4400 may start to perform the second memory access operation, for example, a write operation at a third time point T13 when the first arithmetic operation is finished. The PIM device 4400 may start to perform the second arithmetic operation, for example, an EWM arithmetic operation at a fourth time point T14 when the second memory access operation is finished. In an embodiment, a memory access operation and an arithmetic operation in the PIM device 4400 may be performed at different times that are non-overlapping in time. For example, as shown in FIG. 61, the memory access operation in the PIM device 4400 is performed over a first interval of time (i.e., T11 to T12) and the arithmetic operation in the PIM device 4400 is performed over a second interval of time (i.e., T12 to T13), the first interval of time does not overlap with the second interval of time.

Figure 62:
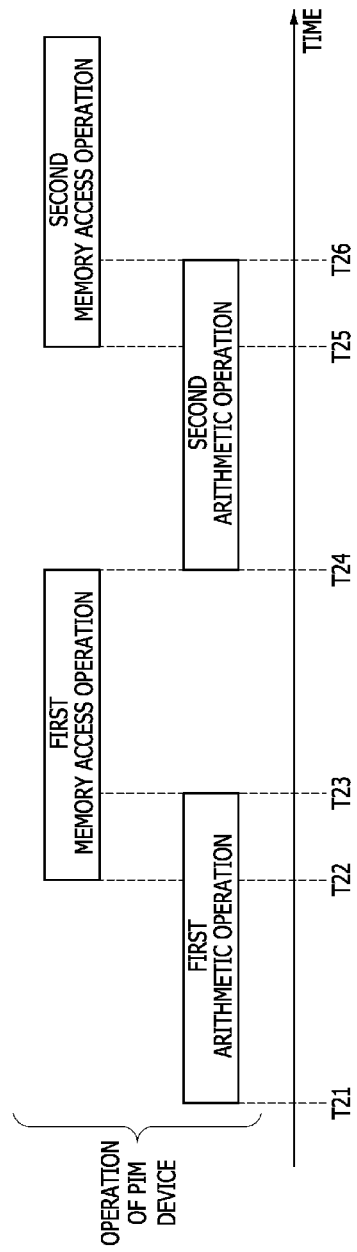
FIG. 62 illustrates another example illustrating a memory access operation and an arithmetic operation of the PIM device in the PIM system of FIG. 57.

FIG. 62 illustrates another example showing a memory access operation and an arithmetic operation of the PIM device 4400 in the PIM system 4000 of FIG. 57. Referring to FIG. 62, the PIM device 4400 may perform a first arithmetic operation, a first memory access operation, a second arithmetic operation, and a second memory access operation, and the first arithmetic operation and the first memory access operation may be simultaneously performed for a predetermined time period, and the second arithmetic operation and the second memory access operation may also be simultaneously performed for a predetermined time period. That is, as illustrated in the drawing, the PIM device 4400 may start to perform the first arithmetic operation at a first time point T21. At a second time point T22 in a state where the first arithmetic operation is being performed, the PIM device 4400 may start to perform the first memory access operation. During the time period from the second time point T22 to a third time point T23 when the first arithmetic operation is finished, the PIM device 4400 may simultaneously perform the first arithmetic operation and the first memory access operation. The PIM device 4400 may start to perform the second arithmetic operation at a fourth time point T24 when the first memory access operation is finished. In a state in which the second arithmetic operation is being performed, the PIM device 4400 may start to perform the second memory access operation at a fifth time point T25. During the time period from the fifth time point T25 to a sixth time point T26 when the second arithmetic operation is finished, the PIM device 4400 may simultaneously perform the second arithmetic operation and the second memory access operation.

In the present embodiment, the first arithmetic operation may be an arithmetic operation that does not require access to the memory banks (BK(0)-BK(15) in FIG. 58) during the time period from the second time point T22 to the third time point T23. Similarly, the second arithmetic operation may be an arithmetic operation that does not require access to the memory banks (BK(0)-BK(15) in FIG. 58) during the time period from the fifth time point T25 to the sixth time point T26. In an example, each of the first arithmetic operation and the second arithmetic operation may be a MAC arithmetic operation, an active function processing operation, or a vector data copy operation. In an example, when the first arithmetic operation is a MAC arithmetic operation, during the time period from the first time point T21 to the second time point T22, the transmission of all weight data required for the MAC arithmetic operation from the memory banks (BK(0)-BK(15) in FIG. 58) to the MAC operators (MAC(0)-MAC(15) in FIG. 58) may be completed. In addition, during the time period from the second time point T22 to the third time point T23 when the first memory access operation is performed together, an operation of reading MAC result data from the MAC operators (MAC(0)-MAC(15) in FIG. 58) may be performed. In an example, when the first arithmetic operation is an active function processing operation, during the time period from the first time point T21 to the second time point T22, the transmission of active function data from the memory banks (BK(0)-BK(15) in FIG. 58) to the MAC operators (MAC(0)-MAC(15) in FIG. 58) may be completed. In addition, during the time period from the second time point T22 to the third time point T23 when the first memory access operation is performed together, the MAC operators (MAC(0)-MAC(15) of FIG. 58) may perform the active function processing operation.

Figure 63:
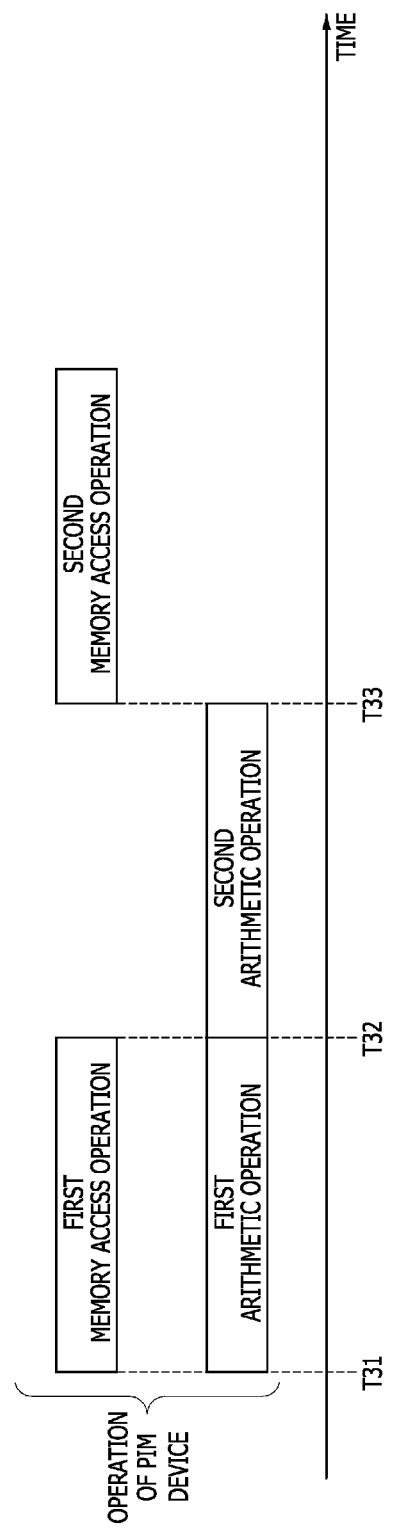
FIG. 63 illustrates another further example illustrating a memory access operation and an arithmetic operation of the PIM device in the PIM system of FIG. 57.

FIG. 63 illustrates another example showing a memory access operation and an arithmetic operation of the PIM device 4400 in the PIM system 4000 of FIG. 57. Referring to FIG. 63, the PIM device 4400 may simultaneously perform a first memory access operation and a first arithmetic operation, and then, may sequentially perform a second arithmetic operation and a second memory access operation. That is, as illustrated in the drawing, the PIM device 4400 may start to simultaneously perform the first memory access operation and the first arithmetic operation at a first time point T31. In an example, the first memory access operation may be a data read operation or a data write operation. The first arithmetic operation may be a vector data copy operation. That is, the data write operation or the data read operation in the memory banks (BK(0)-BK(15) in FIG. 58) of the PIM device 4400 and the vector data copy operation in the global buffer (GB of FIG. 58) may be simultaneously performed. At a second time point T32 when both the first memory access operation and the first arithmetic operation are finished, the PIM device 4400 may start to perform the second arithmetic operation. In an example, the second arithmetic operation may be a MAC arithmetic operation, an EWM arithmetic operation, an active function processing operation, or a vector data copy operation. The second memory access operation may be performed at a third time point T33 when the second arithmetic operation is finished. The second memory access operation may be a data read operation or a data write operation.

Figure 64:
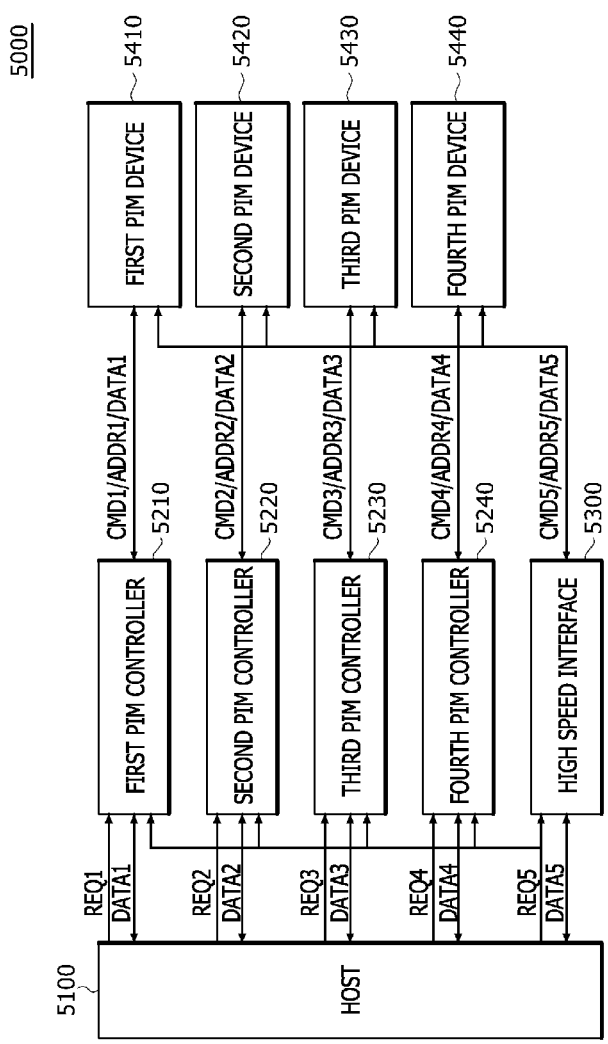
FIG. 64 is a block diagram illustrating a PIM system according to still another further embodiment of the present disclosure.

FIG. 64 is a block diagram illustrating a PIM system 5000 according to still another embodiment of the present disclosure. Referring to FIG. 64, the PIM system 5000 may include a host 5100, a plurality of, for example, first to fourth PIM controllers 5210-5240, a high speed interface 5300, and a plurality of, for example, first to fourth PIM devices 5410-5440. The host 5100 may generate a first request REQ1 to a fifth request REQ5. The host 5100 may transmit the first request REQ1 for a memory access operation of the first PIM device 5410 to the first PIM controller 5210. The host 5100 may transmit the second request REQ2 for a memory access operation of the second PIM device 5420 to the second PIM controller 5220. The host 5100 may transmit the third request REQ3 for a memory access operation of the third PIM device 5430 to the third PIM controller 5230. The host 5100 may transmit the fourth request REQ4 for a memory access operation of the fourth PIM device 5440 to the fourth PIM controller 5240. The host 5100 may transmit the fifth request REQ5 for an arithmetic operation of at least one of the first to fourth PIM devices 5410-5440 to the first to fourth PIM controllers 5210-5240 and the high speed interface 5300.

The host 5100 may transmit first data DATA1 (i.e., write data) to the first PIM controller 5210, together with the first request REQ1. In addition, the host 5100 may receive first data DATA1 (i.e., read data) from the first PIM controller 5210. The host 5100 may transmit second data DATA2 (i.e., write data) to the second PIM controller 5220, together with the second request REQ2. In addition, the host 5100 may receive second data DATA2 (i.e., read data) from the second PIM controller 5220. The host 5100 may transmit third data DATA3 (i.e., write data) to the third PIM controller 5230, together with the third request REQ3. In addition, the host 5100 may receive third data DATA3 (i.e., read data) from the third PIM controller 5230. The host 5100 may transmit fourth data DATA4 (i.e., write data) to the fourth PIM controller 5240, together with the fourth request REQ4. In addition, the host 5100 may receive fourth data DATA4 (i.e., read data) from the fourth PIM controller 5240. The host 5100 may transmit fifth data DATA5 (i.e., vector data), together with the fifth request REQ5 to the high speed interface 5300. In addition, the host 5100 may receive the fifth data DATA5 (i.e., operation result data) from the high speed interface 5300.

The first PIM controller 5210 may generate a first command CMD1 and a first address signal ADDR1 based on the first request REQ1 or the fifth request REQ5 transmitted from the host 5100 to transmit the first command CMD1 and the first address signal ADDR1 to the first PIM device 5410. The second PIM controller 5220 may generate a second command CMD2 and a second address signal ADDR2 based on the second request REQ2 or the fifth request REQ5 transmitted from the host 5100 to transmit the second command CMD2 and the second address signal ADDR2 to the second PIM device 5420. The third PIM controller 5230 may generate a third command CMD3 and a third address signal ADDR3 based on the third request REQ3 or the fifth request REQ5 transmitted from the host 5100 to transmit the third command CMD3 and the third address signal ADDR3 to the third PIM device 5430. The fourth PIM controller 5240 may generate a fourth command CMD4 and a fourth address signal ADDR4 based on the fourth request REQ4 or the fifth request REQ5 transmitted from the host 5100 to transmit the fourth command CMD4 and the fourth address signal ADDR4 to the fourth PIM device 5440. The high speed interface 5300 may generate a fifth command CMD5 and a fifth address signal ADDR5 based on the fifth request REQ5 transmitted from the host 5100 to transmit the fifth command CMD5 and the fifth address signal ADDR5 to at least one of the first to fourth PIM devices 5410-5440.

The first PIM controller 5210 may transmit first data DATA1 (i.e., write data) to the first PIM device 5410, together with the first command CMD1 and the first address signal ADDR1. In addition, the first PIM controller 5210 may receive first data DATA1 (i.e., read data) from the first PIM device 5410. The second PIM controller 5220 may transmit second data DATA2 (i.e., write data) to the second PIM device 5420, together with the second command CMD2 and the second address signal ADDR2. In addition, the second PIM controller 5220 may receive second data DATA2 (i.e., read data) from the second PIM device 5420. The third PIM controller 5230 may transmit third data DATA3 (i.e., write data) to the third PIM device 5430, together with the third command CMD3 and the third address signal ADDR3. In addition, the third PIM controller 5230 may receive third data DATA3 (i.e., read data) from the third PIM device 5430. The fourth PIM controller 5240 may transmit fourth data DATA4 (i.e., write data) to the fourth PIM device 5440, together with the fourth command CMD4 and the fourth address signal ADDR4. In addition, the fourth PIM controller 5240 may receive fourth data DATA4 (i.e., read data) from the fourth PIM device 5440. The high speed interface 5300 may transmit fifth data DATA5 (i.e., vector data) to at least one of the first to fourth PIM devices 5410-5440, together with the fifth command CMD5 and the fifth address signal ADDR5. In addition, the high speed interface 5300 may receive fifth data DATA5 (i.e., operation result data) from at least one of the first to fourth PIM devices 5410-5440.

Each of the first to fourth PIM controllers 5210-5240 may have the same configuration as the PIM controller 4200 described with reference to FIG. 57. The high speed interface 5300 may have the same configuration as the high speed interface 4300 described with reference to FIG. 57. Each of the first to fourth PIM devices 5410-5440 have the same configuration as the PIM device 4400 described with reference to FIGS. 57 to 60. Accordingly, as described with reference to FIGS. 61 to 63, the first to fourth PIM devices 5410-5440 may perform the memory access operation and the arithmetic operation so as not to overlap with each other in time, or may perform the memory access operation and the arithmetic operation to partially overlap or completely overlap with each other. In addition, it is possible to transmit data between the first to fourth PIM devices 5410-5440 through the high speed interface 5800.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) system comprising:
   a host configured to generate a first request and a second request;
   a PIM device configured to perform a memory access operation based on the first request and to perform an arithmetic operation based on the second request;
   a PIM controller coupled to the host through a first interface and configured to generate a first command based on the first request; and
   a second interface coupled to the host and configured to generate a second command based on the second request,
   wherein the PIM device is configured to perform the memory access operation in response to the first command from the PIM controller and to perform the arithmetic operation in response to the second command from the second interface.

2. The PIM system of claim 1, wherein the PIM device includes:
   a plurality of multiplying-and-accumulating (MAC) units, each of the plurality of MAC units including a memory bank and a MAC operator configured to perform the arithmetic operation;
   a first command decoder configured to decode the first command to generate a first control signal controlling a memory access operation of the plurality of memory banks; and
   a second command decoder configured to decode the second command to generate a second control signal controlling the arithmetic operation of the plurality of MAC operators or a vector data copy operation.

3. The PIM system of claim 2,
   wherein the first command decoder is coupled to the PIM controller through a first transmission line of a first transmission speed, and
   wherein the second command decoder is coupled to the second interface through a second transmission line of a transmission speed faster than the first transmission speed.

4. The PIM system of claim 2, wherein the PIM device further includes a global buffer configured to provide vector data to the MAC operators of the plurality of MAC units.

5. The PIM system of claim 4, wherein the PIM device further includes:
   a data input and output (input/output) circuit configured for data transmission with the PIM controller; and
   a global data input/output (GIO) line configured to provide a data transmission path between the plurality of MAC units, the global buffer, and the data input/output circuit.

6. The PIM system of claim 5, wherein the second command decoder is directly coupled to the GIO line.

7. The PIM system of claim 5, wherein the PIM device further includes:
   a first control line configured to provide a transmission path of the first control signal from the first command decoder to the plurality of MAC units; and
   a second control line configured to provide a transmission path of the second control signal from the second command decoder to the plurality of MAC units and the global buffer.

8. The PIM system of claim 7,
   wherein the memory access operation performed by the PIM device is either a data read operation from the memory bank or a data write operation in the memory bank,
   wherein the arithmetic operation performed by the PIM device is a MAC arithmetic operation, or an element-wise multiplication (EWM) arithmetic operation in the MAC operator, and
   wherein the vector data copy operation is an operation of storing the vector data into the global buffer.

9. The PIM system of claim 8, wherein the first command decoder is configured to:
   transmit a read control signal controlling the data read operation from the memory bank through the first control line to the memory bank in response to a read command, when the first command is the read command, and
   transmit a write control signal controlling the data write operation in the memory bank through the first control line to the memory bank in response to a write command, when the first command is the write command.

10. The PIM system of claim 9, wherein the second command decoder is configured to:
    transmit a MAC operation control signal controlling the MAC arithmetic operation in the MAC operator to the memory bank and the global buffer through the second control line in response to a MAC operation command, when the second command is the MAC operation command,
    transmit an EWM control signal controlling the EWM arithmetic operation in the MAC operator to the memory bank and the MAC operator through the second control line in response to an EWM arithmetic command, when the second command is the EWM arithmetic command, and
    transmit a vector data copy control signal controlling the operation of storing the vector data into the global buffer to the global buffer through the second control line in response to a vector data copy command, when the second command is the vector data copy command.

11. The PIM system of claim 1, wherein the memory access operation in the PIM device is performed over a first interval of time and the arithmetic operation in the PIM device is performed over a second interval of time, and wherein the first interval of time does not overlap with the second interval of time.

12. The PIM system of claim 1, wherein the memory access operation in the PIM device is performed over a first interval of time and the arithmetic operation in the PIM device is performed over a second interval of time, and wherein the first interval of time at least partially overlaps with the second interval of time.

13. A processing-in-memory (PIM) system comprising:
a host configured to generate a first request and a second request;
a plurality of PIM devices, each of the plurality of PIM devices being configured to perform a memory access operation based on the first request and to perform an arithmetic operation based on the second request;
a plurality of PIM controllers including a first PIM controller, the first PIM controller being coupled to the host and being configured to generate a first command based on the first request or the second request; and
an interface coupled to the host and configured to generate a second command based on the second request,
wherein the plurality of PIM devices are commonly coupled to the interface and respectively coupled to the plurality of PIM controllers, and
wherein a first PIM device, which is one of the plurality of PIM devices, is configured to perform the memory access operation in response to the first command from the first PIM controller coupled to the first PIM device, and to perform the arithmetic operation in response to the second command from the interface.

14. The PIM system of claim 13, wherein the first PIM device includes:
a plurality of multiplying-and-accumulating (MAC) units, each of the plurality of MAC units including a memory bank and a MAC operator configured to perform the arithmetic operation;
a first command decoder configured to decode the first command from the first PIM controller to generate a first control signal controlling a memory access operation of the plurality of memory banks; and
a second command decoder configured to decode the second command from the second interface to generate a second control signal controlling the arithmetic operation of the plurality of MAC operators or a vector data copy operation.

15. The PIM system of claim 14,
wherein the first command decoder of the first PIM device is coupled to the first PIM controller through a first transmission line of a first transmission speed, and
wherein the second command decoder of the first PIM device is coupled to the second interface through a second transmission line of a transmission speed faster than the first transmission speed.

16. The PIM system of claim 15, wherein the first PIM device further includes a global buffer configured to provide vector data to the MAC operators of the plurality of MAC units.

17. The PIM system of claim 16, wherein the first PIM device further includes:

a data input and output (input/output) circuit for data transmission with the first PIM controller; and
a global data input/output (GIO) line configured to provide a data transmission path between the plurality of MAC units, the global buffer, and the data input/output circuit.

18. The PIM system of claim 17, wherein the second command decoder is directly coupled to the GIO line.

19. The PIM system of claim 17, wherein the first PIM device further includes:
a first control line configured to provide a transmission path of the first control signal from the first command decoder to the plurality of MAC units; and
a second control line configured to provide a transmission path of the second control signal from the second command decoder to the plurality of MAC units and the global buffer.

20. The PIM system of claim 19,
wherein the memory access operation performed by the first PIM device is either a data read operation from the memory bank or a data write operation to the memory bank, and
wherein the arithmetic operation performed by the first PIM device is one of a MAC arithmetic operation, or an element-wise multiplication (EWM) arithmetic operation in the MAC operator, and
wherein the vector data copy operation is an operation of storing the vector data into the global buffer.

21. The PIM system of claim 20, wherein the first command decoder is configured to:
transmit a read control signal controlling the data read operation from the memory bank through the first control line to the memory bank in response to a read command, when the first command is the read command, and
transmit a write control signal controlling the data write operation to the memory bank through the first control line to the memory bank in response to a write command, when the first command is the write command.

22. The PIM system of claim 21, wherein the second command decoder is configured to:
transmit a MAC operation control signal controlling the MAC arithmetic operation in the MAC operator to the memory bank and the global buffer through the second control line in response to a MAC operation command, when the second command is the MAC operation command,
transmit an EWM control signal controlling the EWM arithmetic operation in the MAC operator to the memory bank and the MAC operator through the second control line in response to an EWM arithmetic command, when the second command is the EWM arithmetic command, and
transmit a vector data copy control signal controlling the operation of storing the vector data into the global buffer to the global buffer through the second control line in response to a vector data copy command, when the second command is the vector data copy command.

23. The PIM system of claim 13, wherein the memory access operation in the first PIM device is performed over a first interval of time and the arithmetic operation in the first PIM device is performed over a second interval of time, and wherein the first interval of time does not overlap with the second interval of time.

24. The PIM system of claim 13, wherein the memory access operation in the first PIM device is performed over a first interval of time and the arithmetic operation in the first PIM device is performed over a second interval of time, and wherein the first interval of time at least partially overlaps with the second interval of time.

* * * * *